(12) United States Patent
Bauer et al.

(10) Patent No.: US 9,799,825 B2
(45) Date of Patent: Oct. 24, 2017

(54) VOLTAGE REGULATION OF DEVICE FUNCTIONAL PROPERTIES

(71) Applicant: Massachusetts Institute of Technology, Cambridge, MA (US)

(72) Inventors: Uwe Bauer, Cambridge, MA (US); Geoffrey S. D. Beach, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/126,143

(22) PCT Filed: Mar. 16, 2015

(86) PCT No.: PCT/US2015/020736
§ 371 (c)(1),
(2) Date: Sep. 14, 2016

(87) PCT Pub. No.: WO2015/139033
PCT Pub. Date: Sep. 17, 2015

(65) Prior Publication Data
US 2017/0084824 A1 Mar. 23, 2017

Related U.S. Application Data

(60) Provisional application No. 61/953,689, filed on Mar. 14, 2014.

(51) Int. Cl.
*H01L 43/08* (2006.01)
*H01L 45/00* (2006.01)
(Continued)

(52) U.S. Cl.
CPC ......... *H01L 43/08* (2013.01); *G05D 23/1951* (2013.01); *H01L 43/02* (2013.01);
(Continued)

(58) Field of Classification Search
CPC combination set(s) only.
See application file for complete search history.

(56) References Cited

U.S. PATENT DOCUMENTS

2008/0079029 A1 4/2008 Williams
2009/0179245 A1 7/2009 Karg et al.
(Continued)

FOREIGN PATENT DOCUMENTS

DE 102010026098 A1 1/2012
KR 2014-0012025 A 1/2014
(Continued)

OTHER PUBLICATIONS

International Search Report and Written Opinion for Application No. PCT/US2015/020736 mailed Jul. 20, 2015.
(Continued)

*Primary Examiner* — Mamadou Diallo
(74) *Attorney, Agent, or Firm* — Wolf, Greenfield & Sacks, P.C.

(57) ABSTRACT

Systems, methods, and apparatus are provided for tuning a functional property of a device. The device (210) includes a layer of a dielectric material (214) disposed over and forming an interface (216) with a layer of an electrically conductive target material (222). The dielectric material layer includes at least one ionic species having a high ion mobility. The target material is configured such that a potential difference applied to the device can cause the at least one ionic species to migrate reversibly across the interface into or out of the target material layer. The mobility of the at least one ionic species can be tuned by exposing the device to electromagnetic radiation and/or a temperature change.

19 Claims, 31 Drawing Sheets

(51) Int. Cl.
*G05D 23/19* (2006.01)
*H01L 43/02* (2006.01)

(52) U.S. Cl.
CPC .......... *H01L 45/085* (2013.01); *H01L 45/128* (2013.01); *H01L 45/1213* (2013.01); *H01L 45/1266* (2013.01); *H01L 45/146* (2013.01)

(56) References Cited

U.S. PATENT DOCUMENTS

| | | |
|---|---|---|
| 2010/0316831 A1 | 12/2010 | Kubo et al. |
| 2011/0007555 A1 | 1/2011 | Ito |
| 2012/0081774 A1 | 4/2012 | De Paiva Martins et al. |
| 2013/0015542 A1* | 1/2013 | Wang ............... H01L 43/08 257/421 |
| 2013/0328116 A1 | 12/2013 | Chang et al. |
| 2014/0124882 A1* | 5/2014 | Khalili Amiri ......... H01L 43/08 257/421 |
| 2014/0268982 A1* | 9/2014 | Annunziata ............ G11C 11/161 365/80 |
| 2014/0339661 A1* | 11/2014 | Guo ..................... H01L 43/10 257/421 |
| 2015/0303313 A1 | 10/2015 | Mallela et al. |
| 2015/0325278 A1* | 11/2015 | Bauer ..................... H01L 43/08 365/158 |

FOREIGN PATENT DOCUMENTS

| | | |
|---|---|---|
| WO | WO 2010/074689 A1 | 7/2010 |
| WO | WO 2013/103122 A1 | 7/2013 |

OTHER PUBLICATIONS

International Preliminary Report on Patentability for Application No. PCT/US2015/020736 mailed Sep. 22, 2016.

International Search Report and Written Opinion for Application No. PCT/US2015/049667 mailed Nov. 27, 2015.

International Preliminary Report on Patentability for Application No. PCT/US2015/049667 mailed Mar. 23, 2017.

Graham et al., Resistivity dominated by surface scattering in sub-50 nm Cu wires. Applied Physics Letters. 2010;96(042116):1-3.

Manchon et al., Analysis of oxygen induced anisotropy crossover in Pt/Co/MOx trilayers. Journal of Applied Physics. 2008;104(043914):1-7.

Wu et al., Influence of surface and grain-boundary scattering on the resistivity of copper in reduced dimensions. Applied Physics Letters. Apr. 2004;84(15):2838-40.

* cited by examiner

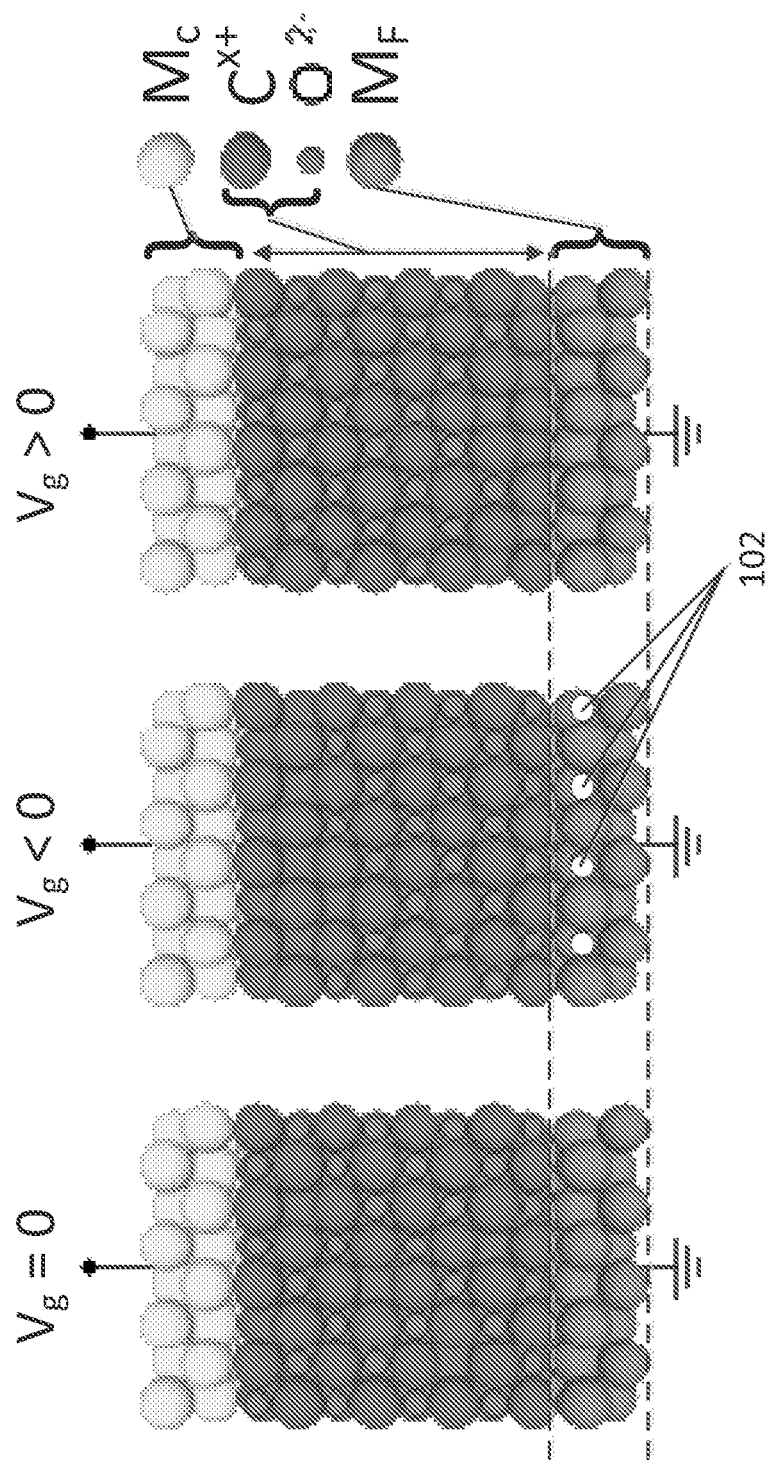

VOLTAGE REGULATION OF DEVICE FUNCTIONAL PROPERTIES

CROSS REFERENCE TO RELATED APPLICATIONS

This application claims the benefit under 35 U.S.C. §371 as a U.S. National Stage Entry of International Application No. PCT/US2015/020736, filed in the United States Patent Office as a Receiving Office on Mar. 16, 2015, which claims priority to U.S. provisional application Ser. No. 61/953,689, filed on Mar. 14, 2014, entitled "METHODS, MATERIALS AND SYSTEMS FOR VOLTAGE PROGRAMMING MATERIAL PROPERTIES", each of which is hereby incorporated by reference in its entirety.

GOVERNMENT SUPPORT

This invention was made at least in part using government support under contract nos. ECCS-1128439 and DMR-0819762, both awarded by the National Science Foundation (NSF). The government has certain rights in the invention.

BACKGROUND

There has been a great deal of interest in magnetic devices. Magnetic devices function based on the capability of generating different patterns of magnetization in a magnetizable material, in a non-volatile manner. Research has focused on exploiting giant magnetoresistance (GMR) at the nanoscale to design magnetic devices. The GMR effect has been reported in some thin-film structures composed of alternating ferromagnetic and non-magnetic conductive layers.

In an example magnetic devices, the magnetization of a cell of the magnetic device may be controlled using a magnetic field that interacts with the magnetizable material. The orientation of the magnetization can affect the resistance of portions of the magnetizable material forming the cell. Thus, for a given applied voltage, a cell with the magnetization oriented in one direction may exhibit a different resistance than if the magnetization were oriented in a different direction. As a result, the magnetizable material can be used, e.g., to store data, through changes in the magnetization direction.

Another example of a magnetic device is a magnetic tunnel junction (MTJ) device having large tunnel magneto-resistance, such as in MTJs with MgO tunnel barriers. The interest in these devices stems from the large tunnel magneto-resistance combined with their inherently non-volatile characteristics, which causes them to be considered a candidate for next generation non-volatile memory applications such as magnetic random access memory (MRAM).

In many of these proposed MTJ based magnetic memory devices, such as field switched MRAM and spin transfer torque MRAM, significant current flow is necessary to switch the magnetic free layer and therefore the state of the device. The main challenge for such devices lies in reducing the current flow necessary to manipulate the magnetization in MTJs.

Using a gate voltage to assist switching of the free layer in a MTJ could significantly lower the current necessary to switch the device state. Moreover, voltage control in MTJs would simultaneously provide compatibility with voltage based semiconductor technology. Indeed, several mechanisms have been proposed to allow voltage-assisted switching in MTJs. Those mechanisms include: electric field control of magnetic anisotropy in ferromagnetic (FM) metal/dielectric bilayers, voltage control of magnetic anisotropy in strain-coupled FM metal/ferroelectric bilayers, mechanical stress mediated magneto-electric coupling in piezoelectric/magnetostrictive bilayers, and voltage control of the exchange field in FM metal/multiferroic bilayers.

Based on those mechanisms, a number of device concepts have been proposed to reduce the switching current in MTJs. These device concepts can be separated into two categories based on the location of the gate dielectric within the MTJ stack. U.S. Publication No. 2013/0015542 A1 to Wang et al. shows and described the first device category, in which an ordered, crystalline insulator (such as magnesium oxide) serves as the gate dielectric and simultaneously acts as the tunnel barrier between a pinned magnetic layer and a free magnetic layer in a MTJ stack. (Another example MTJ structure is shown in T. Maruyama et al., Nature Nanotechnology, vol. 4, pp. 158-161 (2009).) The gate dielectric layer therefore needs to exhibit high tunneling magneto-resistance, as well as strong voltage induced effects. The dual function of the tunnel barrier therefore often results in conflicting design criteria for device optimization. U.S. Publication No. 2010/0080048 A1 to Liu et al. shows and describes the second device category, in which a dedicated layer adjacent to the magnetic free layer is used to provide the voltage functionality, separate from the tunnel barrier. The voltage-controlled layer here is made up of a piezoelectric, ferroelectric or multiferroic material. Those materials often suffer from a loss of functionality at room temperature, degradation during operation and challenging processing conditions.

Once any these device are designed and fabricated, it is difficult if not impossible to modify the functional range of such a device.

SUMMARY

The Inventors have recognized and appreciated that a capability to dynamically control a wide range of functional properties of a solid state device would be beneficial. In view of the foregoing, various embodiments are directed generally to methods, apparatus, and systems for tuning a functional property of a device, such as but not limited to magnetic anisotropy property, a magnetic permeability property, a saturation magnetization property, an optical property, a magneto-optical property, an electrical property, a mechanical property, or a thermal property of a portion of the device.

In an example where the device includes metal/dielectric heterostructures, rich chemical, electronic, magnetic and mechanical properties can be derived through the controlling and regulation of interfacial chemistry and structure.

An example devices herein includes a dielectric material layer disposed in an x-y plane, and an electrically conductive material layer over and forming an interface with the dielectric material layer. The dielectric material layer includes at least one ionic species having a high ion mobility, such that exposure to electromagnetic irradiation and/or temperature changes cause changes in the mobility of the least one ionic species. The electrically conductive material is configured to reversibly uptake an amount of the at least one ionic species.

The example methods, apparatus, and systems include means for optically irradiating and/or heating (or cooling) a spatial region of the example device, and means for applying a potential difference in a direction across the interface between the dielectric material layer and the electrically conductive material layer. The example methods, apparatus, and systems include applying the potential difference for a duration of time sufficient to modify a proportionate amount of the at least one ionic species in a portion of the electrically conductive material proximate to the interface, thereby causing a change of the functional property of the device.

Example systems, methods, and apparatus herein are provided for tuning a functional property of an example device. The example device includes a dielectric material layer disposed in an x-y plane, the dielectric material layer comprising at least one ionic species having a high ion mobility, the dielectric material being configured such that exposure to electromagnetic radiation and/or temperature changes cause changes in the mobility of the least one ionic species, and a target layer disposed over and forming an interface with the dielectric material layer, the target layer comprising a metal material configured to reversibly uptake an amount of the at least one ionic species. The example apparatus includes the example device and at least one regulating element coupled to a spatial region of the device, the at least one regulating element including a voltage applying element to apply a potential difference in a direction across the interface, and at least one of a temperature regulating element to regulate a temperature of the spatial region of the device, and a source of electromagnetic radiation to irradiate at least a portion of the spatial region of the device. The at least one regulating element is configured to irradiate and/or regulate the temperature of the spatial region of the device, and to regulate the applied potential difference for a duration of time sufficient to modify a proportionate amount of the at least one ionic species in a portion of the target layer proximate to the interface, thereby causing a change of the functional property of the device. The example device is configured to retain the change of the functional property after discontinuance of applying the potential difference, the irradiating, and/or the temperature regulation, of the first portion of the device.

Example systems, methods, and apparatus herein are provided for tuning a functional property of an example device. The example device includes an active element including a ferromagnetic material layer disposed in an x-y plane, the ferromagnetic material being a metal material configured to reversibly uptake an amount of an ionic species, a gate oxide dielectric layer disposed over an forming an interface with the ferromagnetic material layer, wherein the gate oxide dielectric layer comprises the ionic species, wherein the ionic species have a high ion mobility, and wherein the dielectric material of the gate oxide dielectric layer is configured such that exposure to electromagnetic radiation and/or temperature changes cause changes in the mobility of the ionic species, and a gate electrode layer disposed over, and in electrical communication with, the gate oxide dielectric material layer. The example apparatus includes at least one regulating element coupled to a spatial region of the active element. The at least one regulating element includes a voltage applying element to apply a potential difference in a direction across the ferromagnetic material layer and the gate electrode layer of the device. The at least one regulating element includes at least one of a temperature regulating element to regulate a temperature of the spatial region of the active element, and a source of electromagnetic radiation to irradiate at least a portion of the spatial region of the active element. The regulating element is configured to irradiate and/or regulate the temperature of the spatial region of the active element, and to regulate the applied potential difference for a duration of time sufficient to modify a proportionate amount of the ionic species in a portion of the ferromagnetic material layer proximate to the interface, thereby causing a change of a functional property of the device. The device retains the change of the functional property after discontinuance of the irradiating, and/or the temperature regulation, of the active element.

Example systems, methods, and apparatus herein are provided for tuning a functional property of an example device. The example device includes a first dielectric material layer disposed in an x-y plane, a second dielectric material layer, thinner than the first dielectric material layer, which is disposed over the first dielectric material layer. Each of the first dielectric material layer and the second dielectric material layer comprising an ionic species having a high ion mobility, the dielectric material being configured such that exposure to electromagnetic radiation and/or temperature changes cause changes in the mobility of the least one ionic species. A target layer is disposed over and forms an interface with the second dielectric material layer, the target layer including a metal material configured to reversibly uptake an amount of the at least one ionic species. The apparatus includes at least one regulating element coupled to a spatial region of the device. The at least one regulating element includes at least one of a voltage applying element to apply a potential difference in a direction across the interface, a temperature regulating element to regulate a temperature of the spatial region of the device, and a source of electromagnetic radiation to irradiate at least a portion of the spatial region of the device. The at least one regulating element is configured to apply a potential difference and/or irradiate and/or regulate the temperature of the spatial region of the device, for a duration of time sufficient to modify a proportionate amount of the at least one ionic species in a portion of the target layer proximate to the interface, thereby causing a change of the functional property of the device. The example device is configured to retain the change of the functional property after discontinuance of applying the potential difference, and/or the irradiating, and/or the temperature regulation, of the first portion of the device.

Example systems, methods, and apparatus herein are provided for tuning a functional property of an example device. The example device includes a dielectric material layer disposed in an x-y plane, a spacer layer disposed over and forming a first interface with the dielectric material layer, the spacer layer including a first metal material, and a target layer disposed over and forming a second interface with the spacer layer, the target layer comprising a second metal material that is configured to reversibly uptake an amount of the at least one ionic species. The dielectric material layer includes at least one ionic species having a high ion mobility, the dielectric material being configured such that exposure to electromagnetic radiation and/or temperature changes cause changes in the mobility of the least one ionic species. The example apparatus can include at least one regulating element coupled to a spatial region of the device. The at least one regulating element includes at least one of a voltage applying element to apply a potential difference in a direction across the second interface, a temperature regulating element to regulate a temperature of the spatial region of the device, and a source of electromagnetic radiation to irradiate at least a portion of the spatial region of the device. The at least one regulating element is configured to apply a potential difference and/or irradiate and/or regulate the temperature of the spatial region of the device, for a duration of time sufficient to modify a proportionate amount of the at least one ionic species in a portion of the target layer proximate to the second interface, thereby causing a change of the functional property of the device. The example device is configured to retain the change of the functional property after discontinuance of applying the potential difference, and/or the irradiating, and/or the temperature regulation, of the first portion of the device.

Example systems, methods, and apparatus herein are provided for tuning a functional property of an example device. The example device includes a dielectric material layer comprising at least one ionic species having a high ion mobility, the dielectric material being configured such that exposure to electromagnetic radiation and/or temperature changes cause changes in the mobility of the least one ionic species, and a metal material layer proximate to and forming an interface with the dielectric material layer. An example method includes irradiating a first portion of the device using electromagnetic radiation, and/or change the temperature of the first portion of the device, and apply a potential difference in a direction across the dielectric material layer and the electrically conductive material layer for a duration of time sufficient to cause a change in proportionate amount of the at least one ionic species in a second portion of the electrically conductive material layer proximate to the interface, thereby causing a type of property change of the device, the type of property change being at least one of: a magnetic anisotropy property, a magnetic permeability property, a saturation magnetization property, an optical property, a magneto-optical property, an electrical property, a mechanical property, and a thermal property. The example device retains the type of property change after discontinuance of the irradiating, and/or the temperature change, of the first portion of the device.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1C show an schematic representation of an example device structure, according to principles of the present disclosure.

DETAILED DESCRIPTION

Figure 2A:
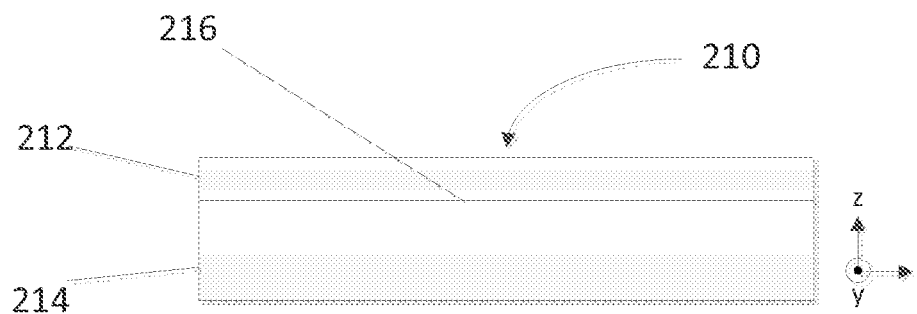
FIGS. 2A-2F show the cross section of example devices, according to principles of the present disclosure.

Following below are more detailed descriptions of various concepts related to, and embodiments of, inventive methods, apparatus, and systems for tuning a functional property of a solid-state device, such as but not limited to magnetic anisotropy property, a magnetic permeability property, a saturation magnetization property, an optical property, a magneto-optical property, an electrical property, a mechanical property, or a thermal property of a portion of the device, and other systems based thereon. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to layers, substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath," "underneath" and the like do not necessarily indicate any particular frame of reference, such as a gravitational frame of reference, but rather are used primarily to indicate relative position, alignment and/or orientation of various elements/components with respect to the substrate or layer (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

The properties of the material in a device are defined generally during its synthesis. After synthesis, there are limited options to control solid-state materials, particular at the nanoscale. The available options include annealing, particle bombardment (e.g., ion irradiation), irradiation (e.g., x-ray), exposure to gases (such as but not limited to during annealing), and plasma exposure. While these techniques can produce strong changes in material properties, they can be difficult to control (providing little spatial resolution) and non-reversible. They can require complicated equipment and they are usually unsuitable for integration into electronic devices. Also, most of these techniques do not allow for spatial control of the materials modifications. The example devices, systems, methods and apparatus herein provide for modifications of similar magnitude to that achievable using these existing techniques, but in a dynamic and reversible manner. The example devices herein have a design and configuration that is simple and uses materials that are already used, or are under consideration for use in, semiconductor electronic processes. The example devices, systems, methods and apparatus herein provide a platform that makes a wide variety of previously inaccessible key material properties accessible for voltage gating and integration into solid state electronic devices.

Accordingly, example systems, methods, and apparatus are provided herein that facilitate dynamic regulation and control of a wide range of key material properties of nanoscale solid materials post materials synthesis. Typically, the properties of a material are determined during its synthesis and it can be extremely difficult (if not impossible) to change the Example methods, materials and devices are provided herein that facilitate electrical control of a wide variety of material properties, even after the material has been synthesized. These methods, materials and devices represent a technology platform that can provide a blueprint for making a wide variety of technically and commercially important material properties more amenable to electrical control in solid-state devices. This capability has so far been out of reach so far.

The example devices, systems, methods and apparatus herein provide certain advantages over existing technology. A platform of methods, device designs, and systems are provided herein that use the selective programming of a wide range of key material properties of solid materials having target layers and/or dielectric material layers having thicknesses at the nanoscale. It is contemplated that the other dimensions can range from the nanoscale to the macroscale (such as but not limited to an extended films). The physical and chemical properties of nanoscale materials derive largely from structure and composition at interfaces. The capability to electrically modify these interfacial characteristics as described herein provides a powerful means to control material properties.

In a non-limiting example, a system is provided that leverages those example methods, materials and devices to facilitate the creation of complex patterns of material properties across films of a material that initially has the same properties across much of, if not the whole film. In effect, the example systems, apparatus, and methods herein provide a "printer"-like system for directly programming patterns of materials properties across a device, to provide increased control of the functional properties of the device. According to the principles herein, the system does not need to deposit additional material to facilitate the regulation of the materials properties. The example systems, methods, and apparatus use physical inputs, such as but not limited to optical and electrical signals, to locally program the properties of the material of the films into the a metastable state that provides the desired functional properties. These properties that can be reversibly regulated or controlled using the example systems, methods, and apparatus provided herein. Non-limiting examples of such properties include, but are not limited to magnetic anisotropy property, a magnetic permeability property, a saturation magnetization property, an optical property, a magneto-optical property, an electrical property, a mechanical property, or a thermal property of a portion of the device.

Many existing devices are configured to prevent, or significantly reduce the possibility of, migration of ionic species from the dielectric material layer to an adjacent electrically conductive layer. The migration of ionic species into any portion of an adjacent electrically conductive layer can be a breakdown mechanism of a device, such as a shorting. For example, diffusion barriers may be used in these devices to prevent such ionic species migration. As another example, the electrically conductive material layer can be formed from a conductive material that is not conducive to ionic species migration, or that reduces or prevents the ionic species migration in normal operation (such as noble metals). The electrically conductive layer could also be made of other conducting material that do not strongly interact or react with the mobile ionic species in the dielectric material layer. In some cases, one of the terminals of the device could be replaced with a conductor in close proximity to the device multilayer structure, such as the tip of a scanning probe microscope.

Applicants have developed novel devices, and systems, methods and apparatus incorporating such example devices, that exploit the reversible migration of ionic species from a dielectric material layer to an adjacent electrically conductive layer to regulate (and tune) the functional properties of the example devices.

FIGS. 1A-1C show a schematic representation of an example device structure and oxygen ion motion in the device under differing gate voltages (positive and negative gave voltages). The example device of FIG. 1A includes a conductive material layer ($M_C$) that forms an interface with a dielectric material layer. In an example, the conductive material layer ($M_C$) can be a ferromagnetic material layer ($M_F$). The example dielectric material layer in this example includes cations ($C^{X+}$) and oxide ions ($O^{2-}$). The example device includes a gate electrode layer ($M_G$), which can include a noble metal, a transition metal, or any other conductive material as described herein. As shown in FIG. 1B, with a non-zero potential difference applied in a first direction (a negative bias, $V_g<0$), an amount of the oxide ions (indicated at 102) migrates into portions of the conductive material layer ($M_C$) proximate to the interface. That is, the negative bias moves oxygen ions towards the conductive material-dielectric oxide interface in this example. As shown in FIG. 1C, with a non-zero potential difference applied in a second direction that is opposite the first direction (a positive bias, $V_g>0$), the oxide ions that had migrated into portions of the conductive material layer ($M_C$) are returned to the dielectric material layer. The positive bias moves ions away from the interface. Accordingly, FIGS. 1A-1C illustrate the reversible migration of the ionic species from a dielectric material layer to the adjacent conductive material layer of an example device.

In an example device according to the principles herein, the conductive material layer is kept sufficiently thin, such that the functional properties of the conductive material in the conductive material-dielectric material bilayer is sensitive to the oxygen stoichiometry at the interface. The dielectric material used in any of the examples herein are a high-k dielectric materials that includes an ionic species having a high vacancy mobility. In the non-limiting example of FIG. 1A-1C, the high-k dielectric material is an oxygen ion conductor with high oxygen vacancy mobility. Application of a gate voltage across the interface results in motion of oxygen ions in the dielectric oxide material layer. This in turn modifies the oxygen stoichiometry at the conductive material-dielectric material interface, and therefore changes the magnetic anisotropy (magnitude and/or direction) in the conductive material film. For example, as illustrated in FIGS. 1A-1C, under a gate voltage in a first direction, oxygen ions move away from the conductive material-dielectric oxide material interface. Under a gate voltage of an opposite bias, the oxygen ions migrate towards the conductive material-dielectric oxide material interface. According to the example systems, methods, and apparatus herein, the modification of the functional properties of the conductive material film can be tuned by regulating the oxygen stoichiometry at the conductive material-dielectric material interface, by controlling parameters such as but not limited to, the polarity and/or magnitude and/or dwell time of the gate voltage, and/or the mobility of the ionic species.

In an example device where the conductive material layer is a ferromagnetic material layer, the ferromagnetic material shows strong perpendicular magnetic anisotropy (i.e., an easy magnetization axis perpendicular to the film plane) for a given desired oxygen stoichiometry at the ferromagnetic material-dielectric oxide material interface. If the interface is over oxidized, or under-oxidized, the perpendicular magnetic anisotropy is lost and the system develops an easy axis in the plane of the ferromagnetic material film. At a certain level of oxygen stoichiometry in a portion of the ferromagnetic material layer at the ferromagnetic material-dielectric oxide material interface, the example device has close to zero magnetic anisotropy. Thus, the modification of magnetic anisotropy of the ferromagnetic material film can be tuned by regulating the oxygen stoichiometry in a portion of the ferromagnetic material layer at the ferromagnetic material-dielectric material interface, according to the example systems, methods, and apparatus herein.

Example systems, methods and apparatus are provided herein that facilitate use of a voltage to control the saturation magnetization in ferromagnetic metal thin films and nanodevices. The saturation magnetization describes the total magnetic moment per unit volume in the material in the magnetically saturated state (that is, when the magnetization is uniformly oriented in the material). In the context of a magnetic memory element, the torque to be applied to a magnetic material to switch its magnetization direction depends on the saturation magnetization and the total magnetic moment of the material. Moreover, the local magnetic energy in a material depends on the saturation magnetization, so that local variations in the saturation magnetization can create pinning sites for magnetic domain walls.

In an example, the change in magnetic anisotropy may accompany a change in the saturation magnetization of the ferromagnetic material.

In an example device where the conductive material layer includes a transition metal, the optical or magneto-optical properties (such as but not limited to the plasma resonance) can be modified based on the oxygen stoichiometry at the conductive material-dielectric material interface. Thus, the optical and/or magneto-optical properties of the conductive material film can be tuned by regulating the oxygen stoichiometry in a portion of the conductive material layer at the conductive material-dielectric material interface, according to the example systems, methods, and apparatus herein.

In any example device herein, the electrically conductive target material layer can have a thickness of about 0.5 nm, about 0.7 nm, about 0.9 nm, about 1 nm, about 1.3 nm, about 1.5 nm, about 1.8 nm, about 2 nm, about 3 nm, about 4 nm, about 5 nm, or greater. The dielectric material layer can have a thickness of about 1.0 nm, about 2.0 nm, about 3.0 nm, about 5.0 nm, about 7.0 nm, about 9.0 nm, about 10 nm, about 13 nm, about 15 nm, about 20 nm, about 25 nm, about 30 nm, about 35 nm, about 40 nm, about 50 nm, about 60 nm, about 70 nm, about 80 nm, or greater. References herein to thickness of a layer are to the magnitudes in the z-direction.

The example systems, apparatus and methods according to the principles described herein can be used for tuning at least one functional property of an example device. In a non-limiting examples, the functional property of the device can be any one or more of magnetic anisotropy property, a magnetic permeability property, a saturation magnetization property, an optical property, a magneto-optical property, an electrical property, a mechanical property, and a thermal property of a portion of the device.

As a non-limiting example, the functional property is a local reflectivity of the example device. Using the example systems, methods, and apparatus herein, the change of proportionate amount of the at least one ionic species in a portion of the target layer can be used to cause a change of the local reflectivity of different portions of the example device.

As a non-limiting example, the functional property is a magnetic anisotropy of the target layer. Using the example systems, methods, and apparatus herein, the change of proportionate amount of the at least one ionic species in a portion of the target layer can be used to cause a change among a perpendicular (out-of-plane) magnetic anisotropy, an in-plane magnetic anisotropy, and (very low or nearly) zero magnetic anisotropy. In any example implementation, the regulation of proportionate amount of the at least one ionic species in a portion of the target layer can be used to cause a change in magnitude and/or orientation of the magnetic anisotropy.

As a non-limiting example, the functional property is the magnetization and/or the magnetic moment of the target layer. Using the example systems, methods, and apparatus herein, the change of proportionate amount of the at least one ionic species in a portion of the target layer can be used to cause a change in magnitude and/or direction of the magnetization and/or the magnetic moment.

As a non-limiting example, the functional property is the magnetic permeability of the target layer. Using the example systems, methods, and apparatus herein, the change of proportionate amount of the at least one ionic species in a portion of the target layer can be used to vary at least one of: (i) the magnetic anisotropy, (ii) the magnetization, and (iii) the magnetic moment of the film, thereby modifying the magnetic permeability of the target layer.

In a non-limiting example, the magnetic properties of the example device can be modified such that the example device operates in a linear response region, where the magnetization is approximately proportional to the applied magnetic field.

The example devices, systems, methods, and apparatus according to the principles herein can be configured as a spintronic device, a magnetic recording device, a memristor, a non-volatile memory device, a magnetoresistive random-access memory device, a voltage-controlled magnetic memory, a voltage-tunable magnetic sensor, a voltage-tunable inductor, a voltage-controlled resonant device, a voltage-controlled lateral conductive device, an electrically controllable catalysis device, a voltage controlled optical switch, a responsive window tinting device, or a display device.

The example devices, systems, methods, and apparatus according to the principles herein can be configured as an organic spintronic device, or other organic device.

The example devices, systems, methods, and apparatus according to the principles herein can be used to provide memristors for implementation in applications such as, but not limited to, nanoelectronic memories, computer logic, and neuromorphic/neuromemristive computer architectures. As non-limiting examples, the devices, systems, methods, and apparatus according to the principles herein can be configured to provide non-volatile computer memory and storage, flash drives, including EEPROMs (electrically erasable programmable read-only memory), solid-state drives (SSD), dynamic random-access memory (DRAM), and Static random-access memory (SRAM). The example device elements can be used in applications using different types of memory, such as but not limited to, capacitor, variable capacitor, floating gate transistor, four transistor feedback loop circuit, or magnetic tunnel junction in commercialized DRAM, FeRAM, NOR flash, SRAM or MRAM, technologies. The novel devices, systems, methods, and apparatus according to the principles herein can be used to removable storage devices for mobile devices and smartphones, cameras, tablets, and other portable applications.

An example devices according to the principles herein includes a dielectric material layer disposed in an x-y plane, and an electrically conductive material layer over and forming an interface with the dielectric material layer. The dielectric material layer includes at least one ionic species having a high ion mobility, such that exposure to electromagnetic irradiation and/or temperature changes cause changes in the mobility of the least one ionic species. The electrically conductive material is configured to reversibly uptake an amount of the at least one ionic species.

In operation, under the directional influence of an applied potential difference in a direction across the interface between the dielectric material layer and the electrically conductive material layer, the at least one ionic species are caused to migrate into (or out of) the portions of the electrically conductive material layer proximate to the interface. That is, the potential difference is applied for a duration of time sufficient to cause a change in the proportionate amount of the at least one ionic species present in the portions of the electrically conductive material layer proximate to the interface. Due to the nanoscale thickness of the electrically conductive material layer, changes to the proportionate composition at the interface can affect the materials properties of the electrically conductive material layer. As a result, changes in the proportionate amount of the at least one ionic species present in the portions of the electrically conductive material layer proximate to the interface can cause changes in the function properties of the example device.

According to the principles of the instant disclosure, systems, methods, and apparatus are provided for regulating (i.e., tuning) one or more of the functional properties of the example device, by modifying the mobility of the at least one ionic species in the dielectric material layer, and applying a potential difference to cause the at least one ionic species in the desired direction (into or out of the electrically conductive material layer). Accordingly, the dielectric material layer serves as a reservoir of the ionic species. Migration of the ionic species into or out of the electrically conductive material proximate to the interface facilitates tuning of the materials properties of the electrically conductive material layer. This facilitates tuning of the functional property(ies) of the example device.

Example methods, apparatus and systems herein include means for optically irradiating and/or heating a spatial region of the example device, and means for applying a potential difference in a direction across the interface between the dielectric material layer and the electrically conductive material layer. The example methods, apparatus, and systems include applying the potential difference for a duration of time sufficient to modify a proportionate amount of the at least one ionic species in a portion of the electrically conductive material proximate to the interface, thereby causing a change of the functional property of the device.

In a non-limiting example implementation, the electrically conductive material layer can be a ferromagnetic material layer. The example electrical ferromagnetic material layer can form an interface with a dielectric material layer that includes oxide ions species. The modification of the proportionate amount of the oxide ions species in the portion of the target layer causes a change in magnetic anisotropy of the device proximate to the spatial region. As described herein, the modification of the proportionate amount of the at least one ionic species in the electrically conductive material layer proximate to the interface causes a change in magnetic anisotropy of the example device proximate to the spatial region. In an example, a magnetic memory/storage device can be derived based on selectively and controllably causing local changes to the magnetic properties, such as but not limited to the magnetic anisotropy, magnetic permeability, or magnetization, of different spatial regions of the example device, thereby programming bits of information into different spatial regions of the example device.

As a non-limiting example, the functional property of the magnetic anisotropy of the target layer can be regulated based on the systems, methods, and apparatus described herein for controlling and regulating the migration of the ionic species into and out of the target layer. Using the example systems, methods, and apparatus herein, the regulation of the proportionate amount of the at least one ionic species in a portion of the target layer can be used to cause a change between a metastable state of the target layer having perpendicular (out-of-plane) magnetic anisotropy and a metastable state of the target layer having an in-plane magnetic anisotropy. In another example, the regulation of the proportionate amount of the at least one ionic species in a portion of the target layer can be used to cause a change between a metastable state of the target layer having close to zero magnetic anisotropy. A read-out of the device can be based on detection of the magnetic anisotropy, or a property that depends on anisotropy, such as but not limited to magnetic permeability, of each discrete site of differing magnetic anisotropy. This capability can be exploited to provide magnetic devices, such as but not limited to a magnetic memory device, by using these differing metastable states to program information. Accordingly, the example systems, methods, and apparatus herein can provide a magnetic device that is based on use of two of these metastable states (e.g., as "1" and "0"), or all three of these metastable states, for programming information based on any computer logic, logic theory or stochastic theory.

FIG. 2A shows the cross section of an example device 210 according to the principles of the instant disclosure. The example device 210 includes an electrically conductive material layer 212 (a target layer) and a dielectric material layer 214 disposed in an x-y plane. As shown in FIG. 2A, the electrically conductive material layer 212 is disposed over and forms an interface 16 with the dielectric material layer 214.

Figure 2B:
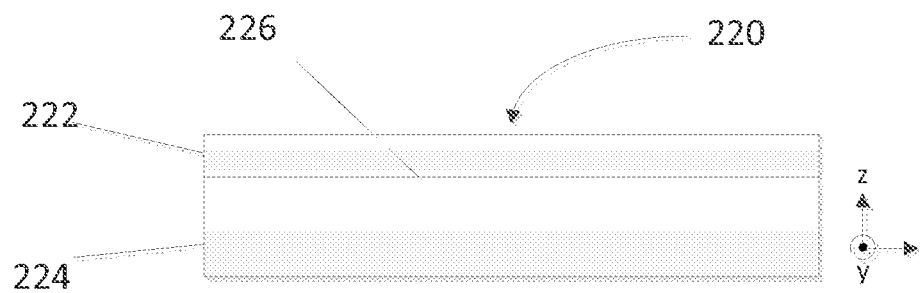

FIG. 2B shows the cross section of another example device 220 according to the principles of the instant disclosure. The example device 220 includes an electrically conductive material layer 222 (a target layer) formed from a ferromagnetic material, and a dielectric material layer 224 disposed in an x-y plane. As shown in FIG. 2B, the electrically conductive material layer 222 is disposed over and forms an interface 226 with the dielectric material layer 224.

Figure 2C:
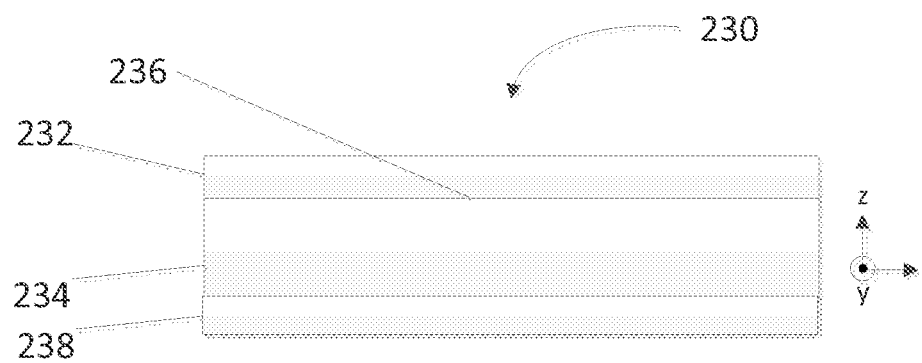

FIG. 2C shows the cross section of another example device 230 according to the principles of the instant disclosure. The example device 230 includes an electrically conductive material layer 232 formed from a ferromagnetic material, and a dielectric material layer 234 disposed in an x-y plane, as a gate oxide dielectric layer. As shown in FIG. 2C, the electrically conductive material layer 232 is disposed over and forms an interface 236 with the dielectric material layer 234. Example device 230 includes a gate electrode layer 238 in electrical communication with the dielectric material layer 234 (as a gate oxide dielectric layer). In an example, device 230 also includes an electrically conductive material layer to serve as an electrical contact to the electrically conductive material layer 232 (which serves as a target layer). In another example, the electrically conductive material layer could be excluded, and an electrical contact could be made to the electrically conductive material layer 232.

Figure 2D:
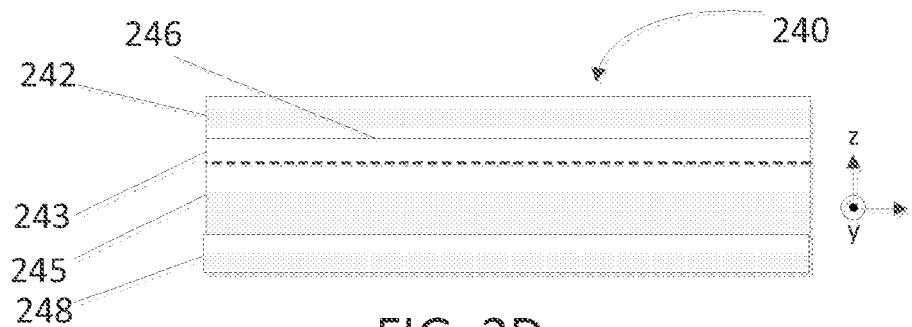

FIG. 2D shows the cross section of another example device 240 according to the principles of the instant disclosure. The example device 240 includes an electrically conductive material layer 242 (a target layer) disposed in an x-y plane, and a dielectric material bilayer that includes as a thinner intermediate dielectric layer 243 and a thicker gate dielectric layer 245. In an example, the thicker gate dielectric layer 45 can be formed as a gate oxide dielectric layer. As shown in FIG. 2D, the electrically conductive material layer 242 is disposed over and forms an interface 246 with the intermediate dielectric layer 43 of the dielectric material bilayer. Example device 240 includes a gate electrode layer 48 in electrical communication with the thicker gate dielectric layer 245. In an example, device 240 also can include another electrically conductive material layer to serve as an electrical contact to the electrically conductive material layer 242 (which serves as a target layer). In this example, the electrically conductive material layer 242 can be formed from a ferromagnetic material. In another example implementation, the electrically conductive material layer could be excluded, and contact could be made to the electrically conductive material layer 242.

Figure 2E:
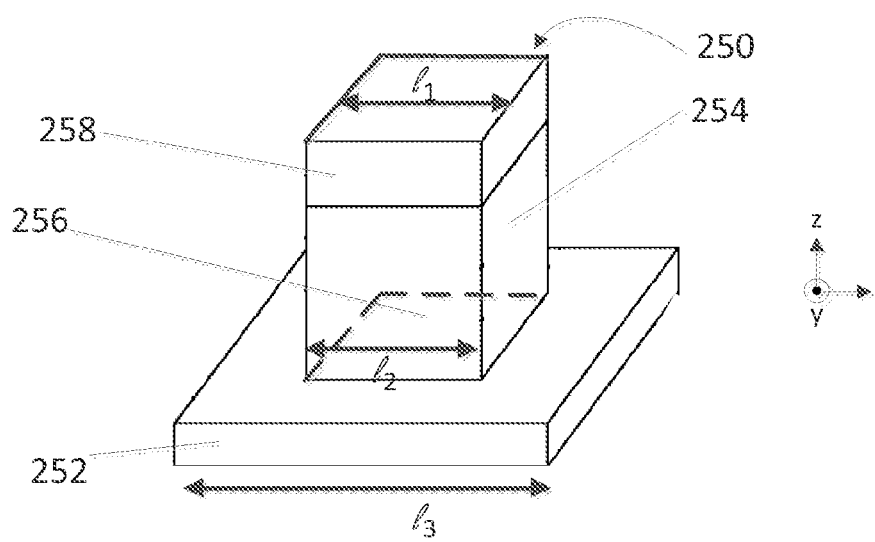

FIG. 2E shows an example device 250 according to the principles of the instant disclosure. The example device 250 includes an electrically conductive material layer 252 formed from a ferromagnetic material disposed in an x-y plane, and a dielectric material layer 254 disposed in an x-y plane, as a gate oxide dielectric layer. As shown in FIG. 2E, the electrically conductive material layer 252 forms an interface 256 with the gate oxide dielectric layer 254. Example device 250 includes a gate electrode layer 258 in electrical communication with the gate oxide dielectric layer 255. As shown in example device 250, the gate oxide dielectric layer 254 and the gate electrode layer 258 can each have a substantially rectangular or square cross-section.

In the non-limiting examples of FIG. 2E, the lateral dimension $l_2$ of the gate oxide dielectric layer is approximately equal to the lateral dimension $l_1$ of the gate electrode layer. In these examples, the lateral dimension $l_3$ of the ferromagnetic material layer is greater than the lateral dimensions $l_1$ and $l_2$. In other non-limiting example devices, the lateral dimension $l_1$ of the gate electrode layer can be smaller than the lateral dimension of the gate oxide dielectric layer $l_2$.

Figure 2F:
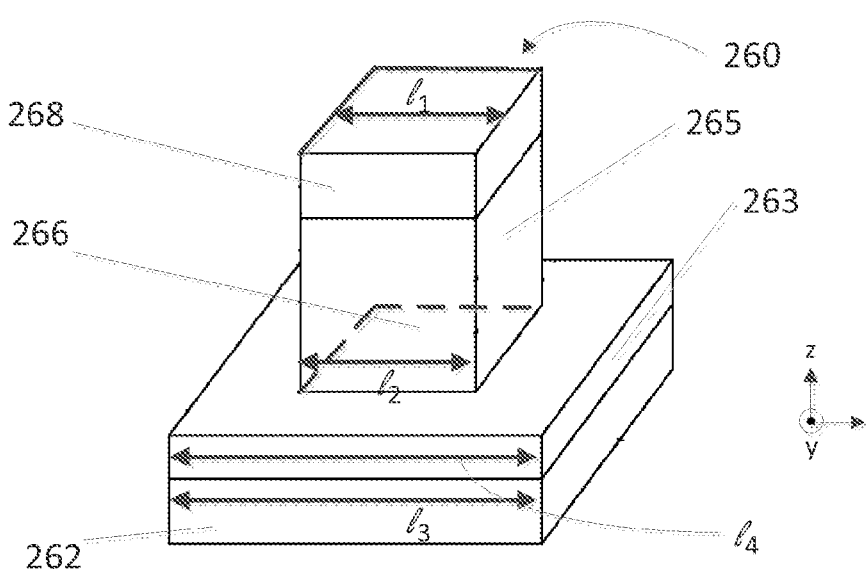

FIG. 2F shows an example device 260 according to the principles of the instant disclosure. The example device 260 includes an electrically conductive material layer 262 formed from a ferromagnetic material disposed in an x-y plane, and a bilayer of dielectric material formed as an intermediate oxide dielectric layer 263 and a gate oxide dielectric layer 265. As shown in FIG. 2F, the electrically conductive material layer 262 forms an interface 266 with the intermediate oxide dielectric layer 263. Example device 260 includes a gate electrode layer 268 in electrical communication with the gate oxide dielectric layer 265.

As shown in the non-limiting examples of FIGS. 2E and 2F, the gate oxide dielectric layer and the gate electrode layer can have a substantially rectangular or square cross-section. In another example, the gate oxide dielectric layer and the gate electrode layer can each be formed with an elliptical, circular, or other polygonal cross-sections, such as but not limited to a hexagonal cross-section. As also shown in the non-limiting examples of FIGS. 2E and 2F, the lateral dimension $l_2$ of the gate oxide dielectric layer is approximately equal to the lateral dimension $l_1$ of the gate electrode layer. In these example, the lateral dimension $l_3$ of the ferromagnetic material layer (and the intermediate oxide dielectric layer $l_4$ in FIG. 2F) are greater than the lateral dimensions $l_1$ and $l_2$. In other non-limiting example devices, the lateral dimension $l_1$ of the gate electrode layer can be smaller than the lateral dimension of the gate oxide dielectric layer $l_2$.

In the non-limiting example of FIG. 2F, the intermediate oxide dielectric layer and the ferromagnetic material layer are shown as having similar lateral dimensions ($l_3 \approx l_4$). In other examples, the intermediate oxide dielectric layer and the ferromagnetic material layer can be configured to have different lateral dimensions ($l_3 \neq l_4$). For example, the example device can be fabricated such that the ferromagnetic material layer has a greater lateral dimension than the intermediate oxide dielectric layer ($l_3 < l_4$).

In various example implementations according to the principles herein, including the example devices of any of FIGS. 2D, and 2F, the gate oxide dielectric layer can be configured with a greater thickness in the z-direction than the intermediate oxide dielectric material layer, by a factor of about 2, about 3, about 5, about 10, or higher. In some examples, the intermediate oxide dielectric layer can be formed from a different dielectric material than the gate oxide dielectric layer.

Figure 3A:
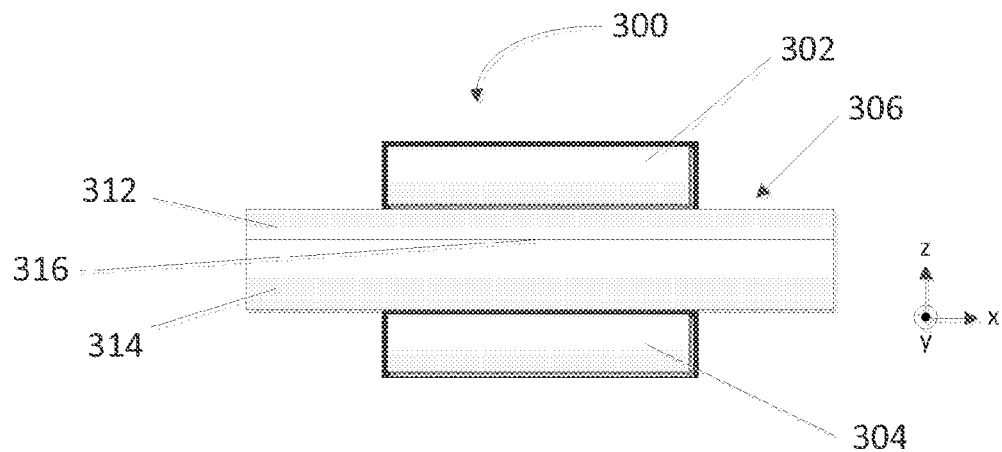
FIGS. 3A and 3B illustrate two different cross-sectional geometries of\example two-terminal configurations, according to principles of the present disclosure.
Figure 3B:
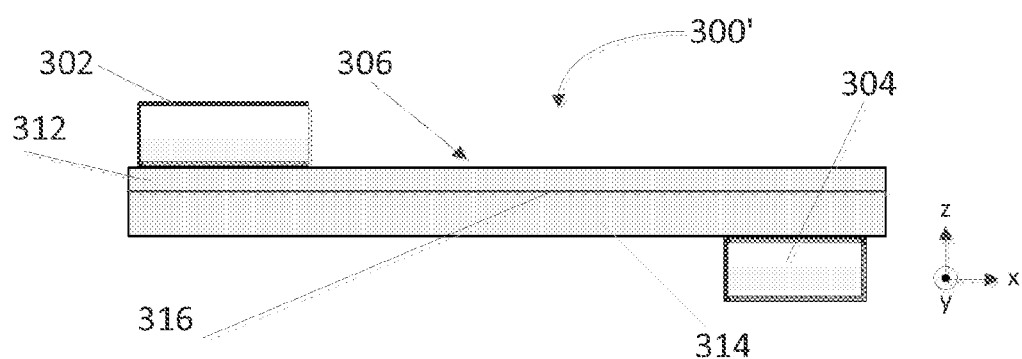
Figure 3C:
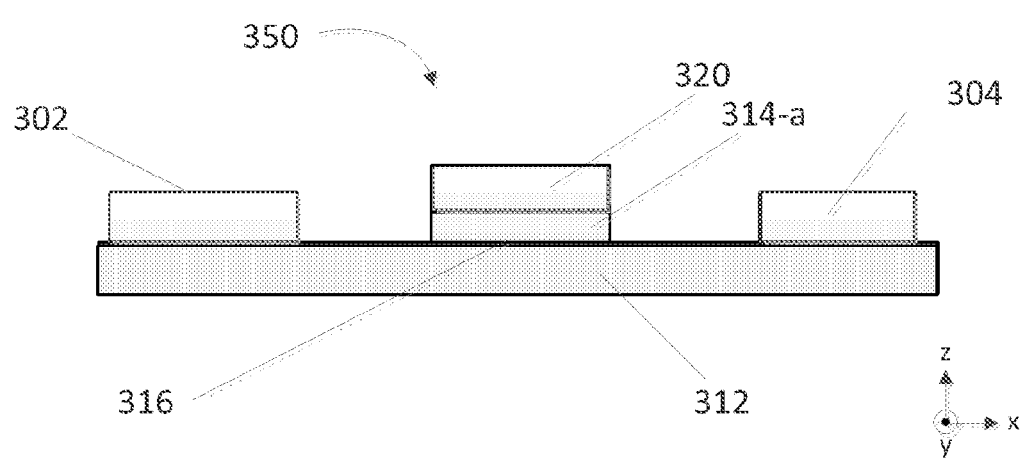
FIG. 3C illustrates an example three-terminal configuration, according to principles of the present disclosure.

In various example implementations according to the principles herein, including the example devices of any of FIGS. 2A through 2F, any of the example devices according to the principles herein may be configured in a two-terminal configuration, a three-terminal configuration (illustrated in FIGS. 3A-3C).

FIGS. 3A and 3B illustrate two different cross-sectional geometries of non-limiting example two-terminal configurations 300 and 300'. Both FIGS. 3A and 3B show example two-terminal configuration that include electrically conductive contacts 302 and 304 coupled in electrical communication with opposite sides of example device 306 in the z-direction. In accordance with the principles described herein, example devices 306 include an electrically conductive material layer 312 that forms an interface 316 with a dielectric material layer 314. In the example two-terminal configuration 300 of FIG. 3A, the electrically conductive contacts 302 and 304 are disposed to overlap each other. In the example two-terminal configuration 300' of FIG. 3B, the electrically conductive contacts 302 and 304 are disposed to have no overlap.

FIG. 3C illustrates a non-limiting example three-terminal configuration 350. The example three-terminal configuration includes electrically conductive contacts 302 and 304 coupled in electrical communication with electrically conductive material layer 312. One side of the dielectric material layer 314-a forms an interface 316 with the electrically conductive material layer 312. A gate electrode 320 is disposed over the other side of the dielectric material layer 314-a. In this example according to the principles herein, the example device 306 includes a dielectric material layer 314-a that forms an interface 316 with only a portion of the electrically conductive material layer 312. In the example of FIG. 3C, electrically conductive contacts 302 and 304 are disposed on the same side of electrically conductive material layer 312. In another example according to the principles herein, electrically conductive contacts 302 and 304 can be disposed on opposite sides of electrically conductive material layer 312.

In various example devices and configurations according to the principles herein, including the example devices of any of FIGS. 2A through 2F or the device configurations of any of FIGS. 3A through 3C, the dielectric material layer is formed from a dielectric material that includes at least one ionic species having a high ion mobility. The dielectric material of the dielectric material layer is configured to be tunable, such that exposure to electromagnetic radiation and/or temperature changes can cause changes in the mobility of the least one ionic species. In an example implementation, the mobility of the at least one ionic species can be tuned (i.e., regulated) by increasing or decreasing the amount of electromagnetic radiation impinging on, or otherwise coupled to, the example device. A laser and/or another source of electromagnetic radiation can be used to provide the electromagnetic radiation. In another example implementation, the mobility of the at least one ionic species can be tuned (i.e., regulated) by increasing the temperature (heating) or decreasing the temperature (cooling) of a portion of the example device. As non-limiting examples, the changes in temperature can be achieved using a heating element, a thermoelectric element, and/or a laser beam.

As non-limiting examples, the at least one ionic species can be at least one of: an anion including oxygen and an anion including hydrogen. The at least one ionic species can be, but is not limited to, an oxide, an oxynitride, a nitride, or a silicate.

As non-limiting examples, the dielectric material can be based on at least one of: gadolinium, hafnium, terbium, zirconium, yttrium, tantalum, titanium, aluminum, silicon, germanium, gallium, indium, tin, antimony, tellurium, barium, bismuth, titanium, vanadium, chromium, manganese, cobalt, nickel, copper, zinc, niobium, molybdenum, palladium, cadmium, strontium, tantalum, niobium, cerium, praesydium, or tungsten, or any combination thereof. For example, the dielectric material can be an oxide, an oxynitride, a nitride, or a silicate of any of these materials. As other non-limiting examples, the dielectric material can be aluminum oxide ($AlO_x$), bismuth zinc niobate, hafnium oxide ($AlO_x$), barium strontium titanate, tantalum oxide, or gadolinium oxide ($GdO_x$). In any example herein, the dielectric material can be $Gd_2O_3$ or $SrTiO_3$.

In any example herein, the dielectric material can be formed from any dielectric material or electrolyte having high ion mobility that is considered for application, e.g., in fuel cells or electrochemical metallization memory cells. For example, dielectric material layer can be formed from any of the high ionic mobility materials known in the art, and listed, e.g., in R. Waser et al., *Advanced Materials*, vol. 21, pp. 2632-2663 (2009), or W. Lu et al., Materials Research Society Bulletin, vol. 37, pp. 124-130 (2012), each of which is incorporated herein for the disclosure of the dielectric materials and/or electrolytes.

In any example herein, the dielectric material can be formed to have an amorphous structure, or a semi-crystalline structure, since such structures can facilitate higher mobility of ion vacancies.

In any example herein, the dielectric material can be formed from an organic material having high mobility ionic species, including any applicable polymeric material. As non-limiting examples, an example device that includes an organic dielectric can be used to provide an organic memory, an organic spintronic device, an organic magnetic recording device, an organic memristor, an organic non-volatile memory device, an organic magnetoresistive random-access memory device, an organic voltage-controlled magnetic memory, an organic voltage-tunable magnetic sensor, an organic voltage-controlled lateral conductive device, an organic electrically controllable catalysis device, an organic voltage controlled optical switch, an organic responsive window tinting device, or an organic display device.

In various example devices and configurations according to the principles herein, including the example devices of any of FIGS. 2A through 2F or the device configurations of any of FIGS. 3A through 3C, the electrically conductive material layer of the active region of the device is formed from an electrically conductive material that is configured to reversibly uptake an amount of the at least one ionic species. The electrically conductive material layer can include aluminum, a transition metal, a rare earth metal, and/or an alloy of any of these conductive materials. As non-limiting examples, the electrically conductive material layer can include copper, tantalum, tin, tungsten, titanium, tungsten, cobalt, chromium, silver, nickel, iron, nickel, cobalt, samarium, dysprosium, yttrium, chromium. In various examples, the alloy can be an alloy of one or more transition metals, or an alloy of one or more rare earth metals, or an alloy that includes at least one transition metal and at least one rare earth metal. The alloy can be a binary or ternary system of any of these conductive materials. In an example where the electrically conductive material layer is ferromagnetic, the ferromagnetic material can include iron, nickel, cobalt, samarium, dysprosium, yttrium, chromium, or an alloy of at least one of iron, nickel, cobalt, and samarium. In an example, the ferromagnetic material can also include a non-magnetic element, such as but not limited to boron. Non-limiting examples of such ferromagnetic materials are a ferromagnetic alloy including any one or more of cobalt (Co), nickel (Ni), iron (Fe), as well as at least one of boron (B), carbon (C), copper (Cu), hafnium (Hf), palladium (Pd), platinum (Pt), rhenium (Re), rhodium (Rh), or ruthenium (Ru). For example, the ferromagnetic material can be formed as cobalt-iron-boron.

In an example, the electrically conductive material layer can also be a bilayer or multilayer of several of any of the metals and/or alloys described hereinabove. One or more functional properties of the target layer (whether in the layer or at its interface with the dielectric layer) can depend on the relative thicknesses of the layers. As a non-limiting example, the target layer can be a metal bilayer of a magnetic metal (such as but not limited to iron, nickel, cobalt, and samarium) and a noble metal (such as but not limited to gold). The optical properties at the interface of the metal bilayer can be controlled by using a voltage to regulate the oxide content (i.e., the oxidation or reduction) of the magnetic metal of the metal bilayer.

In various example devices and configurations according to the principles herein, including the example devices of any of FIGS. 2A through 2F or the device configurations of any of FIGS. 3A through 3C, the electrically conductive material layer can be formed as a nanostrip disposed in the x-y plane. A nanostrip can be configured as a portion of the electrically conductive material layer that is formed as a longitudinal structure. For example, the nanostrip can be configured to have a rectangular cross-section. The nanostrip can have a length to width aspect ratio of at least about 3:2 (i.e., length/width≈1.5), or higher. For example, the aspect ratio can be about 5:1, about 10:1, about 100:1, about 1000:1, or higher. The nanostrip can have a width on the order of nanometers, such as but not limited to about 3 nm, about 5 nm, 10 nm, about 25 nm, or about 50 nm. The thickness of the nanostrip in the z-direction can be less than the width of the nanostrip. In an example, the electrically conductive material layer can include two or more nanostrips.

In various example devices and configurations according to the principles herein, including the example devices of any of FIGS. 2A through 2F or the device configurations of any of FIGS. 3A through 3C, the example electrically conductive contact herein can be formed from gold, platinum copper, tantalum, tin, tungsten, titanium, tungsten, cobalt, chromium, silver, nickel, rhuthenium or aluminum, or a binary or ternary system of any of these conductive materials.

The electrically conductive material layer of the example devices and configurations according to the principles herein are configured for reversible uptake of an amount of the at least one ionic species. That is, the electrically conductive material layer is configured to be oxidizable, or reducible, or otherwise capable of reversibly coupling with the at least one ionic species. The dielectric material layer serves as a reservoir of the ionic species. The amount of the higher-mobility ionic species in the dielectric material layer can be changed (increased or decreased) by regulating the temperature and/or electromagnetic radiation exposure of the dielectric material. The direction of the applied potential difference across the interface between the electrically conductive material layer and the dielectric material layer causes the mobile ionic species to migrate into (or out of) the portions of the electrically conductive material layer proximate to the interface. The magnitude of the potential difference drives the ionic species into the electrically conductive material layer at interface, such that the state of electrically conductive material layer changes proximate to the interface to change the properties of the electrically conductive material. For example, the mobile ionic species can be driven to a depth of up to about 0.1 nm, about 0.3 nm, about 0.5 nm, about 0.8 nm, about 1 nm, about 1.2 nm, or more, into the electrically conductive material layer (as measured from the interface). This change in the state of electrically conductive material layer results in a change in the functional property of the example device.

The example devices and configurations according to the principles herein are capable of retaining the change of the functional property even after discontinuance of the application of the potential difference, the irradiating, and/or the temperature regulating. That is, the changed state of electrically conductive material layer (from the presence of the at least one ionic species) is a metastable state that persists for a period of time even after discontinuance of the applied potential difference. This metastable state can persist for a (persistence) period of time up to about 10 nanoseconds, about 100 nanoseconds, about 500 nanoseconds, about 1 microsecond, about 500 microseconds, about 1 millisecond, about 100 milliseconds, about 500 milliseconds, about 1 second, about 5 seconds, about 10 seconds, about 30 seconds, about 60 seconds, about 3 minutes, about 5 minutes, about 10 minutes, about 30 minutes, about 60 minutes, for several hours, for several days, or longer (including substantially longer periods of time, such as weeks, or years, which might be desirable for data storage applications).

Once the ionic species are driven into the electrically conductive material layer under an applied potential difference in a first direction, this changed state of the electrically conductive material layer (a first state) persists in the metastable state (for the duration of its persistence period) unless a potential difference having opposite polarity (i.e., in an opposite direction) is applied. A first, non-zero amount of the ionic species is present in the electrically conductive material layer (e.g., as quantified by proportion or concentration) in this first metastable state. When a potential difference of an opposite polarity is applied, the at least one ionic species migrate out of the electrically conductive material layer, back to the dielectric material layer. This results in a smaller amount of the ionic species remaining in the electrically conductive material layer (as quantified by proportion or concentration), to provide a second metastable state. The overall example device has different functional properties depending on whether the electrically conductive material layer is in the first metastable state or in the second metastable state.

Example systems, methods, and apparatus are provided for selectively and locally "programming" different functional properties into different spatial regions of an example device, configured in any applicable configuration. For example, the reversible metastable change in state of the electrically conductive material layer can be "programmed" at different local spatial regions of an example device. Through discrete local application of the potential difference, and either (i) exposure to the electromagnetic radiation, or (ii) local temperature regulation, or both (i) and (ii), differing regions of the example device can be caused to exhibit different functional properties. Accordingly, example systems, methods, and apparatus are provided for locally and controllably modifying the state of electrically conductive material layer, thereby reversibly, locally and controllably changing the functional properties of the example device. This example provides for direct "writing" of the functional properties at different portions of the example devices.

Example systems, methods, and apparatus are also provided for tuning the functional properties. An example apparatus includes a regulating element coupled to a spatial region of any example device or configuration according to the principles herein, including the example devices of any of FIGS. 2A through 2F or the device configurations of any of FIGS. 3A through 3C. The example regulating element includes a voltage applying element and at least one of a temperature regulating element and a source of electromagnetic radiation. The voltage applying element is configured to apply a potential difference in a direction across the interface between the dielectric material layer and the electrically conductive material layer. The temperature regulating element is configured to regulate a temperature of the spatial region of the example device. The source of electromagnetic radiation is configured to irradiate at least a portion of the spatial region of the example device. The regulating element is configured to irradiate and/or regulate the temperature of the spatial region of the example device (to activate mobile ionic species in the dielectric material layer), and to regulate the applied potential difference for a duration of time sufficient to modify a proportionate amount of the at least one ionic species in a portion of the electrically conductive material layer proximate to the interface, thereby causing a change of the functional property of the device. Using the regulating element, the desired functional property change can be "programmed" into selected regions of example device by controlling the metastable state of the electrically conductive material layer at that spatial region. As described herein, the change of the functional properties can be retained (for the lifetime of the metastable state) after discontinuance of applying the potential difference, and the irradiating and/or the temperature regulation.

In various example implementations, the voltage applying element can be configured to apply a sufficiently high potential difference of a magnitude of 50 millivolts or less, about 0.1 V, about 0.3 V, about 0.5 V, about 0.7 V, about 1.0 V, about 1.5, about 2.0 V, about 3.0 V, about 5.0 V, about 7.0 V, about 10 V, about 20 V, about 50 V, about 100 V, or greater. As described herein, the polarity of the potential difference depends on the type of metastable state sought, the existing state of the device at the time the potential difference is applied, and the device layer structure.

The direction of ionic motion is determined by the charge of the ionic species and the polarity of the applied voltage. Properties of the electrically conductive material layer depend on the chemical composition and defect structure at the interface formed with the dielectric material layer, accumulation or depletion of the mobile ionic species at this interface can significantly modify the properties of the target material layer. Also, motion of the mobile ionic species into a portion of the target layer, beyond the immediate interface region, facilitates the modification of the chemical composition and defect structure of parts of the target material layer. This allows access to additional material properties that might not be directly sensitive to the interface.

In various example implementations, the temperature regulating element can be a heating element, a thermoelectric element, or a laser beam. The heating element may be configured as a resistive element coupled to the spatial region of the device. The thermoelectric element can be thin-film thermoelectric, such as but not limited to a $Bi_2Te_3$-based film or a $CoSb_3$-based skutterudite material.

In an example implementation wherein the temperature regulating element is configured to heat the spatial region of the device, the heating is applied to heat the region to a threshold temperature value of about 22° C., about 25° C., about 30° C., about 50° C., about 70° C., about 100° C., about 120° C., about 150° C., about 170° C., about 200° C., about 250° C., about 300° C., or about 350° C., or higher. In an example, the threshold temperature value is set to be within the range of allowable operating temperatures of an example device.

Example, systems, methods, and apparatus are also provided for tuning the functional properties using an apparatus that includes a plurality of separately addressable regulating elements. Each regulating element can be coupled to a different, respective spatial region of an example device. In this example, each regulating element is configured to regulate a potential difference and either (i) the temperature, or (ii) the electromagnetic radiation exposure, or both (i) and (ii), at each different, respective spatial region of the device, thereby causing a modification in proportionate amount of the at least one ionic species in the portion of the electrically conductive material layer proximate to the interface at each different, respective spatial region of the example device.

Example, systems, methods, and apparatus are also provided for tuning the functional properties of an example device that includes a plurality of device elements (also referred to herein as an active element) in an array, using an apparatus that includes a plurality of regulating elements. A device element can be configured as any of the example device or configuration according to the principles herein, including the example devices of any of FIGS. 2A through 2F or the device configurations of any of FIGS. 3A through 3C. Each of the regulating elements can be coupled to a respective one or more of the device elements. Each regulating element is configured to regulate the potential difference and either (i) the temperature, or (ii) the electromagnetic radiation exposure, or both (i) and (ii), at each of the respective one or more of the device elements, thereby causing a modification in proportionate amount of the ionic species in a portion of the electromagnetic material layer proximate to the interface of the respective device element.

In any example herein, the example device could be configured as a flexible device or a substantially rigid device. In an example device, the target layer and/or the dielectric material layer could be formed of a flexible material. In an example, the example flexible device could include a flexible substrate, and the target layer and dielectric material layer could be disposed over at least a portion of the flexible substrate. In another example, the example device could be configured with a combination of flexible regions and more rigid regions. In any example herein, one or both of the target layer and dielectric material layer could be grown, using any deposition technique and tool in the art, on a large area substrate that includes flexible and rigid regions.

Non-limiting examples of flexible substrates include thin wood or paper, vinyl, leather, or other fabric (including artwork or other works on canvas), a polymer or polymeric material. Non-limiting examples of applicable polymers or polymeric materials include, but are not limited to, a polyimide, a polyethylene terephthalate (PET), a silicone, or a polyeurethane. Other non-limiting examples of applicable polymers or polymeric materials include plastics, elastomers, thermoplastic elastomers, elastoplastics, thermostats, thermoplastics, acrylates, acetal polymers, biodegradable polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials.

Figure 4A:
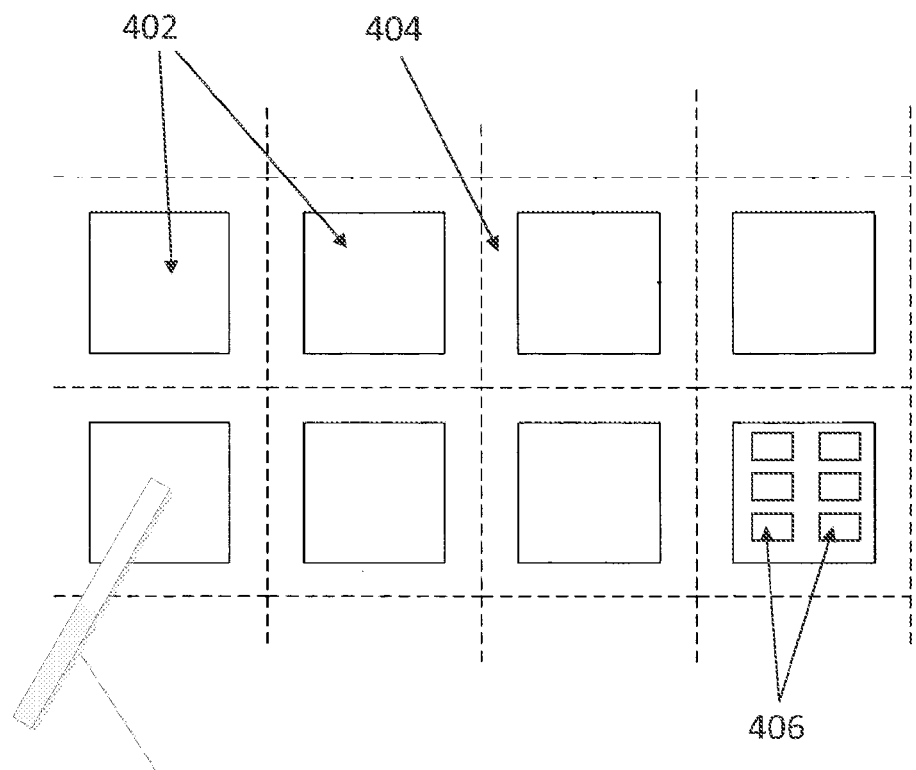
FIGS. 4A and 4B illustrate example two-dimensional arrays, according to principles of the present disclosure.
Figure 4B:
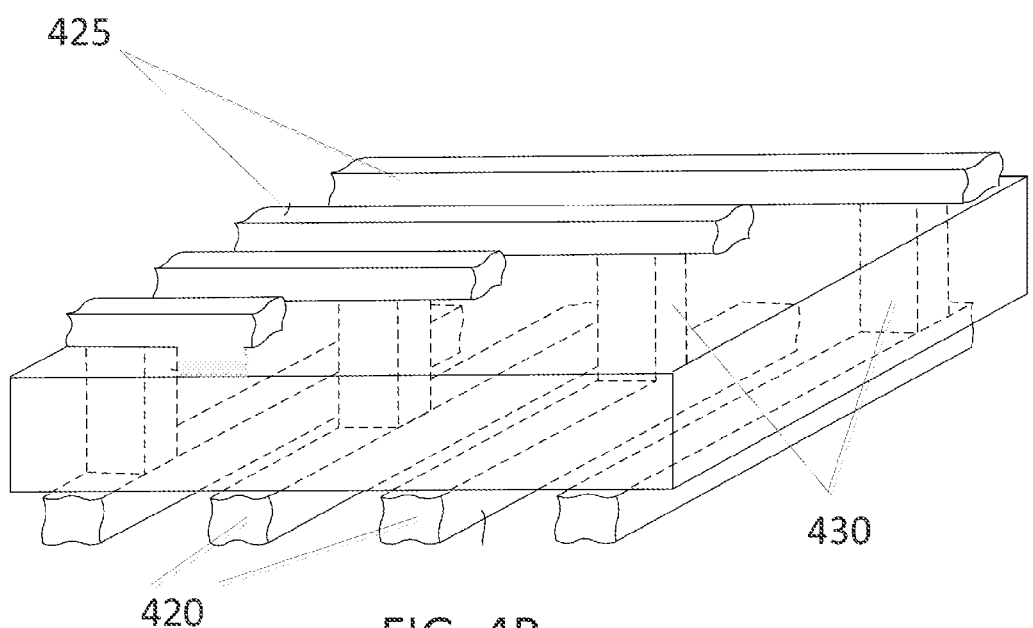
Figure 5:
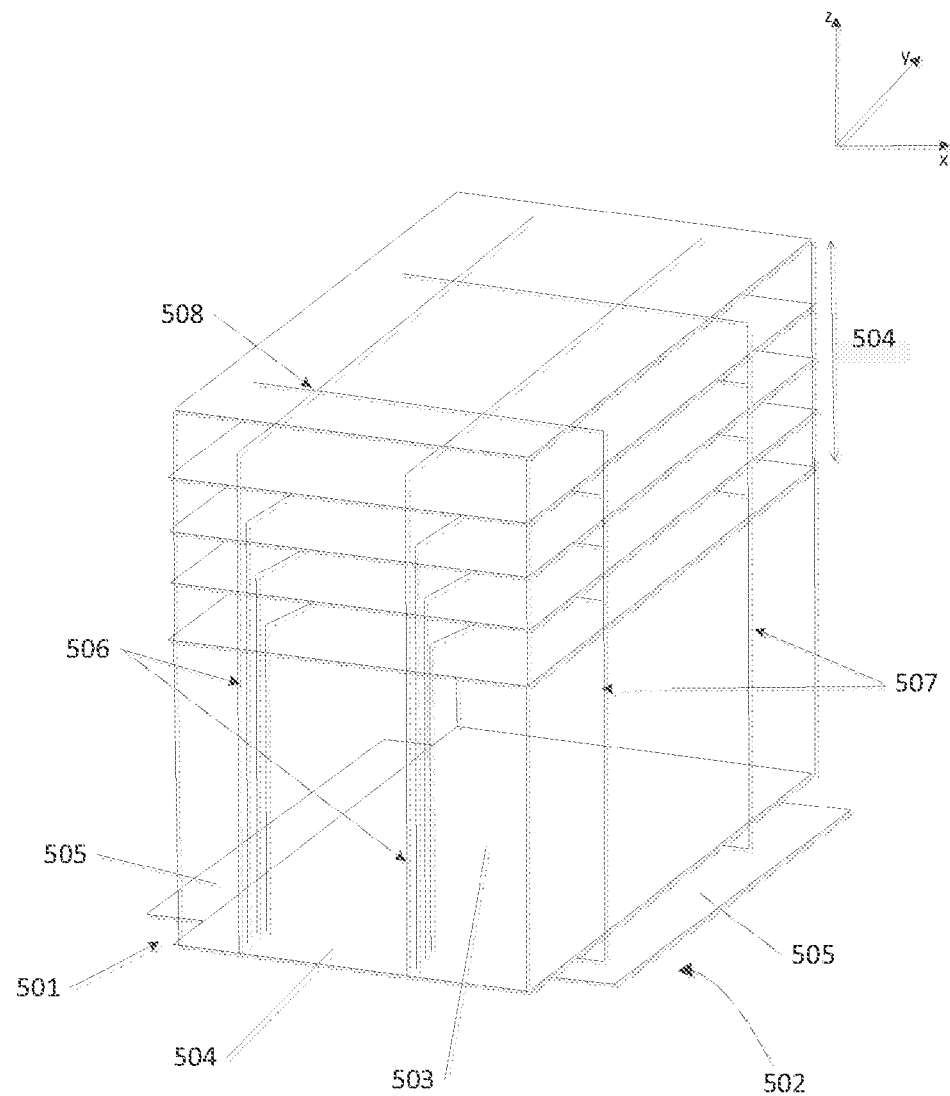
FIG. 5 illustrates an example three-dimensional, multi-layer array, according to principles of the present disclosure.

An example array of device elements according to the principles herein can be a configured as a two-dimensional array (illustrated in FIGS. 4A and 4B) or a three-dimensional, multi-layer array (illustrated in FIG. 5). Device elements of the 2-D or 3-D array can be separately addressable. The device elements can be configured as any of the example devices or configurations herein, including the example devices of any of FIGS. 2A through 2F, or the device configurations of any of FIGS. 3A through 3C. The example systems and apparatus of FIGS. 4A, 4B, and 5, include components and circuits for "writing" (e.g., setting a device component to a first metastable state or a second metastable state) or "reading" from device elements of the example arrays. The read operations may vary depending on the type of application, and can involve, e.g., detecting magnetic anisotropy of a portion of a device element, sensing the charge of a particular device element, or passing current through the device element.

FIG. 4A shows an example 2-D array of device elements according to the principles herein. The example 2-D array includes a plurality of device elements 402 disposed in separately addressable regions. The example 2-D array can include at least one interstitial region 404 that is devoid of device elements 402. As shown in FIG. 4A, the 2-D array can also include one or more components 406, such as but not limited to at least one processing unit, a power source, power circuitry, one or more sensors (such as but not limited to at least one temperature sensor and/or at least one electromagnetic radiation sensor), at least one wireless communication component, or other integrated circuit (CMOS) components. In some examples, the power source can be a wireless power source. FIG. 4A also illustrates a regulating element 410 that can be coupled to the spatial region of a device element. The regulating element 410 can be configured according to any example herein.

FIG. 4B illustrates an example 2-D array of device elements, configured in a cross-bar geometry. The example 2-D crossbar array composed of a lower layer of approximately parallel cross-bar wires 420 that are overlain by an upper layer of approximately parallel cross-bar wires 425. The parallel cross-bar wires of the upper layer 425 can be oriented roughly perpendicular, in orientation, to the parallel cross-bar wires of the lower layer 420. In another example, although the orientation angle between the upper and lower parallel cross-bar wires may vary. The two layers of cross-bar wires form a lattice, or crossbar, in which each cross-bar wires of the upper layer 425 overlies all of the cross-bar wires of the lower layer 420. The device elements 430 are disposed between an upper layer cross-bar wire 425 and a lower layer cross-bar wire 420, formed between the crossing nanowires at the overlap intersection of the two layers of cross-bar wires. Consequently, each cross-bar wire 425 in the upper layer is connected to every cross-bar wire 420 in the lower layer through a device element and vice versa. Each device element 430 is separately addressable through the selection of the respective upper layer cross-bar wire 425 and lower layer cross-bar wire 420. That is, lower cross-bar wires 420 and upper cross-bar wires 425, can be used to uniquely address, including applying voltages to read data and/or to write data (i.e., set to a first metastable state or a second metastable state) to the device elements. Portions of the cross-bar wires 420, 425 between the device elements can also be configured to serve as conductive lines to the device elements, and as portions of the regulating elements.

FIG. 5 shows an example 3-D, multi-layer array of device elements according to the principles herein. The 3-D multi-layer array is configured as a base 502, a multi-layer arrangement of 2-D arrays 504 disposed over the base, and conductive lines 506, 507 leading from the base to provide electrical communication with each layer of the multilayer structure. At least one device element and regulating element are positioned at the intersections 508 in each 2D array on each layer. Conductive lines 506 can be driven independently using the external applied voltage in each layer. The base 502 includes a wiring area 503 (including CMOS circuitry), and contact areas 504 and 505 for the conductive lines. The multi-layer arrangement of 2-D arrays 502 can include any number of layers (i.e., greater or fewer than four layers). The base 502 includes circuitry and other components for providing instructions for writing (e.g., setting a device component to a first metastable state or a second metastable state) or reading from the 2-D arrays 504 with outside sources. The read operations may vary depending on the types of device, and can involve, e.g., sensing the charge of a particular device element, passing current through the device element, detect magnetic anisotropy. For example, an external voltage can be applied to respective device element(s) using conductive lines 506 and 507. In some examples, wiring area 503 can include a column control circuit including a column switch and/or a row control circuit including a row decoder. The base can be integrated with (CMOS)

circuitry for selectively address device elements, providing input/output functions, buffering, logic, or other functionality. For example, the CMOS circuitry can be configured to selectively address, including applying the potential to, the targeted device element(s). The CMOS circuitry can be used to effect the applying the read and write voltages to the conductive lines as described herein.

In the example of FIG. 5, conductive lines 507 are illustrated as being coupled in common in the layers. In other examples, conductive lines 507 may be driven independently in two or more layer using the external applied voltage. The CMOS circuitry can be configured to selectively address (including applying external voltages to) ones of the device elements (the targeted device elements) using the conductive lines 506, 507.

In any example system, method, apparatus or device according to the principles herein, at least one of a conductive contact or a gate electrode can be formed as a mask. For example, a shadowed mask can be used as electrodes for providing electrical contact to the example device.

Example methods are also provided for tuning the functional properties of an example device. An example method includes (i) irradiating a portion of the example device using electromagnetic radiation, and/or (ii) change the temperature of the portion of the device. The example method includes applying a potential difference in a direction across the dielectric material layer and the electrically conductive material layer for a duration of time sufficient to cause a change in the proportionate amount of the at least one ionic species in a portion of the electrically conductive material layer proximate to the interface. As described herein, this causes a type of property change of the device. The type of property change can be at least one of: magnetic anisotropy property, a magnetic permeability property, a saturation magnetization property, an optical property, a magneto-optical property, an electrical property, a mechanical property, and a thermal property of a portion of the device. As described herein, the example device retains the type of property change after discontinuance of the irradiating, and/or the temperature change, of the device.

In various examples, the duration of time for applying the potential difference can be about 1.0 nanosecond, about 10 nanoseconds, about 20 nanoseconds, about 50 nanoseconds, about 100 nanoseconds, about 1 microsecond, about 500 microseconds, about 1 millisecond, about 100 milliseconds, about 500 milliseconds, about second, about 5 seconds, about 10 seconds, about 30 seconds, about 60 seconds, about 3 minutes, about 5 minutes, about 10 minutes, about 30 minutes, about 60 minutes, or longer (including substantially longer periods of time).

In various examples, changing the temperature can include heating the portion of the device to a temperature above a threshold temperature value. The threshold temperature value can be about 22° C., about 25° C., about 30° C., about 50° C., about 70° C., about 100° C., about 120° C., about 150° C., about 170° C., about 200° C., about 250° C., about 300° C., or about 350° C., or higher.

In various examples, the magnitude of the potential difference can be 50 millivolts or less, about 0.1 V, about 0.3 V, about 0.5 V, about 0.7 V, about 1V, about 2 V, about 3V, about 5 V, about 7 V, about 10V, or greater.

According to the principles herein, example methods are also provided for controlling materials properties of a multilayer device design. In a non-limiting example, the device design can include three layers and the device can function as a two terminal device. The main part of the multilayer structure can be made of the bilayer of the target material layer (the electrically conductive material layer) whose properties are to be electrically regulated, and a functional material layer (dielectric material layer) that includes the mobile ionic species, i.e., the ionic species that can move between the functional material and the target material in an electric field (from the applied potential difference. The dielectric layer acts as an electrical insulator to block the flow of electrons across the interface between the electrically conductive material layer (target material layer) and the dielectric material layer (functional material layer). The layer of target material is typically thin such that its properties are strongly influenced by the chemical composition of its interface with the functional material layer. In an example device configuration, a conductive contact layer can be disposed in electrical communication with the target layer (layer 232) on the side opposite interface (labeled 36) and a conductive contact layer (layer 238) can be disposed in electrical communication with the functional layer (layer 234). The conductive contact layers are configured to act as the two terminals in this example device configuration. Example implementations herein provide a device having a layer structure for the device. The example devices may also include one or more layers, in addition to those discussed herein) to optimize parameters such as, but not limited to, performance and functionality.

In an example implementation, a sufficiently high voltage is applied between the two terminals of the multilayer structure. The resulting electric field acts to move the mobile ionic species in the functional layer towards (or away) from the interface with the target material (depending on the direction of the electric field). The direction of ionic motion is determined by the charge of the ionic species and the polarity of the applied voltage. Since the properties of the target material strongly depend on the chemical composition and defect structure at the interface with the functional layer, accumulation or depletion of the mobile ionic species at this interface can significantly modify the properties of the target material layer. Also, motion of the mobile ionic species into a portion of the target layer, beyond the immediate interface region, facilitates the modification of the chemical composition and defect structure of parts of the target material layer. This allows access to additional material properties that might not be directly sensitive to the interface. In an example implementation of a multilayer device structure, the target layer could be a non-noble metal and the functional material could be a metal-oxide with high oxygen ion mobility.

In a non-limiting example implementation, the example device includes an electrically conductive material layer forming an interface with a dielectric material layer, to provide a metal/metal-oxide bilayer. Such example devices can be of great commercial and technological interest, since they can be used widely in industries such as the microelectronics and the chemical industry. According to example systems, methods, and apparatus herein, regulation of ionic species at the interface of metal/metal-oxide bilayers in such example device can be caused to regulate functional properties as varied as catalytic activity, charge and spin transport, ionic exchange, mechanical behavior, thermal conductivity and magnetism. These properties depend sensitively on the oxygen stoichiometry and defect structure at the metal/metal-oxide interface. Voltage application between the two terminals of the example device structure facilitates regulation of the oxygen stoichiometry at the metal/metal-oxide interface, thereby providing control over a wide variety of material properties and device functional properties.

According to the principles herein, an example device can be operated at temperatures above room temperature to speed up the motion of the mobile ionic species and increase the speed at which the properties of the target material can be regulated electrically (using the applied voltage). The higher ionic mobility at elevated temperature also facilitates reduction of the voltage applied to the two terminals of the example device. The temperature range in which the example device is operated can be chosen such that the elevated temperature alone does not result in permanent modifications of the material properties of the electrically conductive material layer. The applied voltage provides directionality to the ionic motion (through its polarity), and the elevated temperature supplies thermal energy to the system to activate the motion of the mobile ionic species of the dielectric material layer.

Example systems, methods, and apparatus according to the principles herein also provide several ways to spatially control the extent of the change to the properties of the target layer, thereby controlling the functional properties of the example device. In an example, the spatial extent of one or more of the electrical contact terminals of the example device is patterned in a configuration that provides spatial control over the extent of application of the applied voltage. The electric field from the applied voltage can be caused to act on the portion of the dielectric material layer within the extent of the electrical contact terminal to drive the mobile ionic species into or out of the target layer. In other examples, the change to the properties of the target layer can be regulated through local control of the voltage and/or temperature of the example device. In a first example, the example device can include means to apply a voltage globally across two conductive contacts (terminals) of the device, and means to regulate the temperature at local spatial regions of the example device. As a non-limiting example, a focused laser beam can be used to supply the thermal energy at local spatial regions of the example device to activate motion of the mobile ionic species in the dielectric material layer. In a first example, the example device can include means to heat substantially the entire example device and meant to apply a voltage at local spatial regions of the example device. As a non-limiting example, the voltage can be supplied using a conductive tip in close proximity to the dielectric material layer (such as but not limited to a tip from a scanning probe microscope). Any combination of local temperature regulation (such as heating) and local voltage application could be used to control the device functional properties, according to the principles herein. In another example, the properties of the target layer can be regulated using electromagnetic irradiation. For example, optical exposure with optical stimulation using electromagnetic radiation can be used to cause changes in the optical functional properties of a device (such as, but not limited to, light transmission characteristics for responsive window tinting or outdoor displays). The optical exposure can be applied to local spatial regions of the example device, or to larger areas of or substantially the entire device. The voltage can be applied to the example device while local spatial regions are irradiated with electromagnetic radiation. In another example, local optical exposure can be coupled with temperature regulation to cause changes in the optical functional properties. For example, the larger areas of or substantially the entire device can be heated to activate the mobile ionic species, and optical exposure can be made to local spatial regions of the example device. The voltage can be applied to the example device while local spatial regions are irradiated with electromagnetic radiation and/or subjected to temperature regulation.

Example systems, methods and apparatus are also provided to electrically control the properties of a thin layer of target material with high spatial resolution. As example apparatus can be implemented to create complex patterns of variations of material properties across a spatially extended area of the example device, thereby generating a device having complex functional properties. The example apparatus can include one or more regulating elements that can be configured to scan across the example device and locally to perform at least one of applying a voltage, regulating temperature, or irradiating using electromagnetic radiation. Thus, the one or more regulating elements can be operated similarly to a "write head" to spatially program the desired materials properties (i.e., introduce the desired metastable state in different spatially distinct regions of the example device). In an example, the spatial resolution of such an example apparatus could be determined by the minimum area at which voltage and/or thermal energy and/or electromagnetic irradiation is supplied to the example device structure using the at least one regulating element. In an example implementation, the apparatus can be configured such that the at least one regulating element scans across the different spatial regions of the example device, to program the desired pattern of variations of metastable state into distinct different spatial regions of the example device. In another example, the apparatus can be configured such that the example device is moved (displaced) relative to a substantially stationary (or limited displacement range) regulating element(s), to program the desired pattern of variations of metastable state into distinct different spatial regions of the example device. In example apparatus where both the at least one regulating element and the example device are configured for displacement, the at least one regulating element could be configured to scan only in one or more directions while the example device is driven (displaced) in a different direction. For example, the at least one regulating element and the example device could be moved in different, perpendicular directions. In these example apparatus, the at least one regulating elements function similarly to the "write head" of a property printer.

Example systems, methods and apparatus herein provided for control of the displacement of the one or more regulating elements and/or the example device using manual control, or control by a control device including at least one processing unit.

Non-limiting examples of control devices include a computing device (such as, but not limited to, a computer, a laptop, a notebook), a smartphone (such as, but not limited to, an IPHONE® (Apple Inc., Cupertino, Calif.), a BlackBerry® (Blackberry Limited, Waterloo, Ontario, Canada), or an Android™-based smartphone), a tablet, a slate, an electronic-reader (e-reader), a digital assistant, or other electronic reader or hand-held, portable, or wearable computing device, or any other equivalent device, or a game system (such as but not limited to an XBOX® (Microsoft, Redmond, Wash.), a Wii® (Nintendo of America Inc., Redmond, Wash.), or a PLAYSTATION® (Sony Computer Entertainment America Inc., San Diego, Calif.)).

Example systems, methods and apparatus provide a graphical user interface configured to allow a user to use property design files, translated into a tool path for controlling the patterning of the metastable states to the example device (like the write head of a property printer). For example, the property design files can be digital files. An example digital property design files can include processor-executable instructions, to be executed by a processing unit, to cause an example apparatus to effect a displacement of the one or more regulating elements and/or the example device, to program the desired pattern of variations of metastable state into the different spatial regions of the example device. An example property design files can include processor-executable instructions, to be executed by a processing unit, to cause an example apparatus to effect the actuation of the one or more regulating elements relative to one or more distinct spatial regions of the example device, to program the desired pattern of variations of metastable state into the different spatial regions of the example device. Execution of the processor-executable instructions of the example property design file would cause the desired positioning of the at least one regulating element and also determine the local dose of one or more of the voltage, thermal energy, and electromagnetic irradiation, to generate the desired pattern of metastable states.

An example property design file can include a two-dimensional (2-D) map of the desired pattern of metastable states for the desired target material properties (and hence device functional properties). This example property design file can include processor-executable instructions, to be executed by a processing unit, to cause an example apparatus to effect a displacement of the one or more regulating elements and/or the example device, to transfer the desired pattern of metastable states to the target material layer. An example graphical user interface can be configured to allow a user to use the 2-D map of the property design files, translated into a tool path for controlling the patterning of the metastable states to the example device (like the write head of a property printer). Execution of the processor-executable instructions of the example property design file would cause the desired positioning of the at least one regulating element and also determine the local dose of one or more of the voltage, thermal energy, and electromagnetic irradiation, to generate the desired pattern of metastable states.

Non-limiting examples of processor-executable instructions include software and firmware.

Example systems, methods and apparatus herein provided for use of a reusable mask, or single use mask, that can be coupled to a portion of a surface of the example device, to selectively couple the one or more regulating elements relative to one or more distinct spatial regions of the example device. For example, an apparatus could be configured such that only exposed parts of the example device area can be subjected to at least one of a voltage, thermal energy, and electromagnet irradiation. Such an example apparatus could allow provide faster throughput at reduced cost. As a non-limiting example, an apparatus could be configured such that a voltage could be applied globally across portions of the example device, and use a high-power lamp (such as but not limited to an infrared lamp) with an opaque mask that to expose selected parts of the example device to electromagnetic radiation. The heat from the electromagnetic radiation can cause local heating of the dielectric material layer, activate the mobile ionic species and to generate the desired metastable state (as described herein), i.e., modify the materials properties only in those exposed areas.

Example systems, methods and apparatus herein provided a platform that provides a pathway to electrically gate a wide variety of key materials in electronics devices. The ability to electrically gate these materials (i.e., using voltage as a parameter to tune metastable properties) facilitates the programming of the patterns of materials properties in the electronic devices, according to the principles of any example system, method and apparatus herein. The example platforms described herein can be used to provide a wide variety of completely new and previously unimaginable electronic devices and applications. Non-limiting examples of envisioned applications of the example systems, methods and apparatus herein include electrically-controllable catalysts for the chemical industry, voltage-controlled optical switches for the optical communications industry, voltage-controlled low power magnetic memories for the microelectronics industry, voltage-tunable magnetic sensors, and voltage-controlled lateral conductive devices. According to the principles of the example systems, methods and apparatus herein, the capability to pattern material properties over large areas and with high spatial resolution can be exploited to produce low-cost sensors, electronic devices, and lab-on-a-chip systems that might otherwise require many complex and expensive fabrication steps to pattern materials into the desired spatial configuration. Since the material properties changes achievable using the example systems, methods and apparatus occur in response to application of the regulating tools of voltage, temperature regulation, or optical stimulation, or some combination of these regulating tools, environmentally-responsive materials can be designed and developed using these techniques.

Example systems, methods and apparatus are provided for tuning the functional properties of an example device based on use of a spacer layer. In this example, the device includes a dielectric material layer disposed in an x-y plane, a spacer layer disposed over and forming a first interface with the dielectric material layer, and a target layer disposed over and forming a second interface with the spacer layer. The layer structure of such an example device could be described relative to the layer structure of and of FIGS. 2C through 2F. Relative to FIG. 2C or 2E, the electrically conductive material layers could be formed as a bilayer of a target layer and a spacer layer. Relative to FIG. 2D of 2F, the electrically conductive material layers could be formed as a bilayer of a target layer and a spacer layer. The target layer and/or the spacer layer can be configured to reversibly uptake an amount of at least one ionic species that migrates from the dielectric material. The spacer layer can be formed from a transition metal, a rare earth metal, a noble metal, or any combination thereof. The interaction between the target layer and the spacer layer can create hybrid species at the interface that affect the interfacial properties of the target layer. The hybrid states can affect the device functional properties, for example, by modifying the initial state of the interfacial properties of the target layer. For example, the spacer layer can affect ionic transport to the target layer, and can also changes interface properties (to derive a different baseline of properties). This provides additional capabilities for tuning the functional properties of the example device, since the offset of the initial state of a device can cause the device to function in differing functional regimes. The regulating elements can be used to apply a potential difference and/or irradiate and/or regulate the temperature of the spatial region of the device, for a duration of time sufficient to modify a proportionate amount of the at least one ionic species in a portion of the target layer, thereby causing a change of the functional property of the device.

In an example device, the spacer layer is configured through selection of the type of metal material(s) used, the thickness of the spacer layer (in the z-direction), and the conformation of the layer (i.e., the spacer layer being formed as a discontinuous layer, or a continuous layer). In different examples, the spacer layer can have thicknesses ranging from about 0.2 nm, about 0.3 nm, about 0.5 nm, about 0.8 nm, about 1 nm, about 1.3 nm, about 1.5 nm, about 1.8 nm, about 2 nm, about 3 nm or thicker.

For example, an amount of a spacer at the interface between the dielectric material and a ferromagnetic target layer can be used to modify the magnetic properties of the example device. The type and thickness of the spacer can be tuned to change the starting point at which an apparatus can exert electrical control of the magnetic device properties. While a thin spacer layer facilitates operation of the example device in a first functional range, a thicker spacer layer can facilitates operation of the example device in a second functional range that may or may not overlap with the first functional range.

The spacer layer is made sufficiently thin, or formed as a discontinuous layer, that allows the at least one ionic species to reversibly reach portions of the target layer when a potential difference is applied to the device. In an example, the spacer layer can be made of the same type of material as the cation of the dielectric (e.g., a rare earth metal or a transition metal), or a different type of material (including a transition metal, a rare earth metal, or a noble metal). In an example where the spacer layer is formed from a metal that does not support reversible migration of the ionic species, such as but not limited to copper, silver, or gold, the spacer layer can be formed as a discontinuous or "dusting" layer, causing areas of a target layer to be exposed, to allow the ionic species to reach portion of the target layer.

Example systems, methods and apparatus are provided for tuning the functional properties of an example device based on regulation of optical properties of portions of the example device near the interface between an electrically conductive material layer and a dielectric layer. In an example implementation, the device (or device element) can be an optical plasmonic device. In an example device, the electrically conductive material layer can be formed from a ferromagnetic material (such as but not limited to a 1 nm cobalt thin film), and the dielectric material layer forming an interface can be, but is not limited to, a gadolinium oxide material. The example device includes a layer of a noble metal, such as but not limited to silver gold, platinum, palladium (or any alloy thereof) disposed on the other surface of the ferromagnetic material layer. The noble metal layer facilitates an efficient excitation of plasmonic waves at the noble metal-air interface. The reflectivity spectrum of the example optical plasmonic device can be controlled by the oxidation state of the ferromagnetic material layer proximate to the interface. For example, modification of the oxidation state of the ferromagnetic material layer changes the dipole magnetic field near the noble metal-air interface. The plasmonic waves at the dielectric/ferromagnetic material interface also can likewise be controlled by regulating the oxidation state of the ferromagnetic layer proximate to the interface. For example, the plasmonic and magneto-plasmonic resonances and reflectivity characteristics at the dielectric-metal interface differs between the state corresponding to a completely oxidized ferromagnetic material layer and the state corresponding to a partially metallic ferromagnetic material layer. Typically, the plasmonic resonances in magnetic materials are weak and broad. By contrast, if the ferromagnetic material layer includes a larger proportionate amount of the ionic species (e.g., is completely oxidized), then portions of the ferromagnetic material layer become dielectric, thereby changing the nature of the modified ferromagnetic material layer/noble metal interface. This causes portions of the example device to exhibit the sharper plasmonic resonance and different reflectivity characteristics of the noble metal.

According to the example systems, methods and apparatus herein, the patterning of the metastable state of the ferromagnetic material layer proximate to the interface can be used to control the local reflectivity of different portions of the example optical plasmonic device. The example systems, methods, and apparatus according to principles described herein also apply to this example implementation.

The functional properties of an example optical device can be tuned by using a spacer layer disposed between the target layer and the dielectric material layer. For example, the spacer layer can be configured to tune the surface properties of the underlying target layer, which cause the optical device to exhibit a different set of baseline of properties. Non-limiting example of such a functional property can be a optical modulation, a photonic property, a plasmonic resonance, a reflectivity, or a magneto-optical property of the target layer and/or spacer layer. By controlling the progression of the migration of the ionic species into portions of the target layer and/or the spacer layer according to the principles described herein, the functional property of the device can be tuned. The migration of the ionic species converts portions of the target layer and/or spacer layer from a metal material to a dielectric material, thereby modifying the optical properties. As a result, the optical properties of the device can be tuned reversibly.

For example, the presence of a spacer layer can modify the type of collective plasmonic resonance properties of the bilayer of the target layer and the spacer layer. Where a device without a spacer layer may exhibit a sharper plasmonic resonance, a device with a spacer layer may exhibit a broader plasmonic resonance. Typically, the plasmonic resonances in magnetic materials are weak and broad, while the plasmonic resonance in a noble metal is sharp. An example device can include a bilayer of a ferromagnetic spacer layer and a noble metal target layer. If the spacer layer is completely oxidized, then the spacer layer itself acts as a dielectric material. With substantially complete oxidation of the spacer layer, the interface between the target layer and the spacer layer exhibits sharp plasmonic resonance and different reflectivity characteristics. By controlling the progression of the migration of the ionic species into portions of the target layer and/or the spacer layer according to the principles described herein, the optical property (including plasmonic resonance) of the device can be tuned. For example, the plasmonic resonance property of the example device can be tuned reversibly from a broader plasmonic resonance to a sharper plasmonic resonance based on the proportionate amount of the ionic species that is caused to migrate into portions of the target layer and/or the spacer layer using the systems, methods, and apparatus according to the principles described herein. This is based on the presence of the ionic species converting portions of the target layer and/or spacer layer from a metal material to a dielectric material, thereby modifying the optical properties. As a result, the optical properties of the device can be tuned reversibly.

An example device having a noble metal layer over a transparent dielectric material layer may exhibit a sharper plasmonic resonance. An example device with a spacer layer of a thin transition metal layer between the noble metal layer and the transparent dielectric material layer may exhibit a broader plasmonic resonance. As non-limiting examples, the thin transition metal layer can be a cobalt layer and the noble metal layer can be a gold layer. By controlling the progression of the migration of the ionic species into portions of the thin transition metal spacer layer, the plasmonic resonance can be tuned. The presence of the ionic species converts portions of the transition metal spacer layer from a metal material into a dielectric material, causing the sharper plasmonic resonance of the noble metal layer to re-appear. Since the migration of the ionic species can be controlled reversibly, the example device can be controllably cycled between the differing plasmonic resonance properties.

Example systems, methods and apparatus are provided for tuning the functional properties of an example device based on regulation of magneto-optical properties of portions of the example device near the interface between an electrically conductive material layer and a dielectric layer. In an example device, the electrically conductive material layer can be formed from a bi-layer of a spacer layer including at least one rare earth metal material and a target layer including at least one ferromagnetic transition metal material. Non-limiting examples of applicable rare earth metals include gadolinium, terbium, dysprosium, holmium, or neodymium. Non-limiting examples of applicable rare earth metals include iron, cobalt, and nickel. In an example device, the electrically conductive material layer can be formed from an alloy including at least one rare earth metal material and at least one ferromagnetic transition metal material. The rare-earth/magnetic-transition-metal electrically conductive material alloy or bi-layer can exhibit a significant magneto-optical Kerr effect. The magneto-optical Kerr effect is the change in the polarization and ellipticity of electromagnetic radiation that is reflected from the electrically conductive layer. The rare-earth/transition metal ferromagnet multilayers and alloys exhibit large magneto-optical constants, while transition metal ferromagnetic materials exhibit relatively smaller magneto-optical constants. Therefore, the magneto-optical Kerr rotation and ellipticity of light reflected at the dielectric/metal interface can be substantially different between the device state where the rare earth metal layer includes a large proportionate amount of the ionic species (e.g, the rare earth metal is completely oxidized) compared to the device state where the rare earth metal layer includes a much smaller proportionate amount, or none, of the ionic species (e.g, the rare earth metal remains unoxidized). Thus, the optical functional properties of the example device, such as but not limited to the state of rotation of the polarization of electromagnetic radiation reflected from the example device, can be controlled based on regulating the migration of the ionic species into portions of the target layer and/or spacer layer according to the principles herein. By regulating the migration of the ionic species into portions of the electrically conductive material layer according to the principles herein, the magneto-optical properties of the example device can be changed and regulated. An example device can be configured to implement this magneto-optical effect, to allow for the control of the polarization of light, for use in such applications as optical signal transmission and modulation in photonics. Other non-limiting example implementations of device include optical switching, optical filter applications, on-chip application, electromagnetic radiation polarization rotation, and polarizers. For example, an example device can be used to rotate the polarization of electromagnetic radiation so that the polarization of electromagnetic radiation can, or cannot, get through a polarizer component coupled to the example device, thereby providing an optical switch. A non-limiting example device can include a dielectric layer formed from gadolinium oxide, forming an interface with a gadolinium metal spacer layer, which forms an interface with a cobalt target layer. The spacer layer and/or the target layer can have a thickness in the range of about 0.5 nm, about 1.0 nm, about 1.5 nm, about 2.0 nm, about 2.5 nm, about 3.0 nm, about 3.5 nm, about 4.0 nm, or greater.

Figure 6A:
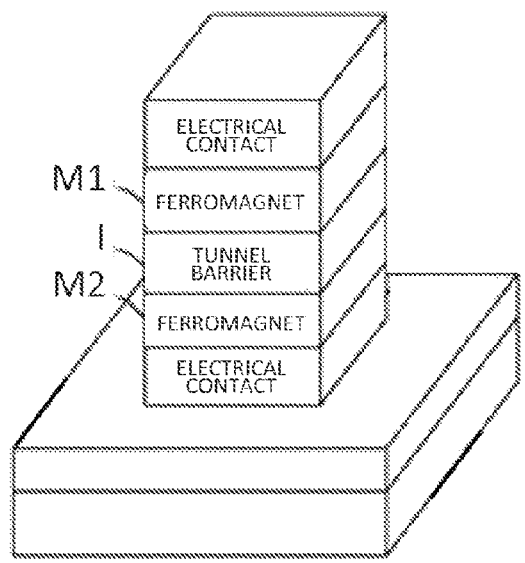
FIG. 6A shows an example of a magnetic tunnel junction, according to principles of the present disclosure.

An example device according to example systems, apparatus and methods herein can be introduced integrated into the structure of existing device structures, to provide additional capabilities for tuning the operation of the device structure. For example, an example device according to the principles herein can be integrated into a memory device such as a magnetic tunnel junction (MTJ). An example of a MTJ is shown in FIG. 6A (see, e.g., U.S. Publication No. 2013/0015542 A1 to Wang et al.). FIG. 6A shows the MTJ stack which includes a ferromagnetic layer (M1), disposed over (or adjacent to) a tunnel barrier layer (I) formed from an ordered, crystalline dielectric (such as magnesium oxide (MgO)), and another ferromagnetic layer (M2). As shown in FIG. 6A, electrical contacts are made to the ferromagnetic layers (M1 and M2). The electrical resistance of this MTJ is different depending on whether the ferromagnetic layers (M1 and M2) are magnetized in substantially the same direction, or in different directions. Changing the direction that one ferromagnetic layer of the MTJ stack is magnetized changes the resistance state of the MTJ. The relative magnetization direction of the two ferromagnetic layers (M1 and M2) serves as the memory state, and the MTJ resistance providing a readout mechanism for the memory state. As is known to those in the art, setting the memory state of a MTJ, i.e., changing the state or "writing" the state, is achieved by switching the magnetization direction of one of the layers (referred to as the "free layer"). This switching can be achieved by applying a magnetic field, or by using electrical current flowing through or nearby the device. The amount of energy required to write the state of the MTJ depends on the magnetic anisotropy of the free layer, so that a more efficient device can be achieved using a lower anisotropy ferromagnetic free layer. However, in order to maintain a stable magnetization orientation in the bit after writing, a large magnetic anisotropy is required.

Figure 6B:
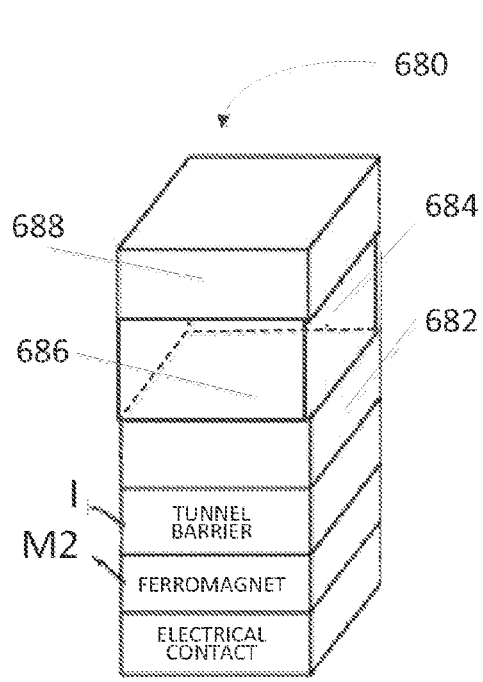
FIGS. 6B and 6C show example modified MTJ-devices, according to principles of the present disclosure.
Figure 6C:
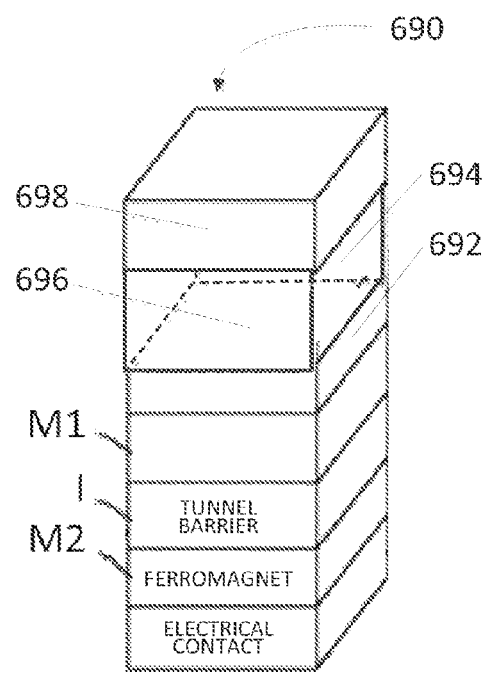

Example modified MTJ-devices according to example systems, apparatus and methods herein can be produced by integrating into the MTJ structure an example device according to the principles herein, to provide additional capabilities for tuning the magnetic anisotropy of the ferromagnetic free layer. FIGS. 6B and 6C show example modified MTJ-devices according to the principles herein. In the example of FIG. 6B, the modified MTJ-device 680 includes a target layer 682 of a ferromagnetic material forming an interface 686 with a dielectric material layer 684, and a gate electrode layer 688 in electrical communication with the dielectric material layer 684. In this example, the target layer 682 is part of the MTJ stack, and forms the MTJ structure with the tunnel barrier layer and the ferromagnetic layer M2. Regulation of the migration of the ionic species into the target layer can directly affect the functioning of the MTJ stack. In the example of FIG. 6C, the example modified MTJ-device 690 includes a target layer 692 of a ferromagnetic material forming an interface 696 with a dielectric material layer 694, and a gate electrode layer 698 in electrical communication with the dielectric material layer 694. The target layer 682 is coupled to the ferromagnetic layer M1 of the MTJ stack (formed from ferromagnetic layer M1, the tunnel barrier layer, and ferromagnetic layer M2). In this example, the target layer 682 functions as a spacer layer to the ferromagnetic layer M1 of the MTJ stack. Regulation of the migration of the ionic species into the target layer affects the functioning of the MTJ stack through the coupling of the target layer to the ferromagnetic layer M1. In the example modified MTJ-devices of both FIGS. 6B and 6C, the migration of the at least one ionic species from the dielectric material layer to the target layer can be used to tune the functioning of the MTJ stack. The modification of the proportionate amount of the at least one ionic species in portions of the target layer proximate to the interface causes a change in the magnetic anisotropy of the target layer. In these non-limiting examples, by reducing the magnetic anisotropy in the MTJ free layer, the writing process of the device becomes more efficient. By subsequently increasing the magnetic anisotropy in the MTJ free layer, the data retention characteristics of the example modified MTJ-devices are improved. An example device herein integrated into a modified-MTJ also facilitates programming of a memory device, by using the MTJ for readout-detection. Therefore, this example describes how the target layer of the example devices herein can be coupled to and integrated with other device structures, facilitating enhanced controls of the behavior or function of the device structure.

Following is a description of non-limiting example implementations of the systems, methods and apparatus described herein for regulation of magnetic anisotropy of portions of example devices that include an electrically conductive ferromagnetic material layer forming an interface with a dielectric material layer. While the examples below are directed to devices including cobalt as the ferromagnetic material layer and gadolinium oxide at the dielectric material layer, they are applicable to other examples according to the principles described herein.

In metal/oxide heterostructures, rich chemical, electronic, magnetic and mechanical properties can emerge from interfacial chemistry and structure. The possibility to dynamically control interface characteristics with an electric field paves the way towards voltage control of these properties in solid-state devices. According to the principles herein, electrical switching of the interfacial oxidation state is exploited to provide for voltage control of magnetic properties that has been difficult to achieve through conventional magneto-electric coupling mechanisms. It is observed herein that in situ voltage-driven $O^{2-}$ migration in a Co/metal-oxide bilayer can be used to toggle the interfacial magnetic anisotropy energy (MAE) by greater than about 0.75 erg cm$^{-2}$ at an applied voltage of about 2.0 V. The thermally activated nature of ion migration can be exploited as described herein to markedly increase the switching efficiency and to demonstrate reversible patterning of magnetic properties through local activation of ionic migration. The results of the example measurements herein demonstrate a path towards voltage-programmable materials based on solid-state switching of interface oxygen chemistry.

The physical and chemical properties of nanoscale materials derive largely from structure and composition at interfaces. The capability to electrically modify these interfacial characteristics as described herein provides a powerful means to control material properties. For non-limiting example devices that include metal/metal-oxide bilayers, properties as varied as catalytic activity, charge and spin transport, ionic exchange, mechanical behavior, thermal conductivity and magnetism all depend sensitively on oxygen stoichiometry and defect structure at the metal/metal-oxide interface. Using the example systems, methods, and apparatus herein, ionic transport in metal oxides can be driven by an electric field, and $O^{2-}$ migration can be exploited as a mechanism for the broader application of voltage-driven oxygen transport to control interfacial phenomena in metal/metal-oxide structures.

For example, ferromagnetic metal/metal-oxide bilayers such as Co/AlOx and CoFe/MgO exhibit strong perpendicular magnetic anisotropy (PMA) derived from interfacial Co—O hybridization. The ability to toggle interfacial PMA with a gate voltage can reduce the switching energies in spintronic devices (such as but not limited to magnetic tunnel junctions), and facilitates new device architectures that exploit local gating of magnetic properties. Most work on voltage control of magnetic anisotropy in metal/metal-oxide bilayers has focused on charge accumulation or band shifting in the metal layer.

Direct in-situ observation are made of voltage-driven $O^{2-}$ migration in a metal/metal oxide bilayer. The measurement results show that solid-state electro-chemical switching of the interfacial oxidation state can be used to remove and restore PMA in a thin film Co layer. Using cross-sectional transmission electron microscopy (TEM) and high-resolution electron energy loss spectroscopy (EELS), in-situ voltage-driven migration of the oxidation front in a Co/GdOx bilayer is measured. By varying temperature and interface structure, motion of the oxidation front is correlated to voltage-induced anisotropy changes. It is demonstrated that, by minimizing the $O^{2-}$ diffusion barrier, the timescale for magneto-ionic switching can be reduced by 6 orders of magnitude. In an example, increasing the temperature by about 100° C. above ambient reduces the timescale of these effects by about 4 orders of magnitude.

Interfacial PMA is toggled by an unprecedented amount of greater than about 0.6 erg/cm$^2$ at a voltage of about 4V, and achieve a magneto-electric efficiency greater than about 5,000 fJV$^{-1}$ m$^{-1}$. Finally, a general method to reversibly imprint material properties through local activation of ionic migration is described that can be used to locally pattern magnetic anisotropy and create domain wall (DW) conduits in continuous magnetic films. These results establish magneto-ionic coupling as a powerful mechanism for voltage control of magnetism.

Figure 15:
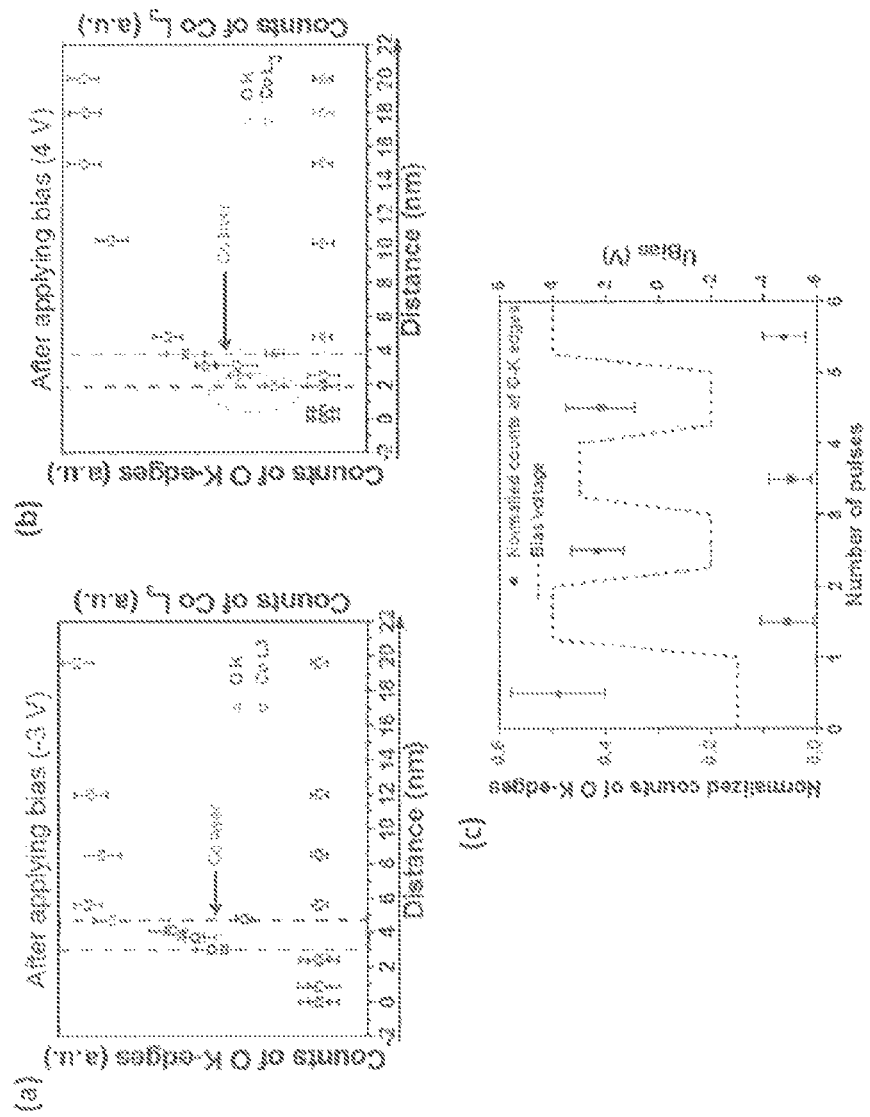
FIGS. 15A-15C show example plots of data from subsequent STEM-EELS measurements, according to principles of the present disclosure.

Measurements are reported for an example device formed as Ta(4 nm)/Pt(3 nm)/Co(0.9 nm)/GdOx(3 nm) films sputter-deposited on thermally-oxidized Si. The films exhibit strong PMA, with an in-plane saturation field Hk~10 k Oe (FIGS. 15A-15C). Square 200 μm×200 μm GdOx(30 nm)/Ta (2 nm)/Au (12 nm) gate electrodes are patterned on top of the film for voltage application, with the bottom metal stack used as a counter electrode.

Figure 7A:
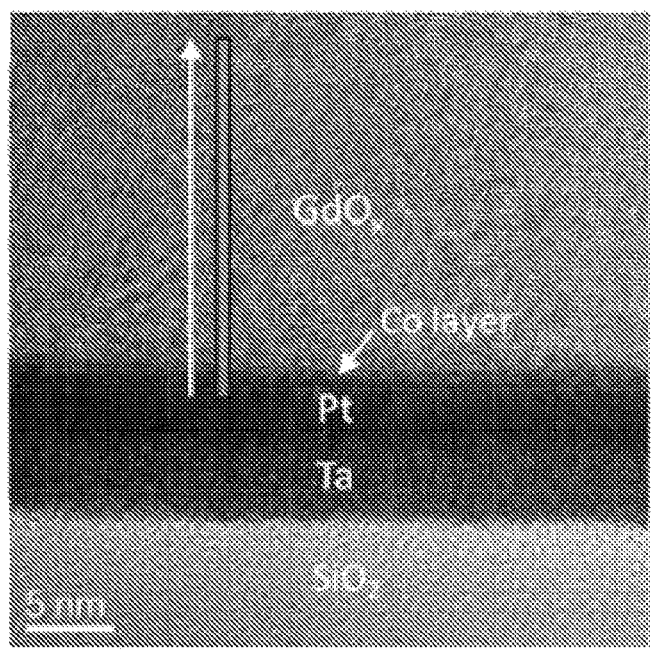
FIGS. 7A-7G show example cross-sectional TEM and EELS analysis results, according to principles of the present disclosure.
Figure 7B:
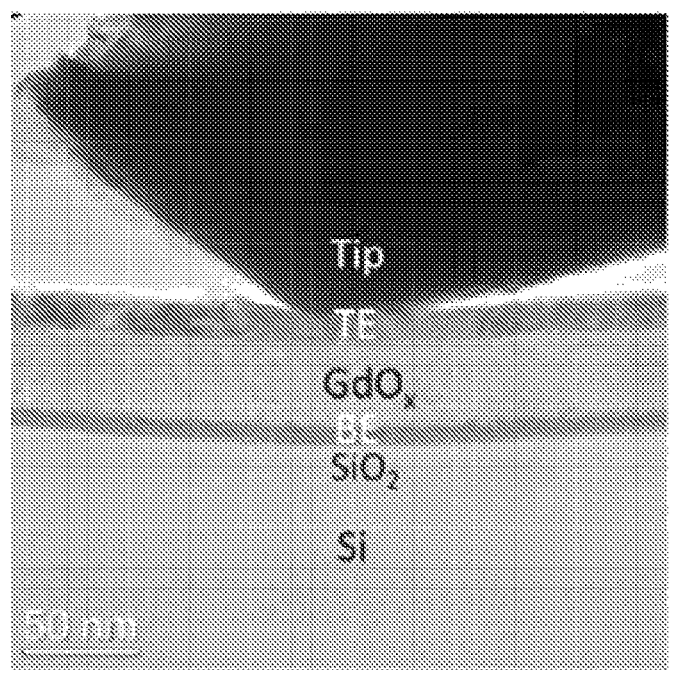
Figure 7C:
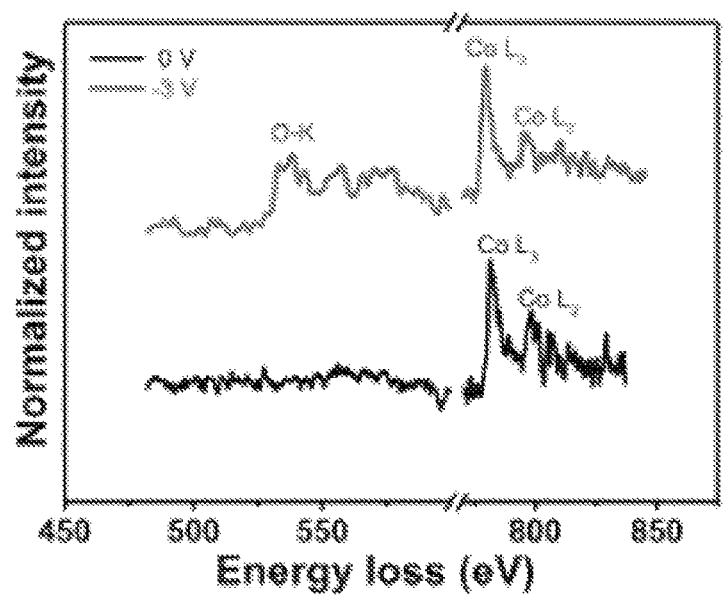
Figure 7D:
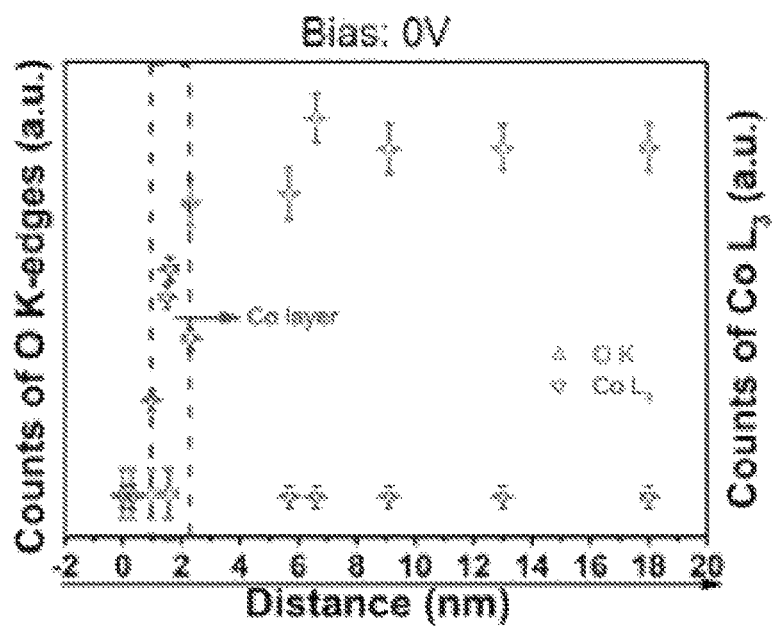
Figure 7E:
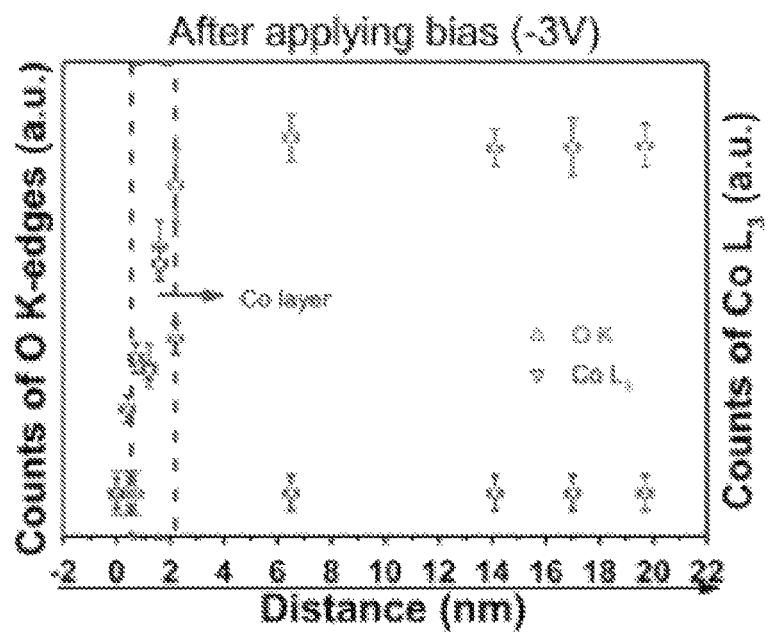
Figure 7F:
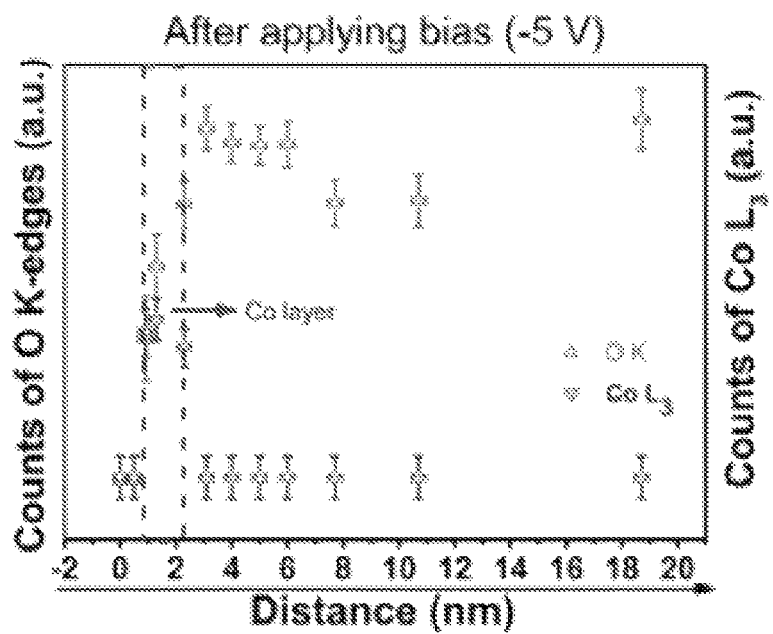
Figure 7G:
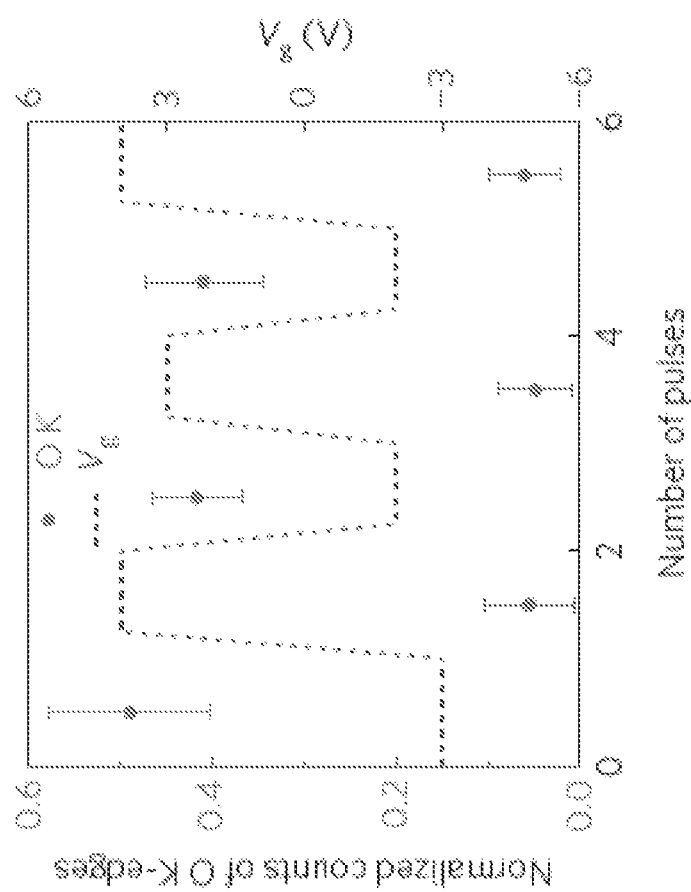

FIGS. 7A-7G show example cross-sectional TEM and EELS analysis results. FIG. 7A shows an example high-resolution TEM image of the SiO2/Ta/Pt/Co/GdOx layer structure. STEM-EELS spectra are measured along the green line, starting from the Pt/Co interface as indicated by the white arrow. FIG. 7B shows an example of the contact between the Pt/Ir probe of the in situ TEM holder and the Ta/Au top electrode (TE). The Ta/Pt/Co bottom electrode is indicated by BE. FIG. 7C shows example STEM-EELS spectra of the O K-edges and the Co L2,3-edges from a location in the center of the Co layer before (black) and after (red) applying a negative bias of −3V. FIGS. 7D-7F show example O K-edge and Co L3-edge count rates along a similar line profile as indicated in FIG. 7A. The data are obtained before the application of a bias voltage (FIG. 7D), after applying −5V (FIG. 7E), and after first applying −3V to drive O towards the Co/Pt interface, and then applying +4V to drive O back away from the Co layer (FIG. 7F). FIG. 7G shows O K-edge counts in the middle of the Co layer normalized to the O K-edge signal in the GdOx layer following three cycles of alternating positive and negative bias voltage. The error bars in this figure represent the intrinsic EELS measurement noise and uncertainty during background subtraction.

FIG. 7A shows an example high-resolution cross-sectional TEM micrograph of the layer structure, with the thin Co layer embedded between polycrystalline Pt and GdOx layers. Spatially resolved EELS measurements are carried out in scanning TEM (STEM) mode on the same cross section to measure the chemical profile and to detect changes induced by a gate voltage $V_g$. Voltage is applied by contacting the top electrode in situ with a Pt/Ir tip as shown in FIG. 7B. FIG. 7C shows representative STEM-EELS spectra with O K-edges and Co white lines from a location in the center of the Co layer. The evolution of the O K-edge and Co L3-edge count rates along a line profile perpendicular to the layers is shown in FIG. 7D. The Co layer is clearly distinguished, with no O detected within the Co layer and a sharp rise in the O signal at the Co/GdOx interface. FIG. 7C shows the results of STEM-EELS scans performed after applying a negative bias, which drives $O^{2-}$ towards the Co layer. The appearance of an O K-edge signal at the center of the Co layer can be inferred from the spectra in FIG. 7C, taken after applying −3V for ~100 s. After subsequently applying −5V for ~100 s, the STEM-EELS scan in FIG. 7E shows that O penetrates all the way to the bottom Co/Pt interface. FIGS. 7E and 7F demonstrate that Co oxidation is reversible under positive bias. FIG. 7F shows a STEM-EELS scan after first applying a negative bias of −3V until an O signal is detected near the Co/Pt interface, and then applying $V_g$=+4V for ~100 s, which drives oxygen away from the Co layer. FIG. 7G shows that the $O^{2-}$ content in the Co layer can be toggled repeatedly by cycling $V_g$ between alternating bias polarities.

The effect of voltage-induced $O^{2-}$ migration on magnetic properties is analyzed using a scanning magneto-optical Kerr effect (MOKE) polarimeter with a ~3 µm laser spot to locally probe hysteresis characteristics.

Figure 8:
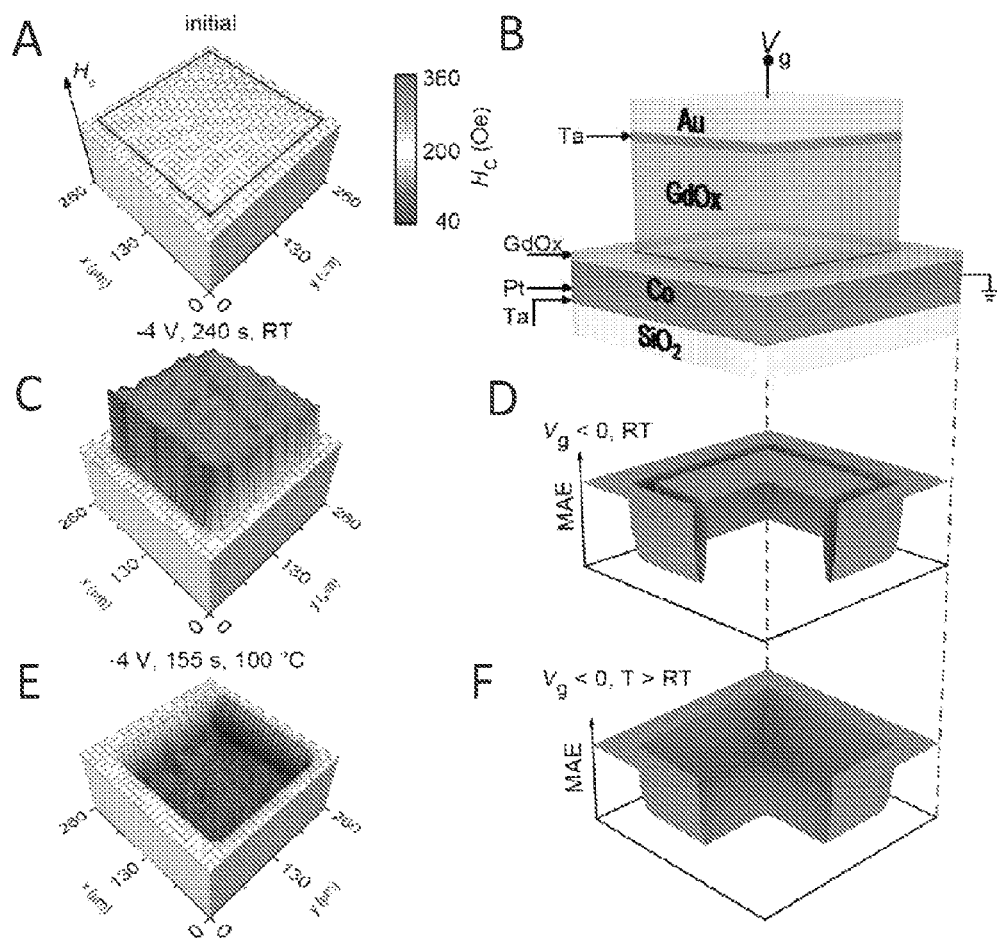
FIGS. 8A-8K show example device schematics and voltage control of magnetic anisotropy, according to principles of the present disclosure.
Figure 8:
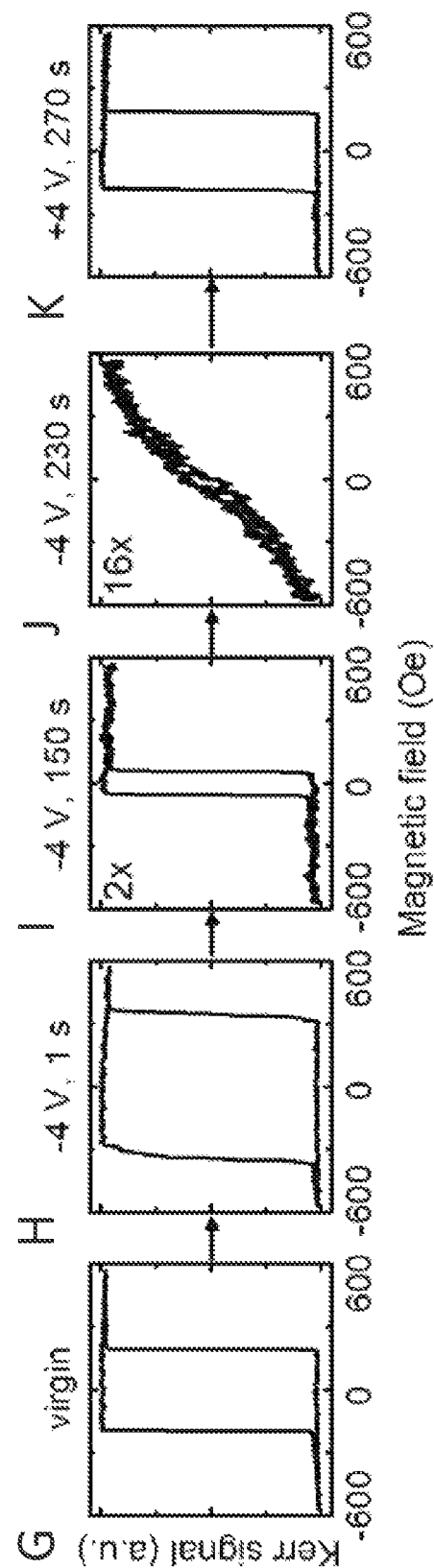

FIGS. 8A-8K show example device schematics and voltage control of magnetic anisotropy. FIG. 8A shows an example topographic map of the coercivity (Hc/in the virgin state, in the vicinity of a gate electrode. FIG. 8B shows an example schematic view of gate-electrode structure. FIGS. 8C-8D show example Hc and the implied MAE landscape, respectively, after applying a gate voltage Vg=−4V for 240 s at room temperature (RT). FIGS. 8E-8F show the same as in FIGS. 8C-8D after applying Vg=−4V for 155 s at 100° C. FIGS. 8G-8K show example polar MOKE hysteresis loops measured at room temperature at the center of the gate electrode showing the device in its virgin state (FIG. 8G), after applying Vg=−4V at 100° C. for 1 s (h), 150 s (FIG. 8I) and 230 s (FIG. 8J), and after applying Vg=+4V at 100° C. for 270 s (FIG. 8K). It is noted that the Kerr signal intensity in FIG. 8I is reduced by a factor of 2 and in FIG. 8J by a factor of 16, as indicated by inset number.

FIG. 8A show maps of the coercivity $H_c$ in the vicinity of a gate electrode, shown schematically in FIG. 8B. Before measurement, a domain nucleation site is created nearby using a mechanical microprobe so that $H_c$ represents the domain wall (DW) propagation field, which is highly sensitive to the magnetic anisotropy energy (MAE) landscape. In the virgin state (FIG. 8A), $H_c$ is uniform across the measured area, reflecting a DW propagation field of ~200 Oe due to fine-scale disorder. After applying $V_g$=−4V for 240 s and then setting $V_g$=0V, $H_c$ exhibits an abrupt step at the electrode edge (FIG. 8C) and increases to ~340 Oe beneath the electrode. Similar behavior has been observed previously and attributed to $O^{2-}$ migration near the electrode perimeter, where ionic transport is typically most efficient. This would locally reduce the MAE energy by over-oxidizing the Co interface, creating potential wells at the electrode edge (FIG. 8D) that trap propagating DWs, increasing $H_c$. It is verified that the DW propagation field at the interior of the electrode remained unchanged after $V_g$ application by mechanically creating a nucleation site inside the electrode. The observed magnetic behavior is thus consistent with the schematic MAE landscape in FIG. 8D.

The lack of irreversible MAE changes at the electrode interior suggests that the timescale for bulk $O^{2-}$ diffusion may be longer than at the electrode perimeter, where the open oxide edge (FIG. 8B) can provide a high-diffusivity path. The high ionic mobility observed in connection with FIGS. 7A-7G is likewise probably aided by the high surface to volume ratio of the polished TEM specimen. The activation energy for surface diffusion is typically lower than for bulk. Voltage-induced $O^{2-}$ migration, however, need not be limited to the oxide edge. Due to the thermally-activated nature of ion migration, voltage application at elevated temperature should result in exponentially higher $O^{2-}$ drift velocities, and activation of bulk $O^{2-}$ migration on an observable timescale.

FIG. 8E shows a $H_c$ map after applying $V_g$=−4V for 155 s at T=100° C., and then cooling the sample back to room temperature at $V_g$=0V. In this case, $H_c$ outside the electrode is unchanged, showing that the elevated temperature alone does not cause irreversible changes to the magnetic properties (see FIG. 16). However, beneath the electrode $H_c$ drops to ~50 Oe, indicating that DWs nucleate and propagate there at a much lower field, and are impeded by an anisotropy step at the electrode edge. This implies a significant MAE reduction across the electrode area, shown schematically in FIG. 8F, consistent with over-oxidation of the Co interface.

As seen in FIGS. 8G-8K, the voltage-induced MAE change at T=100° C. is progressive. Here, gate voltages of $V_g$=−4V are sequentially applied for a fixed dwell time at T=100° C., and then cooled the sample to room temperature with $V_g$=0V to measure a hysteresis loop near the electrode center. An initial increase in $H_c$ is observed due to DW trap formation at the electrode perimeter, which occurs within 1 s of $V_g$ application in contrast to the several minutes required at room temperature (FIG. 8C). With increasing voltage dwell time $H_c$ then drops precipitously, indicating a rapid reduction of PMA across the electrode. The saturation MOKE signal also declines, by nearly a factor of 2 after ~150 s (FIG. 8I), suggesting increasing Co oxidation. After several minutes (FIG. 8J), PMA is lost entirely. Remarkably, PMA can be completely restored by reversing the bias polarity, as seen in FIG. 8K after applying $V_g$=+4V for 270 s at 100° C.

To correlate magnetic anisotropy with the location of the oxidation front, a spacer formed from Gd is used to control the distance between Co and the Gd/GdOx interface. Here, GdOx is grown as a continuous 30 nm-thick layer before depositing Ta/Au electrodes to prevent DW trap formation at the edges.

Figure 9:
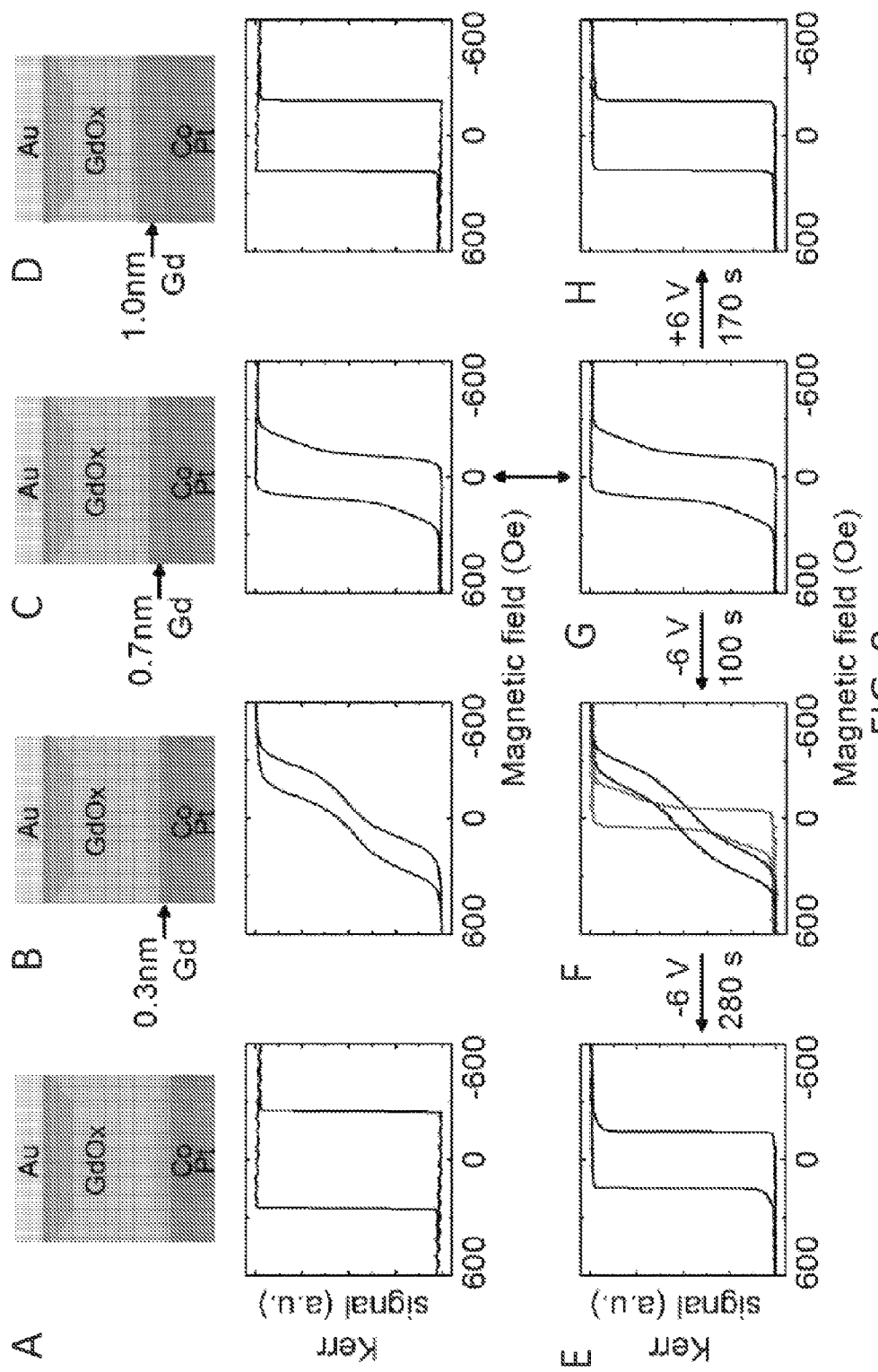
FIGS. 9A-9H show examples of the voltage-induced propagation of an oxidation front, according to principles of the present disclosure.

FIGS. 9A-9H show examples of the voltage-induced propagation of an oxidation front. FIGS. 9A-9D show example schematics of Pt/Co/Gd/GdOx samples with different Gd spacer thicknesses (0 to 1 nm) at the Co/GdOx interface and polar MOKE hysteresis loops corresponding to the as-deposited samples. FIGS. 9E-9H show example evolution of polar MOKE hysteresis loops after application of positive (FIGS. 9E-9F) and negative (FIG. 9H) gate voltage Vg at 100° C. to the sample with 0.7 nm thick Gd spacer layer (FIGS. 9C and 9G). All hysteresis loops are measured at room temperature (RT) and zero bias. The red curve in panel (FIG. 9F) shows a hysteresis loop after first setting the device in a state with minimum remanence ratio using a negative gate voltage, and then applying a 10 ms voltage pulse Vg=+12V at 120° C., returning the device close to its initial state.

Figure 21:
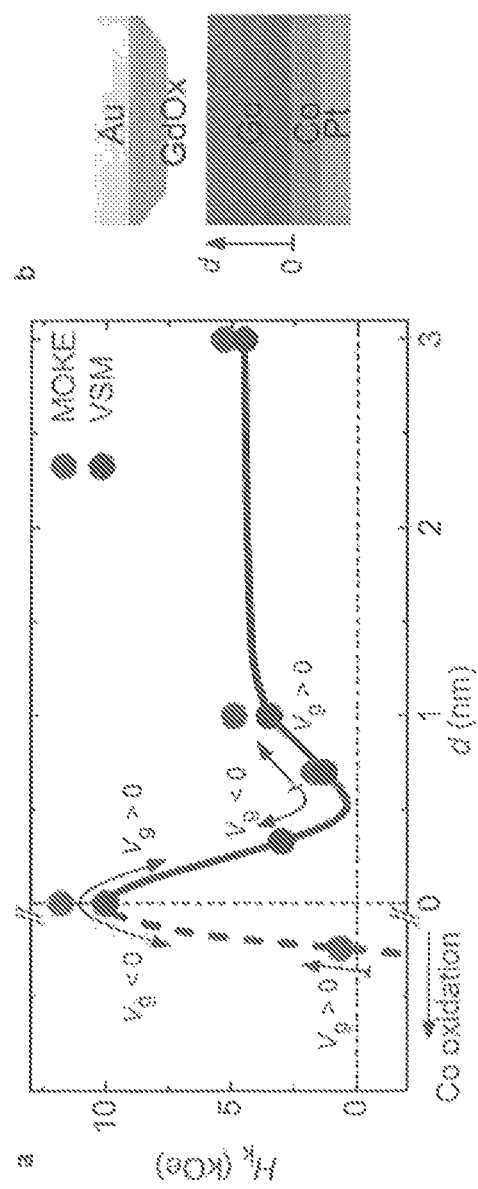
FIGS. 21A-21B show an example anisotropy transition in an example device, according to principles of the present disclosure.

FIGS. 9A-9D show the nominal sample structure and corresponding hysteresis loops for four samples with increasing Gd spacer thickness d. With a thin Gd spacer, PMA is diminished as evidenced by a significant drop in the remanent magnetization ratio $M_r/M_S$ (FIG. 9B), but as d is increased further, PMA again increases (FIGS. 9C-9D and 21). Similar results are obtained for other metal oxides, including Pt/Co/Zr/ZrOx and Pt/Co/Ta/TaOx. An oscillatory dependence of PMA is shown in FIG. 21A-21B. Although the origin of this non-monotonic anisotropy variation is not well understood, it is fortuitous because it allows us to determine sensitively the position and direction of motion of the oxidation front.

Figure 17:
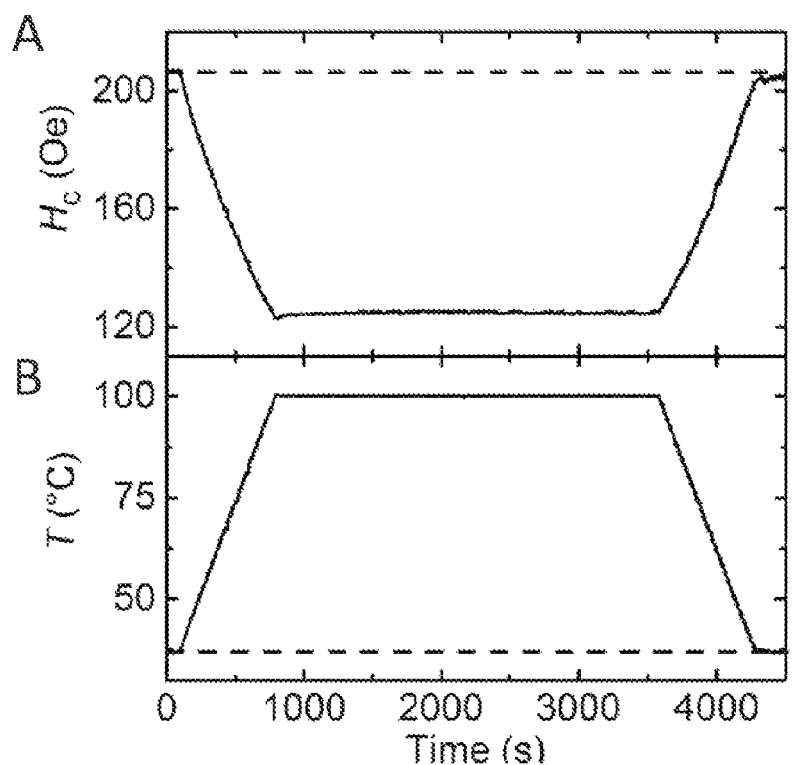
FIG. 17A shows example measurement results of the evolution of the coercivity Hc, measured as a function of time, according to principles of the present disclosure.
FIG. 17B shows example temperature measurements as a function of time, according to principles of the present disclosure.

FIGS. 9E-9H show hysteresis loops after $V_g$ application at 100° C. for the sample shown in FIG. 9C. FIGS. 9E-9H show that a gate voltage ($V_g$) applied to the sample in FIG. 9C can reproduce (FIGS. 9E-9H) the non-monotonic anisotropy transition exhibited by the as-deposited samples (FIG. 9A-9D). With $V_g>0$, PMA gradually increases (FIG. 9H) whereas with $V_g<0$, PMA first decreases (FIG. 9F) then slowly increases with increasing dwell time (FIGS. 9E and 17A-17B). The effect of positive (negative) Vg is thus equivalent to increasing (decreasing) the spacing between Co and the oxidation front. FIG. 9F also shows that by increasing T and $V_g$ to 120° C. and 12 V, respectively, the timescale for anisotropy switching is reduced to less than about 10 ms, compared to ~100 s at 100° C. and 6V, and in contrast to the very long timescales for anisotropy switching required at room temperature.

The results in FIGS. 8A-8K and 9A-9H demonstrate that these pronounced, nonvolatile voltage-induced anisotropy changes occur through a thermally-activated process, consistent with the voltage-induced $O^{2-}$ migration observed in FIGS. 7A-7G. The magnitude of the effect, which yields in FIGS. 8G-8K a voltage-controlled change in interfacial PMA greater than about 0.6 erg/cm$^{-2}$, or about 5000 fJV$^{-1}$ m$^{-1}$, corresponds to the largest magnetoelectric coupling efficiency yet reported. Although the voltage response in FIGS. 8A-8K is rather slow, because the timescale for voltage-driven ion migration exhibits a super-exponential dependence on temperature and electric field, faster magneto-ionic switching can be readily achieved by further increasing T and Vg. FIG. 9F shows that indeed at T=120° C. and Vg=12V, the timescale for anisotropy switching drops to less than about 10 ms, compared with 100 s at 100° C. and Vg=6V, and in contrast to the longer timescales required at room temperature in these devices.

The results in FIGS. 9A-9H also demonstrate an example device that includes a gadolinium spacer layer at a portion of the interface between the dielectric material layer and the target layer. The spacer layer can range from a very thin layer (such as at least a monolayer) of metal atoms, to a thicker layer of metal atoms. The spacer layer can be formed in a range of thicknesses. For example, as shown in FIGS. 9B-D, the spacer layer can have thicknesses in the range of about 0.3 nm, about 0.7 nm, or about 1.0 nm. T the spacer layer can be formed as a continuous layer or as a discontinuous "dusting" layer. This spacer layer can include a different metal than the one used for the target layer. The spacer layer at the interface facilitates tuning the initial state of the interfacial properties of the target layer, which allows for tuning the functional properties of the example device in differing functional regimes. As a result, the introduction of a spacer layer provides additional powerful parameters for tuning the range of functional properties of the example device.

Figure 10A:
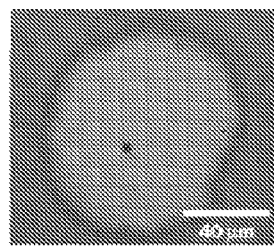
FIGS. 10A-10I show examples of fast anisotropy switching, according to principles of the present disclosure.
Figure 10B:
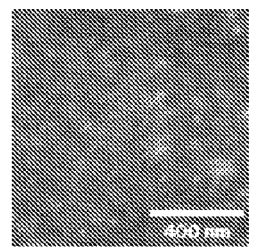
Figure 10C:
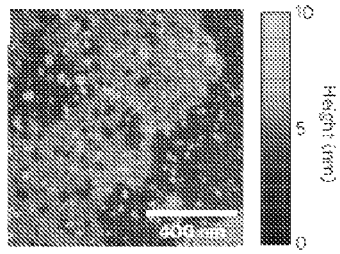
Figure 10D:
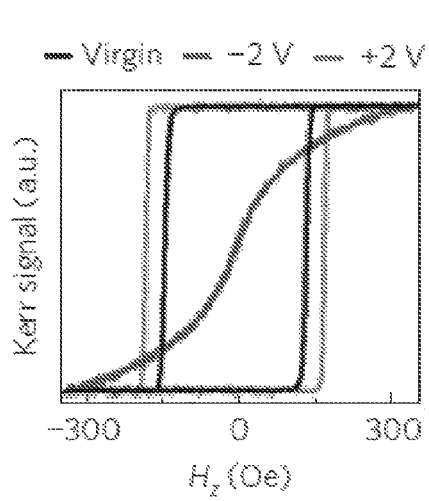
Figure 10E:
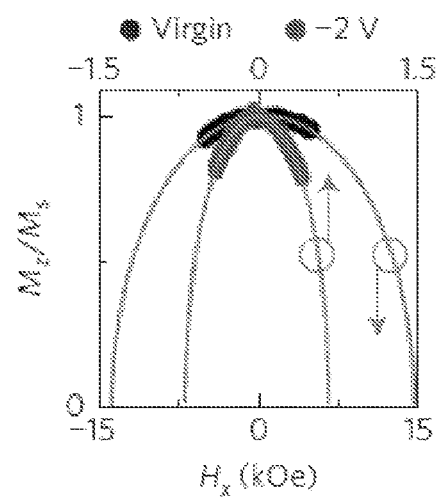
Figure 10F:
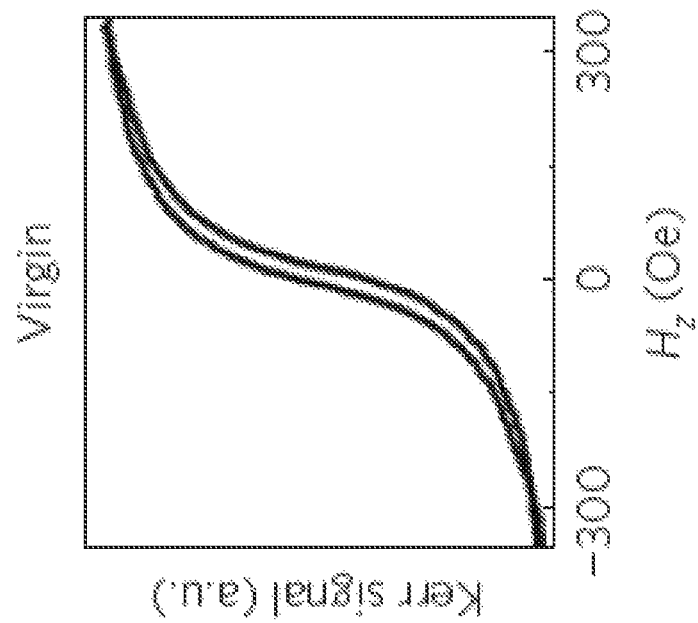
Figure 10G:
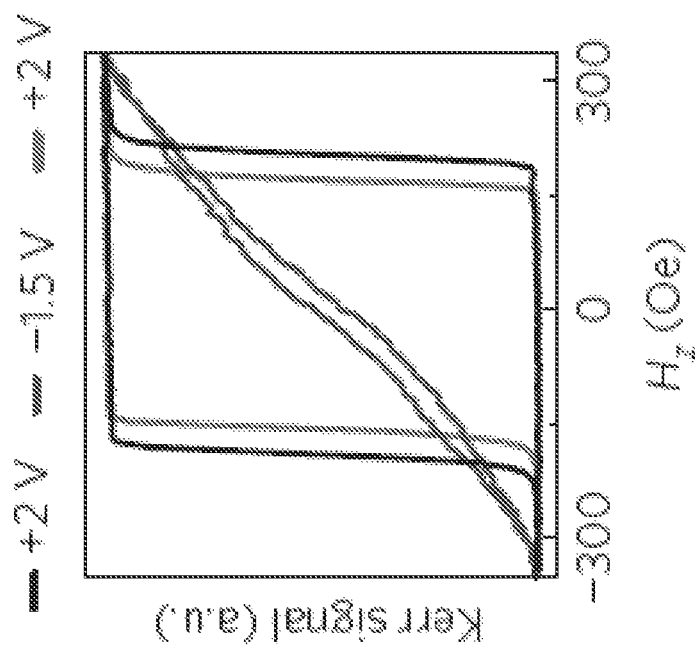
Figure 10H:
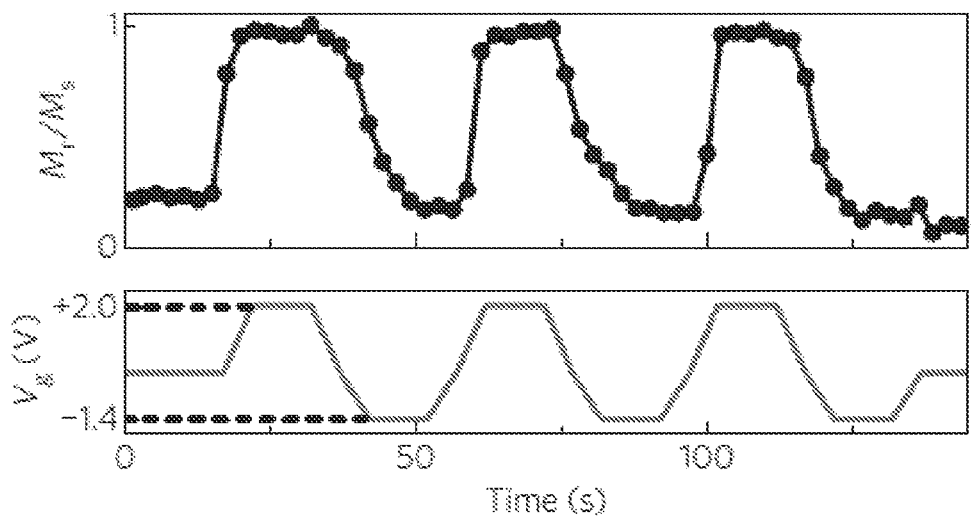
Figure 10I:
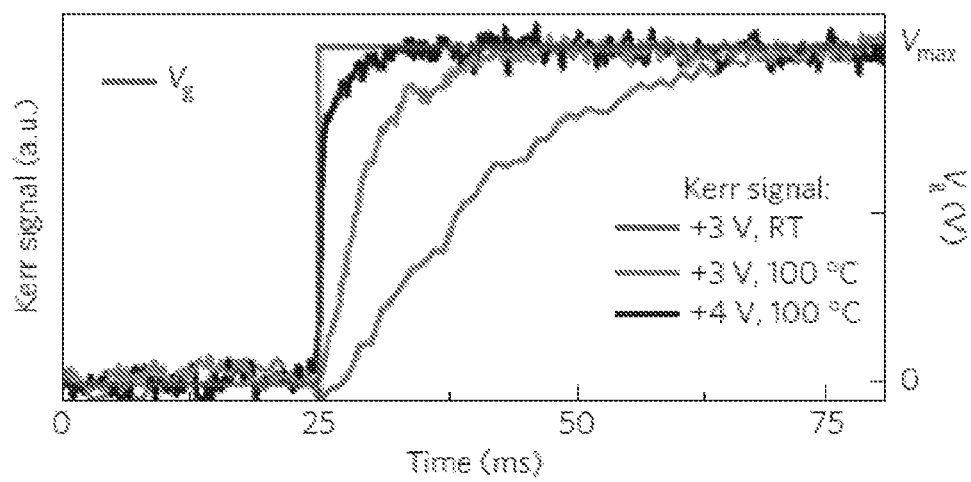

To achieve similar response at room temperature and low Vg, the thicknesses of both the gate-oxide and gate-electrode are decreased to reduce the $O^{2-}$ diffusion barrier. FIGS. 10A-10I show examples of fast anisotropy switching by engineering electrode and oxide. FIG. 10A shows example an optical micrograph that shows shadow-masked 100 μm-diameter Ta(1.5 nm)/Au(5 nm) gate electrode on Ta(4 nm)/Pt(3 nm)/Co(0.9 nm)/GdOx(3 nm) film. FIGS. 10B-10C show example AFM images taken at the center (FIG. 10B) and at the edge (FIG. 10C) of a gate electrode. FIG. 10D shows example polar MOKE hysteresis loops measured at the electrode center in the virgin state and after application of a gate voltage of first Vg=−2V for 10 s and then Vg=+2V for 10 s at room temperature. FIG. 10E shows an example of the perpendicular magnetization component Mz measured as a function of in-plane field Hx in the virgin state (black points; with field scale on bottom axis) and after application of Vg=−2V at room temperature (blue points; with field scale on top axis). The red lines are fits to the Stoner-Wohlfarth model. FIGS. 10F-10G show example polar MOKE hysteresis loops measured at the electrode edge in the virgin state (FIG. 10F) and after subsequent application of Vg=+2V, Vg=−1.5V and Vg=+2V for 10 s each at room temperature (FIG. 10G). FIG. 10H shows examples of three voltage-induced switching cycles of the remanence to saturation magnetization ratio Mr/Ms measured at the electrode edge at room temperature. FIG. 10I shows an example of transients showing polar MOKE signal during application of a Vg pulse at room temperature (RT) and at 100° C. A perpendicular bias field of Hz=40 Oe is applied to orient the magnetization in a well-defined direction as the voltage generates PMA. Vmax refers to the amplitude of the voltage pulse.

FIGS. 10A-10I show example images and plots of results for a Ta(4 nm)/Pt(3 nm)/Co(0.9 nm)/GdOx(3 nm) film on which thinner Ta(1.5 nm)/Au(5 nm) gate electrodes are sputter-deposited through a shadow mask (FIG. 10A). FIG. 10D shows hysteresis loops measured at the electrode center in the virgin state and after negative and positive voltage application, respectively, at room temperature. Here, PMA can be completely removed and restored by applying Vg=±2V for just ~10 s, ten times faster than for the devices in FIGS. 8A-8K at higher T and Vg. These results show that a substantial reduction in the effective activation barrier for ionic motion can be achieved simply by optimizing the layer thicknesses in these devices.

To quantify the voltage-induced MAE change, the anisotropy field Hk is determined by measuring the out-of-plane magnetization Mz versus in-plane field Hx using a MOKE lock-in technique. FIG. 10E shows data in the virgin state and after applying Vg<0 such that PMA is reduced but the easy axis remains out-of-plane. In this case, both curves correspond to the easy-axis magnetization versus hard-axis applied field, which are fitted using the Stoner-Wohlfarth model to extract Hk. It is observed that Hk=13 k Oe in the virgin state and Hk=700 Oe after bias application, corresponding to a MAE reduction of at least 0.75 erg/cm$^2$.

It is observed that even without voltage application, PMA can be diminished near the electrode perimeter (FIG. 10F) after exposure to ambient conditions for about 24 h, suggesting that the oxygen affinity of the underlying Co layer alone can be sufficient to drive $O^{2-}$ through the GdOx there. This behavior is limited to a region of about 10 μm at the electrode perimeter, whereas at the electrode interior and far from the electrodes, PMA is stable with time. Atomic force microscopy (AFM) shows that near its center the electrode is continuous (FIG. 10B), but shadowing during deposition leads to a thinner region at the edge where the Au is electrically contiguous but structurally porous (FIG. 10C) owing to percolated island growth. This porous microstructure should extend the lateral extent of the triple-phase boundary, where gas phase, electrode and electrolyte coincide. These room-temperature effects are believed to be aided by the reduced Au thickness and extended triple-phase boundary in these devices. The reduced GdOx film thickness also may have an effect on $O^{2-}$ mobility.

FIG. 10G shows that the spontaneous loss in PMA in this region (FIG. 10F) can be reversed under positive Vg (FIG. 10G), can be toggled repeatedly (FIG. 10G-10H). The Co redox reactions are markedly enhanced near the triple-phase boundary in these devices. Faster voltage-induced switching might also be attained. FIG. 10I shows time-resolved measurements of voltage-induced MAE switching at the electrode perimeter that directly yield the switching speed. Here, starting from the low-anisotropy state (similar to FIG. 10F), a voltage step Vg>0 is applied to generate PMA while the time-resolved polar MOKE signal is measured. A small perpendicular bias field is simultaneously applied, so that as the MAE transitions from in-plane to out-of-plane, the magnetization orients in a well-defined direction. In this example, this applied field is too weak to orient the magnetization out of the plane in the initial state, and rather is used to break the symmetry so that when the easy axis switches to out-of-plane, the magnetization prefers the 'up' state over the 'down' state.

FIG. 10I shows that on voltage application, the polar MOKE signal rapidly rises and saturates, indicating tilting of the magnetization out of the plane as the film transitions to PMA. The MOKE transient for Vg=+3V at room temperature has a rise time of ~25 ms, similar to the switching time achieved in FIG. 9F at T=120° C. and Vg=+12V, where the GdOx and Au electrodes are much thicker. The switching time is further reduced by increasing T and Vg, dropping to ~700 μs at 100° C. and +4V. The remarkable increase in switching speed, by about 6 orders of magnitude compared with the same T and Vg in FIG. 8A-8K, together with the unprecedented degree by which the MAE can be switched, indicates that magneto-ionic coupling offers a promising new route towards magneto-electric devices.

Figure 11:
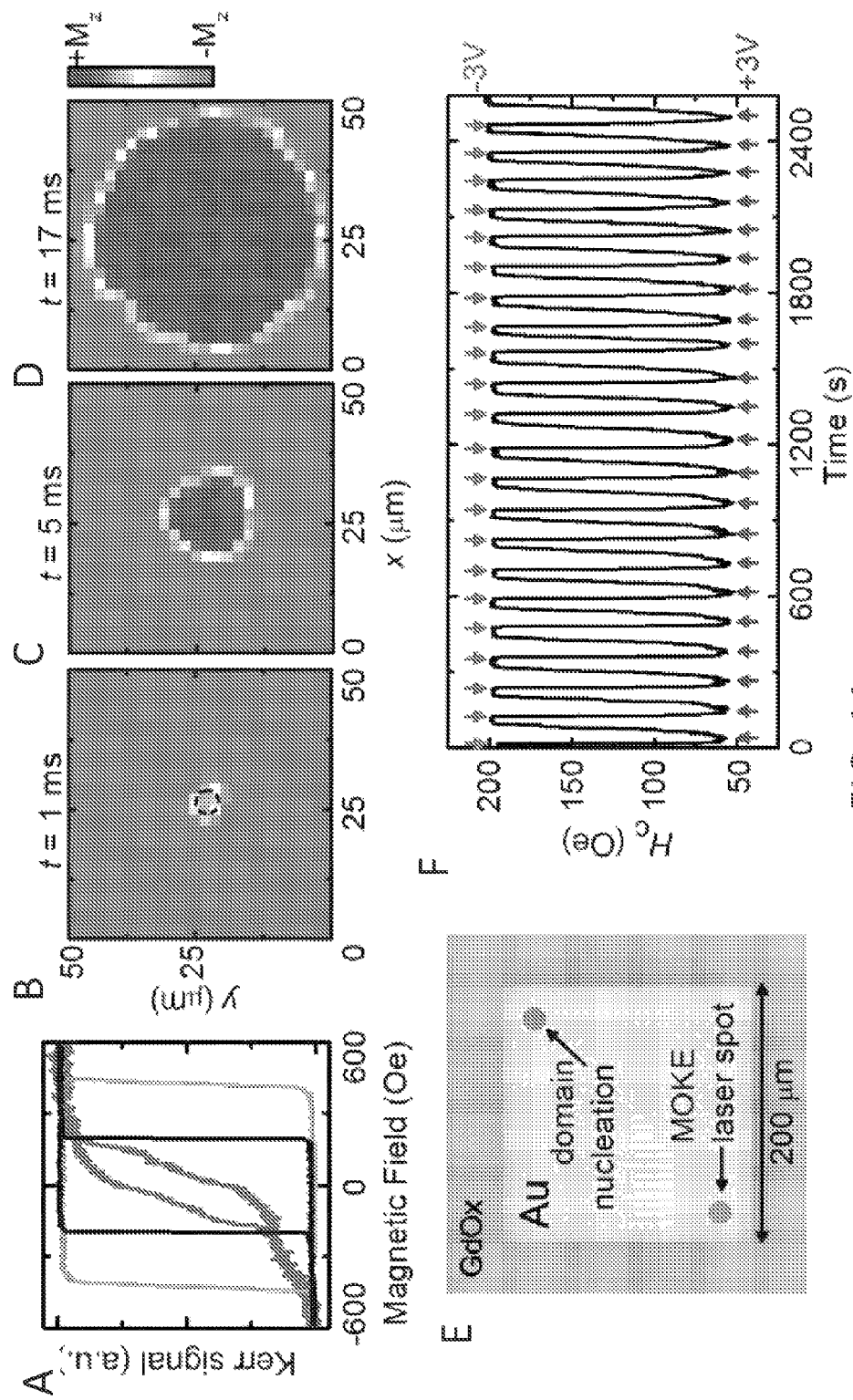
FIGS. 11A-11F show examples of the effects of voltage and laser illumination on magnetic anisotropy, according to principles of the present disclosure.

These findings demonstrate the example systems, methods, and apparatus described herein to locally pattern magnetic anisotropy. FIGS. 11A-11F show examples of the effects of voltage and laser illumination on magnetic anisotropy. FIG. 11A shows example polar MOKE hysteresis loops measured inside gate electrode with the device in its virgin state (black line), after application of a gate voltage Vg=−3V for 90 s (orange line) and after application of Vg=−7 V for 180 s under laser illumination (green line). FIGS. 11B-11D show example snapshots of domain expansion around a laser-induced nucleation site, at the indicated times following application of a reverse field step of 90 Oe at t=0. All snapshots are acquired at zero bias. The dashed black line in example FIG. 11B outlines the area exposed for 100 s to the 10 mW laser spot at a gate voltage −3 V. FIG. 11E shows an example schematic, showing top view of an electrode in which a laser-induced nucleation site has been created at the upper-right corner, and the probe laser spot is positioned at the bottom left corner. FIG. 11F shows an example of voltage dependence of coercivity $H_c$ as a function of Vg, corresponding to the schematic measurement geometry in example FIG. 11E, as Vg is cycled between +/−3 V.

Figure 24:
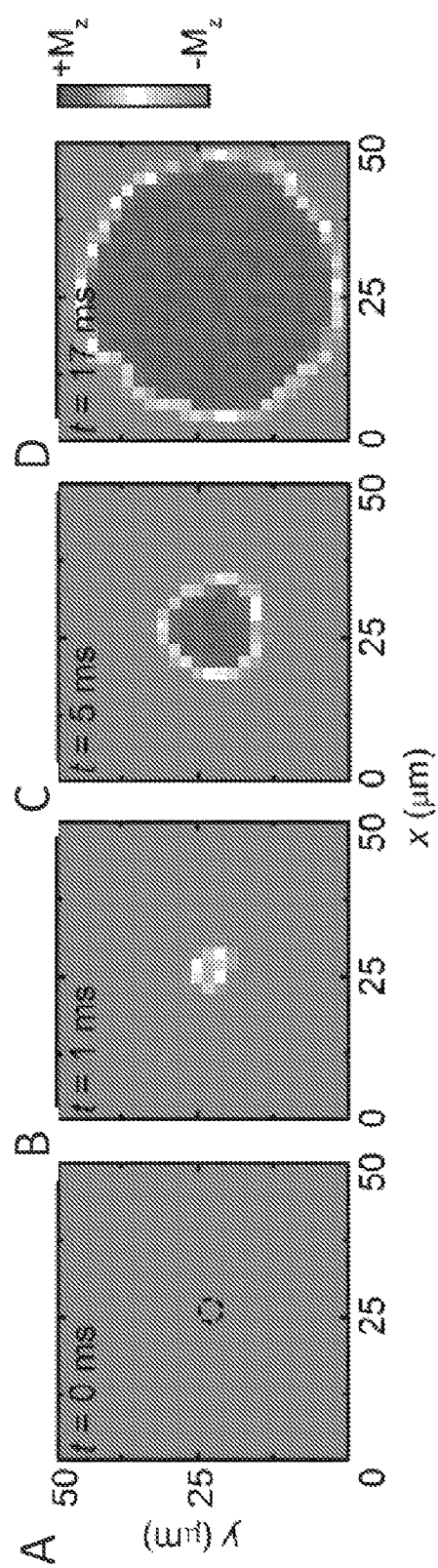
FIGS. 24A-24D show example polar magneto-optical Kerr effect maps, according to principles of the present disclosure.

In this non-limiting example, a MOKE laser spot is used to locally heat the sample and activate oxygen migration under $V_g$. Using the devices described in FIG. 8B, a negative voltage ($V_g$<0) is applied at room temperature to create a potential well at the electrode perimeter, evidenced by a jump in $H_c$ beneath the electrode (FIG. 11A). This isolates the electrode area from DW motion in the adjacent Co film. With Vg applied, the MOKE laser power P is increased from 1 mW to 10 mW, corresponding to a local temperature rise of ~20° C. This causes $H_c$ and $M_T/M_S$ to drop markedly underneath the spot (FIG. 11A), and this change is retained when $V_g$ is removed and P decreased to 1 mW. Neither $V_g$ nor high P alone is sufficient to cause irreversible changes, but when both are sufficiently high, e.g., when both are above a threshold value (FIG. 24), laser-induced heating can activate voltage-driven $O^{2-}$ migration and facilitate local MAE imprinting. It is noted that the 1 mW incident power used in the devices with thinner Ta/Au electrodes in FIG. 10A-10I is below the threshold for laser-assisted effects for those structures).

Due to the local anisotropy reduction, the illuminated spot acts as a domain nucleation site, as seen in the time-resolved scanning MOKE images in FIG. 11B-11D. To demonstrate the reversibility of this MAE imprinting, a laser-induced DW nucleation site is generated in one corner of an electrode and then placed the laser spot in the diagonally opposite corner (FIG. 11E) with P=10 mW. At $V_g$=0 the higher laser power alone has no effect on $H_c$, which is determined by the field necessary to propagate a DW from one corner of the electrode to the other. However, with $V_g$=−3 V, $H_c$ and $M_T/M_S$ drop markedly, indicating that instead of propagating across the electrode, DWs nucleate directly underneath the laser spot due to the local PMA reduction. Positive bias restores $M_T/M_S$ and to their initial values, and in FIG. 11F, it is demonstrated that $H_c$ can be toggled repeatedly in this manner as $V_g$ is cycled between +3V and −3V.

Figure 12:
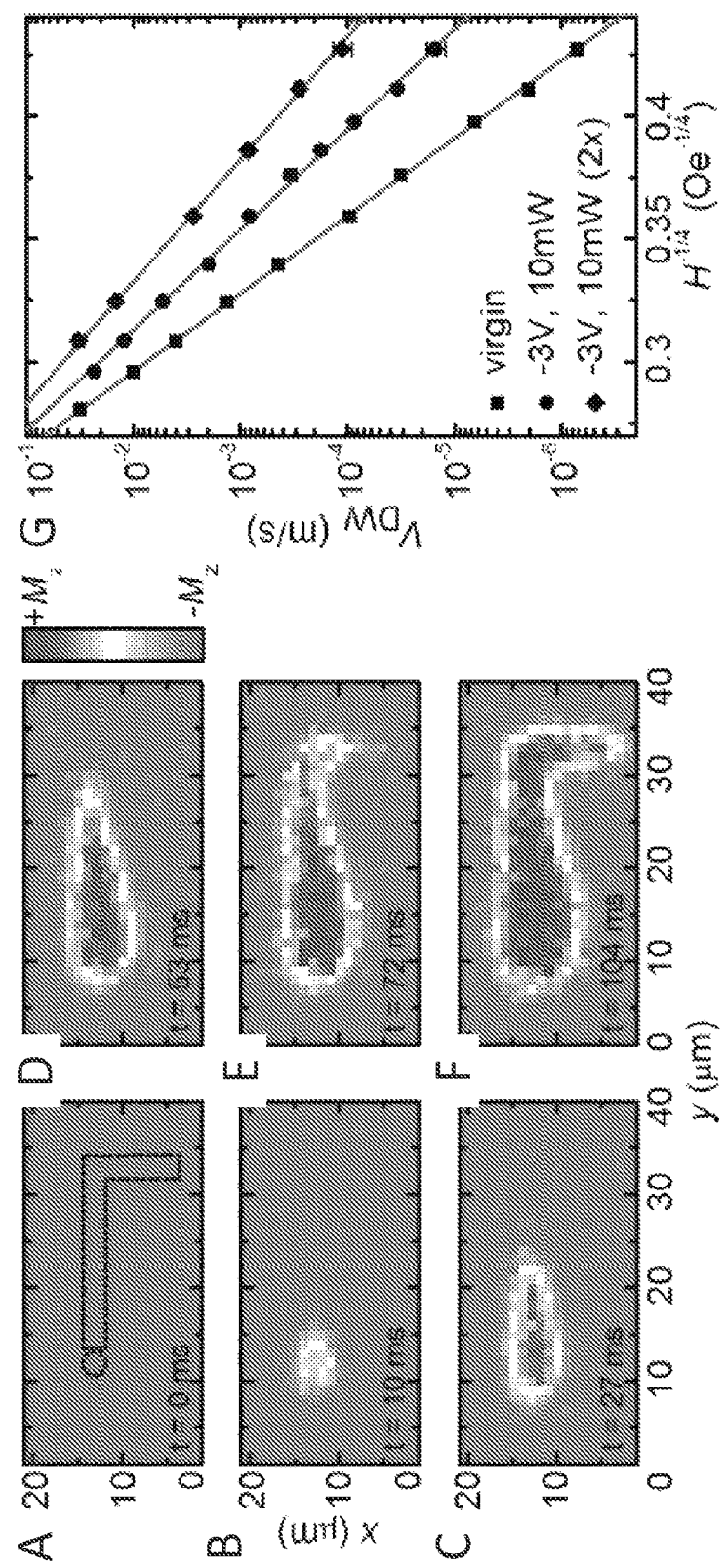
FIGS. 12A-12G show examples of laser-defined anisotropy patterns and domain wall conduits, according to principles of the present disclosure.

The example systems, methods, and apparatus herein are applied to the sample to imprint more complex anisotropy patterns that allow for spatial control of magnetization dynamics. FIGS. 12A-12G show examples of laser-defined anisotropy patterns and domain wall conduits. FIG. 12A-12F shows example time-resolved polar MOKE maps, showing domain expansion in laser-defined domain wall conduit with increasing time t after application of a magnetic driving field H=42 Oe. The dashed black lines in FIG. 12A outline the area exposed by laser spot with 10 mW incident power and under gate voltage $V_g$=−3 V. The dashed circle is exposed for 100 s while dashed, L-shaped line is scanned in 1.25 μm steps with 65 s exposure at each point. All maps are acquired at room temperature and under zero bias. FIG. 12G shows an example plot of domain wall velocity as a function of magnetic field H in virgin film and along conduit exposed at 10 mW incident power under $V_g$=−3 V for 60 s and 65 s.

In FIG. 12A, an L-shaped DW conduit is generated, in which DWs are injected from a laser-written nucleation site at one end (of the L-shaped DW conduit) and propagate along a pre-defined path. At $V_g$=−3 V, a point inside the electrode area is illuminated with the laser spot at P=10 mW for 100 s to produce a DW nucleation site. The laser spot is then scanned along an L-shaped line in 1.25 μm steps (to form the L-shaped DW conduit) with a variable dwell time to produce a conduit of reduced MAE (FIG. 12A). FIGS. 12A-12F show time-resolved MOKE images of field-driven domain expansion in the patterned region. Here, a reverse domain nucleates at the laser-defined nucleation site (FIG. 12B) and then expands preferentially along the L-shaped laser-written DW conduit (FIGS. 12C-12F). The degree of confinement depends on the difference in MAE in the film and in the patterned region, which determines the difference in creep velocity along and orthogonal to the conduit. The DW velocity follows $v \propto \exp(-E_a(H)/k_B T)$, where the activation energy $E_a(H) \propto H^{-1/4}$ a depends on the MAE. FIG. 12G shows that the slope of ln(v) versus $H^{-1/4}$, and hence the activation energy that determines the DW velocity, can be precisely tuned to control the DW dynamics. By reducing the anisotropy in the conduit the velocity can be enhanced by up to a factor of ~160. Further reduction of the MAE can be achieved, but in this case nucleation along the conduit is observed.

It is noted that local MAE patterning to produce DW conduits has previously been demonstrated using local ion beam irradiation, but has never before been realized in a nondestructive and completely reversible way. In this example, the spatial resolution is limited by the laser spot size to a few μm. In another example, this resolution limit can be overcome by instead heating the sample globally and writing the anisotropy pattern locally using, e.g., a conductive AFM tip to apply $V_g$ with high spatial resolution.

The example measurement results demonstrate that interfacial chemistry in metal/metal-oxide bilayers can be electrically gated using an all-solid-state device, operating at low voltage and within the typical operating temperature range of common semiconductor electronics. Specifically for Co/metal-oxide bilayers, where interfacial magnetic anisotropy is sensitive to interface oxygen coordination, it is demonstrated that voltage control over oxygen stoichiometry can achieve unprecedented control over magnetic anisotropy. Moreover, it is observed that relatively small changes in temperature and gate voltage can improve device response times by several orders of magnitude. By varying the thickness and morphology of the gate oxide and electrode, the magneto-ionic switching time drops from hundreds of seconds to hundreds of microseconds. Therefore, it is believed that considerable further improvements in performance and functionality can be achieved by examining oxides with higher ionic conductivity, such as but not limited to yttria-stabilized zirconia, or designing gate-oxide heterostructures that include separately optimized oxygen storage and ion conducting layers.

The non-limiting example results herein demonstrate control of on magnetic properties. As described herein, the reversible control of oxygen stoichiometry in metal/metal-oxide bilayers with a voltage-gated mechanism makes a wide range of materials properties and effects amenable to solid-state electrical control. These non-limiting example results indicate the viability of the example systems, methods, and apparatus herein for electrically gating a variety of phenomena governed by metal/oxide interfaces, and provide a novel means to locally and reversibly imprint material properties by local activation of ionic migration.

To prepare an example device, Ta(4 nm)/Pt(3 nm)/Co(0.9 nm)/GdOx(3 nm) films are prepared by dc magnetron sputtering at room temperature under 3 mTorr Ar with a background pressure of ~1×10−7 Torr, on thermally-oxidized Si(100) substrates. For the samples measured in connection with FIGS. 9A-9D, the top GdOx layer is 30 nm thick. All GdOx layers are deposited by reactive sputtering from a metal Gd target at an oxygen partial pressure of ~5×10−5 Torr. Gate electrodes of GdOx(30 nm)/Ta(2 nm)/Au(12 nm) are patterned using electron beam lithography and lift-off. For the samples with the 30 nm thick GdOx top layer described in FIGS. 9A-9D, the Ta(2 nm)/Au(12 nm) electrodes are deposited through a shadow mask.

In an example, in situ high resolution transmission electron microscopy is performed for characterization. Microstructural analysis and electron energy loss spectroscopy (EELS) are performed on a JEOL 2200FS TEM with double Cs correctors, operated at 200 keV. A cross-sectional TEM specimen is fabricated from an example device having a patterned layer structure: Si/SiO2/Ta(4 nm)/Pt(3 nm)/Co(0.9 nm)/GdOx(30 nm)/Ta/Au, where the target layer is a 0.9 nm layer of cobalt, and the dielectric material layer is a 30 nm layer of a gadolinium oxide (such as but not limited to $Gd_2O_3$). The non-limiting example device is fabricated as follows. First, a Si substrate is glued to the top surface of the sample and the Si/multilayer/Si sandwich is subsequently cut into thin slices. Next, a thin slice is polished into a wedge by a MULTIPREP™ polishing machine (Allied High-Tech). After gluing the specimen to a half TEM Cu grid, it is further polished by Ar ion milling. Before mounting the grid onto an in situ electrical probing holder (HE150, Nanofactory Instruments AB), the Si is unglued from the wedge using acetone. After Si removal, a piezo-controlled Pt/Ir tip with a diameter of about 40 nm is able to contact the patterned electrode on top of the GdOx layer. Slight bending of the sample is observed after contact, but the structural integrity of the layers remain intact (FIG. 7B). Silver paste is used to make an electric contact between the bottom electrode of the layer structure and the Cu grid (see FIG. 13A). The thickness of the TEM specimen is estimated to be less than about 30 nm by measuring the intensity ratio of the plasmon loss and the zero-loss peaks in EELS. For the analysis of EELS core-loss peaks, background subtraction is performed using a power-law fit. The lateral resolution of STEM-EELS characterization is about 0.25 nm.

Example magneto-optical Kerr effect measurements are performed as follows. Polar magneto-optical Kerr effect (MOKE) measurements are made using a 532 nm diode laser attenuated to 1 mW, except where noted. The laser is focused to a ~3 μm diameter probe spot and positioned by a high resolution (50 nm) scanning stage with integrated temperature control. A gate voltage is applied to the example device measured using a mechanically-compliant BeCu microprobe. Mechanically-generated nucleation sites created for the measurements in FIGS. 8A-8K are prepared by applying mechanical stress to the film surface using a stiff W microprobe tip. Magnetic hysteresis loops are measured at a sweep rate of 28.3 k Oes−1, using an electromagnet with a risetime of ~300 μs and a maximum amplitude of 650 Oe. The time-resolved domain expansion snapshots in FIGS. 11A-11F and 12A-12G are obtained by, at each pixel, first saturating the magnetization and then applying a reverse field step (H=90 Oe in FIGS. 11A-11F, and H=42 Oe in FIGS. 12A-12G) while acquiring a time-resolved MOKE signal transient. Five reversal cycles are averaged at each pixel, from which the average trajectory of the expanding domain is reconstructed.

Time resolved MOKE transients along a line extending radially from a nucleation site are used to determine the domain wall velocity reported in FIG. 12G. At each position, 25 reversal cycles are acquired and averaged, yielding the cumulative probability distribution of switching times. The mean reversal time $t_{1/2}$, taken as the time at which the probability of magnetization switching is 50%, is plotted versus position, and the slope used to determine the mean velocity.

An example of laser-induced temperature regulation, and computation of the temperature change achieved, is as follows. To estimate the laser-induced temperature increase ΔT, the temperature dependence of the coercivity of a submicrometer patterned feature is used. First, $H_c$ versus substrate temperature is measured, using a temperature-controlled stage and a low incident laser power (<1 mW) for the MOKE probe spot. Then $H_c$ versus incident laser power P is measured, at a fixed substrate temperature. It is determined that P=1 mW corresponds to a negligible ΔT (i.e., ΔT≈0), whereas P=10 mW corresponds to a ΔT of at least about 20° C.

Figure 13:
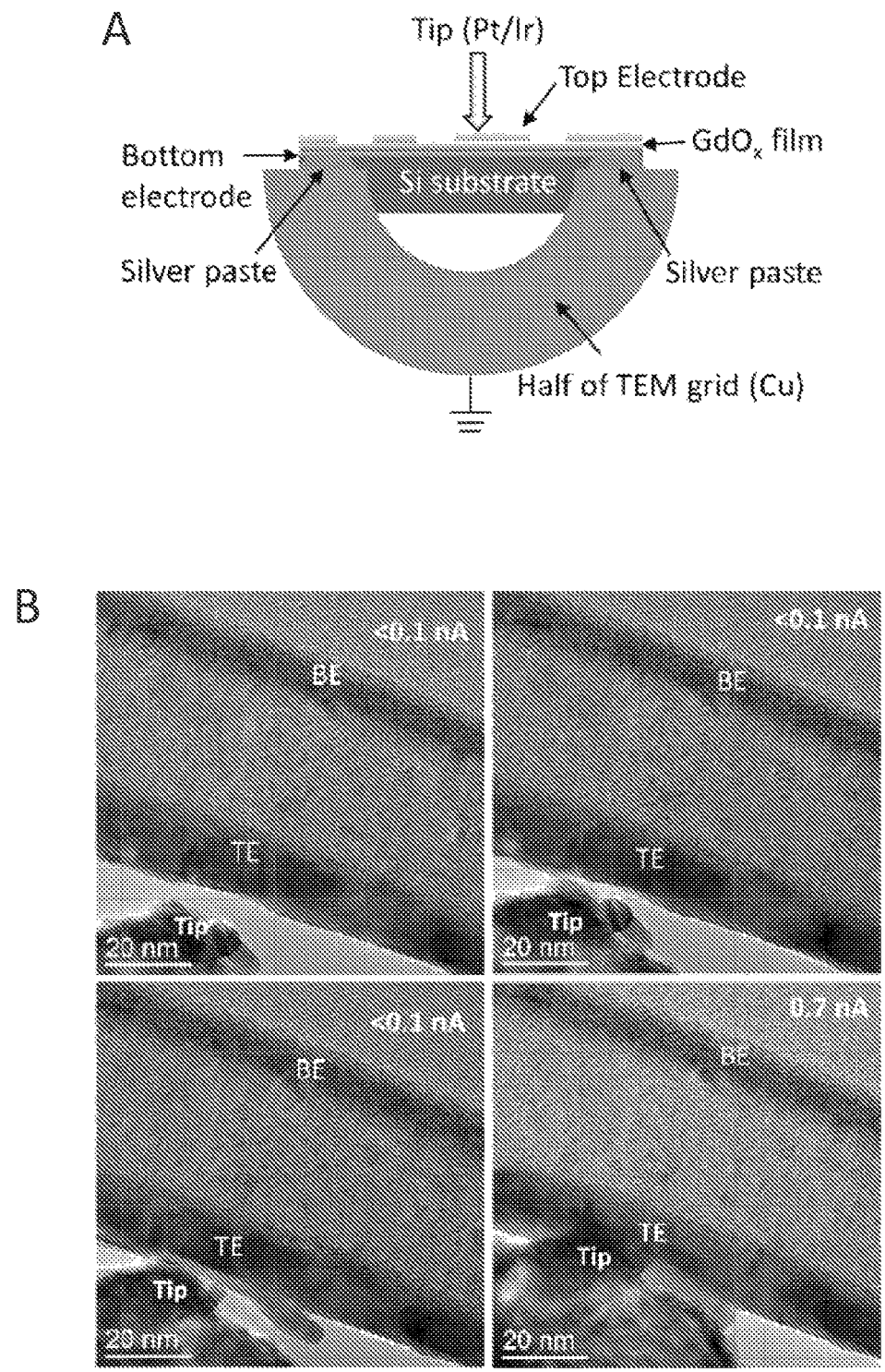
FIGS. 13A-13C show example in situ TEM setup and connection measurement, according to principles of the present disclosure.
Figure 13C:
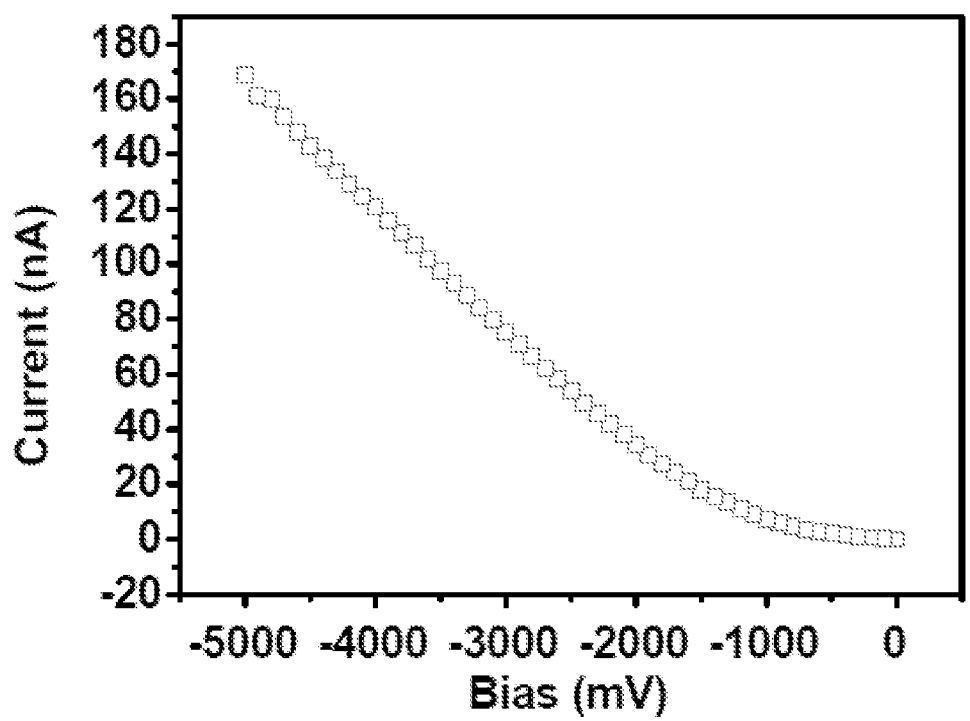

An example of electric probing using a transmission electron microscope (TEM) is described. FIGS. 13A-13C show example in situ TEM setup and connection measurement. FIG. 13A shows an example schematic of the TEM specimen configuration inside the electrical probing holder. FIG. 13B shows example TEM images of a connection measurement. The measured current is indicated in the upper right corner. FIG. 13B shows an example I-V curve after establishing a good contact between the top and bottom electrode. For the in situ TEM and STEM-EELS analysis, the cross-sectional specimen is mounted on a half TEM Cu grid inside a piezo-controlled electrical probing holder (FIG. 13A). Voltage-driven $O^{2-}$ migration in the layer structure is monitored by spatially resolved STEM-EELS after applying negative bias voltages to the top electrode. The bottom electrode, which is contacted by silver paste to the half Cu grid, is grounded. To ensure good electrical contact between the Pt/Ir tip and the top electrode, connection measurements are performed using a small bias of −0.2V (FIG. 13B). During these measurements, the current between the top and bottom electrode is monitored while the tip moved towards the specimen. The piezo-controlled approach is halted once a sudden increase of current is measured. Contact between the Pt/Ir tip and the sample resulted in a slight bending of the specimen, but this did not affect the structural integrity of the layers. FIG. 13C shows a typical I-V curve of the in situ measurement geometry after a stable contact between tip and sample is established.

Figure 14:
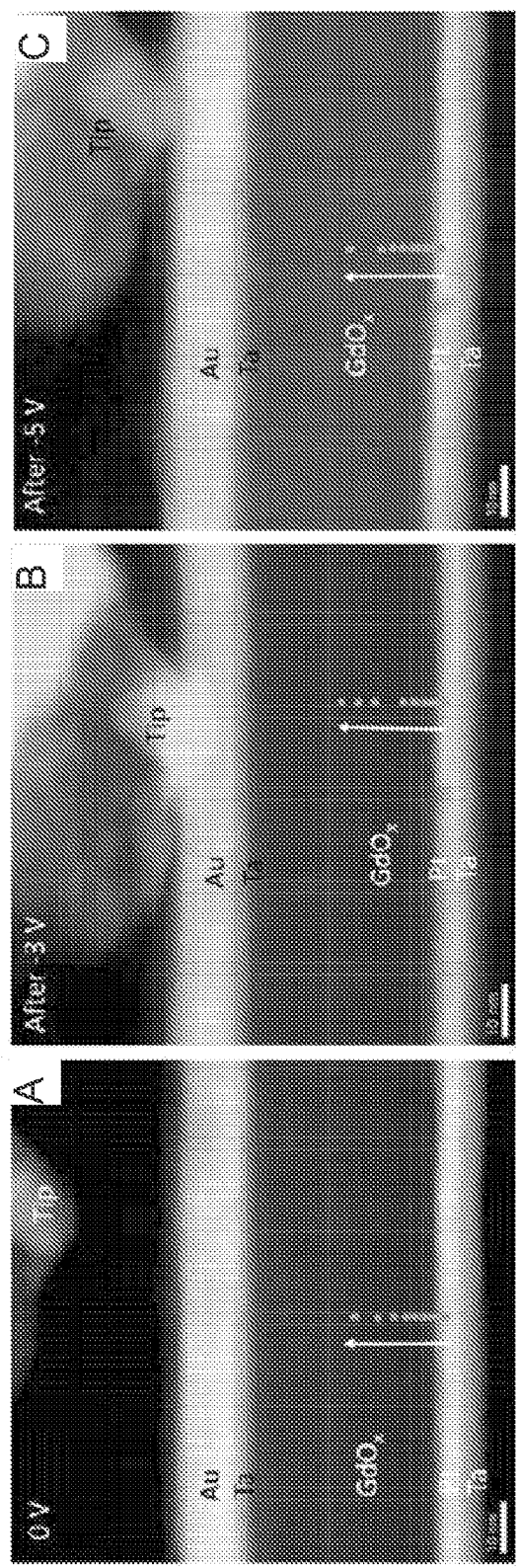
FIGS. 14A-14C show example results of STEM-EELS measurements, according to principles of the present disclosure.

An example of scanning tunneling microscopy (STEM) images for EELS analysis is described. FIGS. 14A-14C show example results of STEM-EELS measurements. The STEM images indicate the locations where EELS spectra are recorded before a bias is applied (0V) (see FIG. 14A), and after applying a bias of −3V (see FIG. 14B) and −5V (see FIG. 14C). The diameter of the spot size of the STEM beam during EELS analysis is about 0.25 nm. A cross-sectional chemical profiling across the Co/GdOx interface is conducted using STEM-EELS. Analysis of the chemical profiling measurements can provide data indicative of the proportionate amounts of the ionic species present in the target layer proximate to the interface.

In an example, the reversibility of the migration of an ionic species ($O^{2-}$) from a $GdO_x$ dielectric material layer into a Co target layer is monitored by reversing the polarity of the applied bias. FIGS. 7D-7F show O K-edge and Co L3-edge count rates measured along the line profiles in FIG. 14A-14C. The measurement results demonstrate reveal $O^{2-}$ diffusion into the Co layer upon negative bias application.

FIGS. 15A-15C show example plots of data from subsequent STEM-EELS measurements that show that the voltage-driven $O^{2-}$ from a $GdO_x$ dielectric material layer into a Co target layer is reversible. FIGS. 15A-15B show O K-edge and Co L3-edge count rates along a similar line profile as indicated in FIG. 14A-14C after applying negative bias of −3V (see FIG. 15A) and after subsequently applying a positive bias of +4V (see FIG. 15A), each for about 100 s. The dashed blue lines in FIGS. 13A-13B indicate the Co layer, and the dotted circle in FIG. 15B highlights the migration of O away from the Co layer after positive bias. Similarly to as described in connection with FIGS. 7A-7G, after applying a negative bias voltage to the top electrode, the oxygen ions have moved into the Co layer (FIG. 15A). The subsequent application of a positive bias voltage (FIG. 15B), decreases the O signal within the Co layer, drawing the ionic species ($O^{2-}$) back towards the $GdO_x$ layer. FIG. 15C shows the O K-edge counts at (or near) the center of the Co layer, normalized to the O K-edge counts in the $GdO_x$ layer, after alternating application of negative and positive bias voltages pulses, corresponding to three oxidation/reduction cycles.

Figure 16:
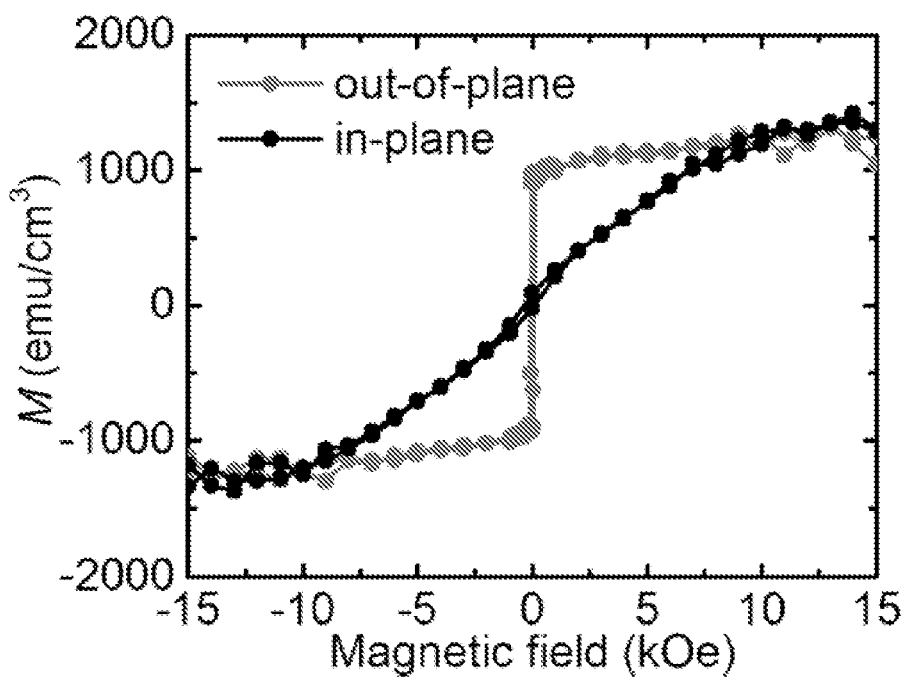
FIG. 16 shows example measurement results from a vibrating sample magnetometry measurement, according to principles of the present disclosure.

FIG. 16 shows example measurement results from a vibrating sample magnetometry measurement, to determine magnetic anisotropy energy (MAE). The magnetic properties of an example device based on layered films of Ta(4 nm)/Pt(3 nm)/Co(0.9 nm)/GdOx(3 nm), cross-section shown in FIGS. 14A-14C, are measured using the vibrating sample magnetometry. FIG. 16 shows in-plane and out-of-plane hysteresis loops of the measured example device. Starting from the as-deposited state, a gate voltage of −6 V is applied at a sample temperature of 100° C. and hysteresis loops are continuously measured inside the electrode area via the polar magneto-optical Kerr effect. FIG. 16 then shows the evolution of the remanence to saturation magnetization ratio Mr/Ms of the measured hysteresis loops as a function of bias dwell time. It can be seen that purely by voltage application, the sample can be driven through a double spin reorientation transition. Initially, Mr/Ms and therefore perpendicular magnetic anisotropy (PMA) decreases with increasing bias dwell time. However, after reaching a minimum of Mr/Ms≈0.1 after ~90 s, Mr/Ms and PMA increase again until Mr/Ms returns back to its initial a value of 1. The measurement results show that the example device exhibits an in-plane saturation field Hk of ~10 k Oe and a saturation magnetization Ms of ~1300 emu/(cm³ of Co). This indicates minimal Co oxidation during growth of the $GdO_x$ dielectric material overlayer over the Co target layer. The uniaxial magnetic anisotropy $K_u=(H_kM_s)/2$ of the Co film is measured to be about $6.5 \times 10^6$ erg/cm³ and the interfacial magnetic anisotropy, computed using the expression $Ks=(K_u+2\pi M_s^2)d_{Co}$, with $d_{Co}$ being the Co film thickness, is about 1.5 erg/cm².

A lower limit of the reduction in interfacial magnetic anisotropy $\Delta K_S$ is determined after gate voltage application, during the progression between FIGS. 8G to 8J, after which PMA is lost, to be $\Delta K_S$=0.6 erg/cm². The value of $\Delta K_S$ is computed using the expression $\Delta K_S=\Delta K_u d_{Co}=\Delta H_k M_s d_{Co}/2$ with the assumption that the voltage-induced changes to $M_s$ are negligible. With $\Delta H_k$=10600 Oe being the sum of the initial in-plane saturation field of ~10 k Oe (FIG. 8G) and the lower limit of the out-of-plane saturation field of 600 Oe (based on the equipment electromagnet) after voltage application (FIG. 8J).

The voltage-induced modification of interface magnetic anisotropy $\Delta K_S$ at the electrode center of example devices based on layered films of Ta(4 nm)/Pt(3 nm)/Co(0.9 nm)/GdOx(3 nm)/Ta(1.5 nm)/Au (5 nm). Using local MOKE anisotropy measurements, it is determined that $\Delta H_k$≈13 k Oe (see FIG. 10E), which results in an even larger $\Delta K_S$ of ~0.8 erg/cm². As a result of implementation of an example system, method, and apparatus herein, this giant modification of magnetic anisotropy can be achieved at room temperature and at a bias voltage of only about −2V.

The effect of annealing at temperatures higher than room temperature is measured. Measurements are made of an example device based on layered films of Ta(4 nm)/Pt(3 nm)/Co(0.9 nm)/GdOx(3 nm), the example device having a width of about 200 μm, and including GdOx(30 nm)/Ta(2 nm)/Au(12 nm) gate electrodes. FIG. 17A shows example measurement results the evolution of the coercivity $H_C$ (measured as a function of time) while the sample temperature is raised to T=100° C. for about 45 minutes. FIG. 17B shows example temperature measurements as a function of time. The coercivity $H_c$ of the example device is measured inside the gate electrode area by locally acquiring magnetic hysteresis loops with the polar magneto-optical Kerr effect (MOKE). Magnetization reversal in a Pt/Co/GdOx film can be dominated by domain nucleation and expansion via domain wall (DW) motion. An artificial nucleation site is mechanically created ~200 μm from the gate electrode. $H_c$ is then dominated by the field necessary to drive domain expansion from the artificial nucleation site via DW motion. As domain wall motion is very sensitive to magnetic anisotropy, $H_c$ can be used to sensitively detect local modifications of the anisotropy.

From the data shown in FIG. 17A-17B, it is determined that there is no annealing at 100° C. in the absence of a gate voltage. Upon slowly increasing the sample temperature from a base level of about 37° C. to about 100° C., a monotonic decrease of $H_c$ from ~200 Oe to ~120 Oe is observed, consistent with the thermally activated nature of DW motion under the applied magnetic field amplitudes. At around 100° C., $H_c$ show little modification, and remains stable over a period of time. After ~45 minutes the temperature is then slowly reduced back to its initial value of 37° C. A simultaneous increase in $H_c$ is observed back to its initial value of ~200 Oe. The lack of a permanent modification of $H_c$ after the heat treatment shows that exposure to 100° C. does not result in any significant modifications of magnetic anisotropy of the Pt/Co/GdOx samples.

While the measurements for the example device based on Ta(4 nm)/Pt(3 nm)/Co(0.9 nm)/GdOx(3 nm) show a $H_c$ that remains stable over a period of time at a temperature of around 100° C., it is understood that a higher can be used for other example devices. In another example implementation, the allowed range of values of temperature that can be used for temperature regulation can be determined. For example, an example device can be heated to temperatures up to about 120° C., about 170° C., about 200° C., about 225° C., about 250° C., or higher, depending on the operating range of the example device.

Figure 18:
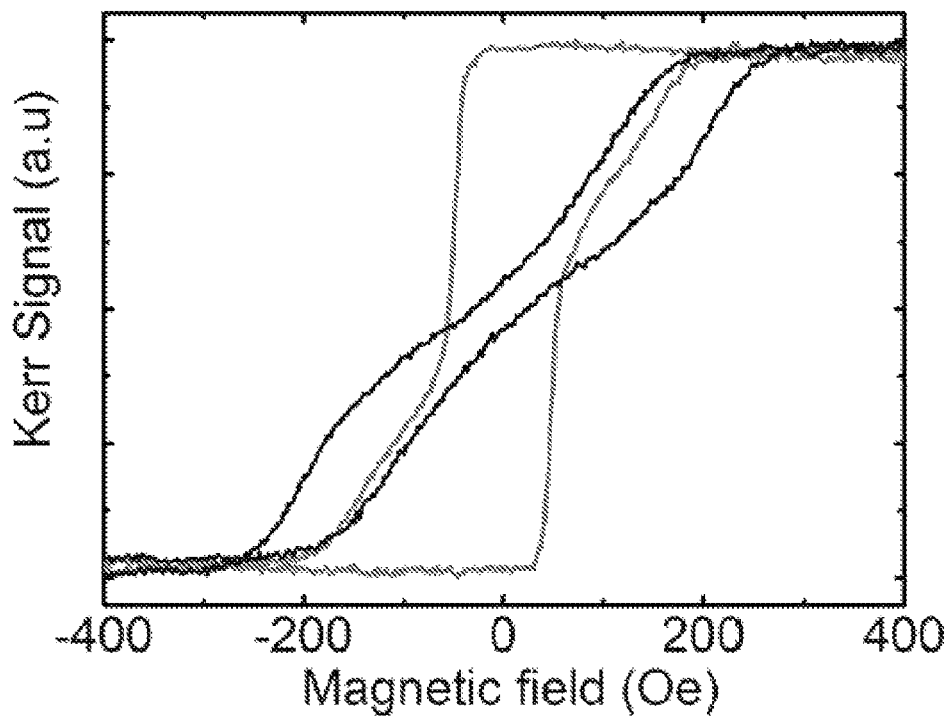
FIG. 18 shows the results of example voltage pulsing measurements, according to principles of the present disclosure.

An example of fast anisotropy switching by voltage pulsing is described. The modifications of magnetic anisotropy shown in FIGS. 8A-8K and 9A-9H can require bias dwell times on the order of tens or hundreds of seconds for measurements made at room temperature. Using the example systems, methods and apparatus herein, it is demonstrated that larger amplitude voltage pulses at elevated temperature can be used to derive a decrease in switching times on the order of milliseconds. Using the example device based on thin films of Pt/Co/Gd/GdOx described in connection with FIG. 9C, measurements are made of polar MOKE hysteresis loops before and after applying a 10 ms pulse of Vg=+12 V. FIG. 18 shows the results of example voltage pulsing measurements, where magnetic hysteresis loops are measured via the polar magneto-optical Kerr effect, before (black line) and after (red line) application of a 10 ms long voltage pulse of 12 V at 120° C. This voltage pulse is sufficient to switch the example device from the minimum of the anisotropy transition (see FIG. 22E) with Mr/Ms~0.1 back to its initial state with Mr/Ms=1. This corresponds to an improvement in switching time of nearly four orders of magnitude as compared to the results in FIGS. 9A-9H for T=100° C. and a gate voltage of magnitude |Vg|=6 V. Further improvements in switching time are achieved by reducing the GdOx and Au electrode thicknesses, as described in connection with FIGS. 10A-10I.

Figure 19:
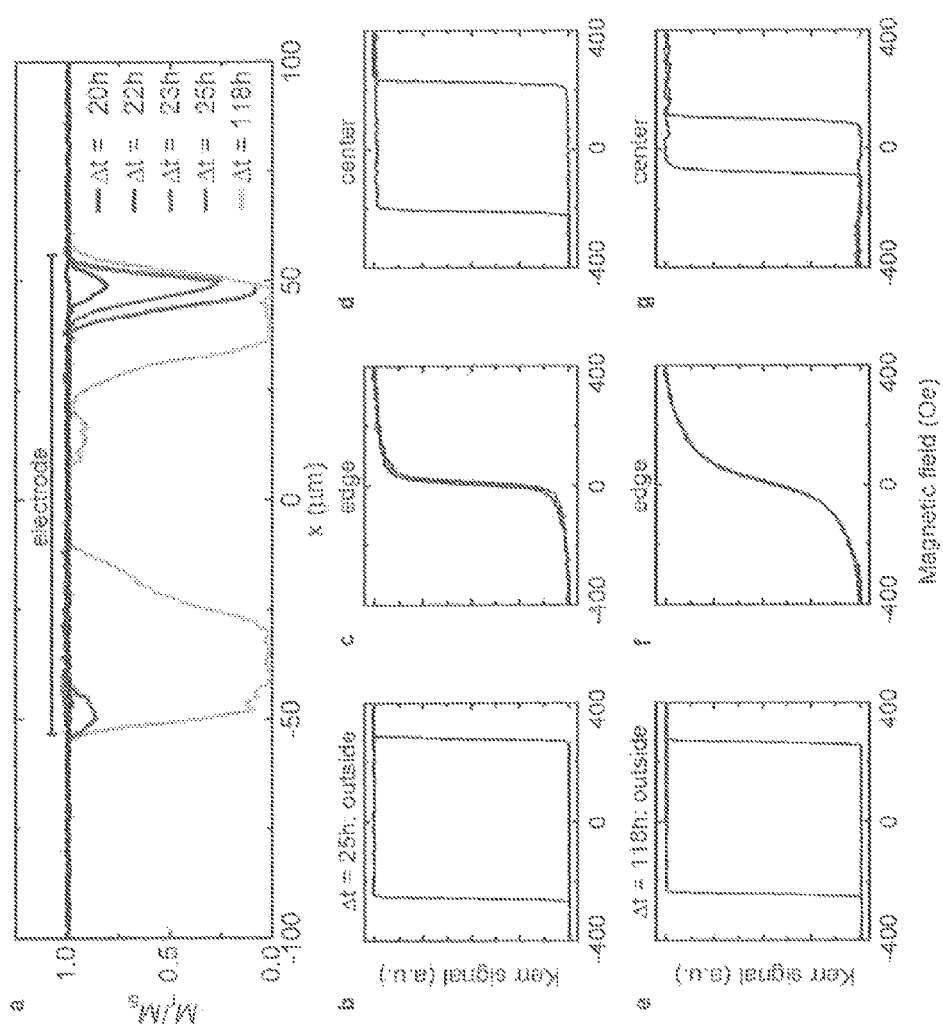
FIGS. 19A-19G shows the effect of electrode porosity on magnetic properties for an example device, according to principles of the present disclosure.

An example of spontaneous oxidation of Co through a thin GdOx overlayer near the triple phase boundary under ambient exposure to atmosphere is described. In connection with FIGS. 10A-10I, voltage-induced anisotropy switching is described for Ta(4 nm)/Pt(3 nm)/Co(0.9 nm)/GdOx(3 nm) films with thin Ta(1.5 nm)/Au(5 nm) electrodes directly deposited on the films through a shadow mask. As described herein, these electrodes show nanoscale porosity over a ~10 μm wide area around the electrode edge, due to the thickness gradient that results from shadowing effects during deposition. This can significantly increase the lateral extent of the triple phase boundary, which is the boundary where gas-phase, electrode and electrolyte coincide and ionic exchange is most efficient. Initially the example devices show square out-of-plane hysteresis loops with a remanence to saturation magnetization ratio Mr/Ms=1 and a coercivity Hc≈250 Oe, everywhere, and these properties remain unchanged after prolonged exposure to atmosphere under ambient conditions. However, after depositing the gate electrodes on the films, and again exposing the example devices to ambient, a time evolution of the magnetic properties in the vicinity of the electrode edge is observed. FIG. 19A shows line scans of Mr/Ms across an electrode at increasing times Δt after exposure to atmosphere. FIGS. 19A-19G shows the effect of electrode porosity on magnetic properties for an example device based on Ta(4 nm)/Pt(3 nm)/Co(0.9 nm/GdOx(3 nm) films. Line scans of the remanence to saturation magnetization ratio Mr/Ms are measured across shadow masked Ta(1.5 nm)/Au(5 nm) electrodes after exposure to atmosphere for times Δt. Up to Δt=20 h, Mr/Ms=1 across the whole electrode, after 22 h of exposure, a clear reduction of Mr/Ms can be seen at the edge of the Au electrode. As Δt increases, the reduction in Mr/Ms drops further, and the width of the modified area gradually increases. After Δt=118 h, FIG. 19A shows that Mr/Ms is reduced to ≈0 within the outermost 15 μm of the Au electrode, indicating a strong reduction of perpendicular magnetic anisotropy (PMA) in this area.

FIGS. 19B-19D show exemplary hysteresis loops measured outside of (FIG. 19A), at the edge of (FIG. 19B), and inside of (FIG. 19C) the Au electrode at Δt=25 h. FIGS. 19E-19G show exemplary hysteresis loops measured outside of (FIG. 19E), at the edge of (FIG. 19F), and inside of (FIG. 19G) the Au electrode at Δt=118 h. There appears to be little or no change in magnetic properties away from the electrodes, indicating that the 3 nm thick GdOx layer is sufficient to protect the Co film from oxidation in atmosphere in the absence of the Ta/Au electrode overlayer. PMA is lost at the electrode edge, as evidenced by the hysteresis loops in FIGS. 19C and 19F. A gradual reduction in Hc at the electrode center is also noted, which is considerable after 118 h in the hysteresis loop in FIG. 19G. Since the initial-state coercivity corresponds to the domain wall nucleation field threshold, the reduction in Hc near the electrode center is likely due not to a local reduction of PMA there, but rather a reduction in the nucleation field near the electrode edge so that Hc near the center reflects the domain wall propagation field, which is lower in these films than the nucleation field.

The reduction in PMA near the electrode edge can be indicative of overoxidation of the Co at the Co/GdOx interface, which occurs in FIG. 8A-8K after negative bias application. These results can be indicative that there is a spontaneous oxidation of the Co film localized near the electrode perimeter of this example device. This oxidation is reversible. A positive bias voltage can be applied to the gate electrode drives $O^{2-}$ away from the Co layer, fully restoring PMA to this region (see FIGS. 10E and 10G).

Similar films without Au electrodes could remain stable under ambient atmosphere exposure for at least two years. In this example, a porous Au layer on top of the GdOx leads to spontaneous oxidation over such a short timescale. The results here could indicate that the oxygen affinity of the Co film beneath the triple phase boundary region is sufficient to drive $O^{2-}$ diffusion through the thin GdOx layer, resulting in spontaneous Co oxidation under ambient conditions. Since this is not the case away from the electrodes, this suggests that the rate limiting step is not $O^{2-}$ diffusion, but rather ionic exchange at the electrolyte/gas phase interface, which is catalyzed by the presence of metallic Au that can act as a source of electrons.

In an example, the local magnetic anisotropy can be probed by polar MOKE. Out-of-plane hysteresis loops can be measured via the polar magneto-optical Kerr effect (MOKE) and the remanence to saturation magnetization ratio Mr/Ms is taken as a qualitative measure of perpendicular magnetic anisotropy (PMA) and its variations with film structure and voltage application. A novel MOKE-based technique is used to measure the anisotropy field Hk that provides direct, quantitative and local access to perpendicular magnetic anisotropy. In contrast to the vibrating sample magnetometry (VSM) measurements shown in FIG. 16, this MOKE-based technique has the advantage of spatial resolution, allowing local probing of Hk and therefore PMA with micrometer resolution, e.g., in the vicinity of localized electrodes. The novel MOKE-based technique is applied to measure the nonmonotonic anisotropy transition described herein and in connection with FIGS. 9A-9H.

Figure 20:
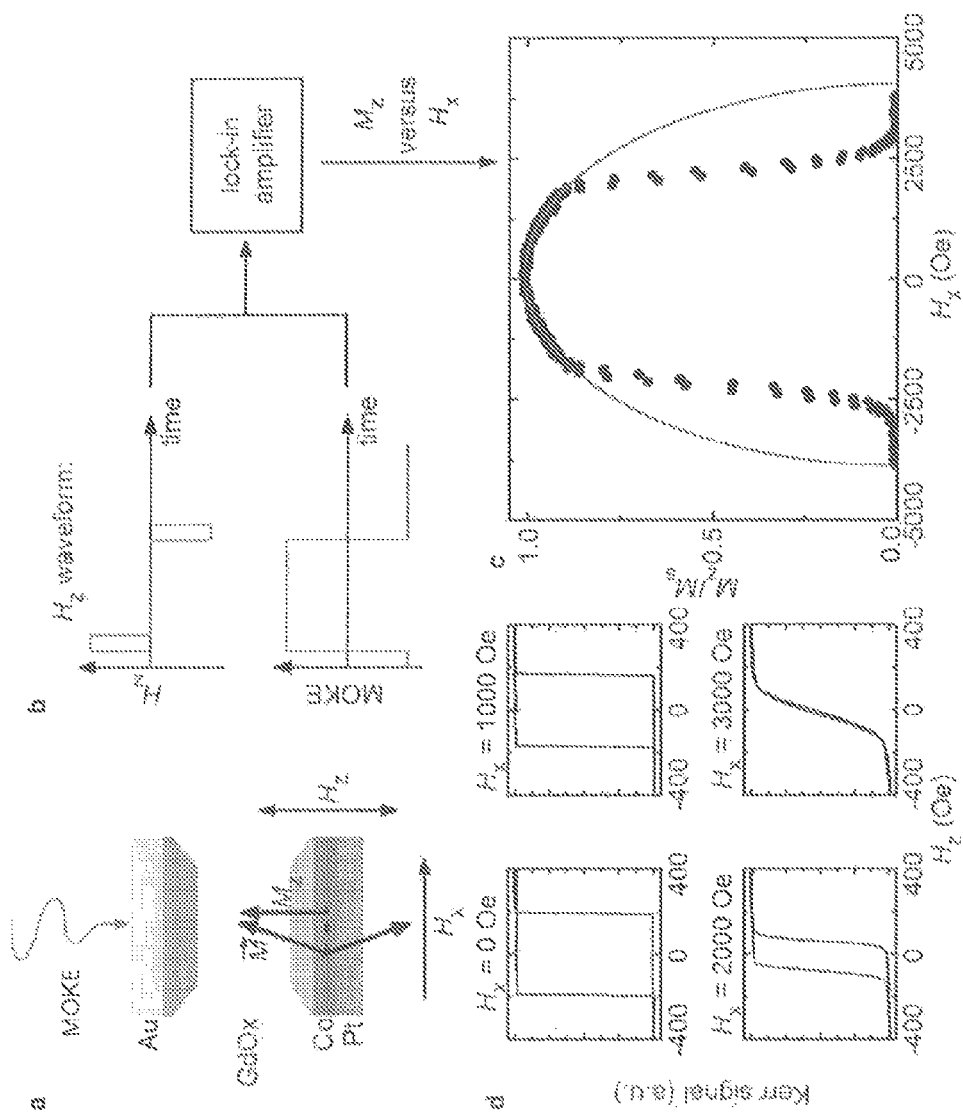
FIGS. 20A-20D show an example schematic of the novel MOKE-based measurement setup and example measurement results, according to principles of the present disclosure.

An example schematic of the novel MOKE-based measurement setup and example measurement results are shown in FIGS. 20A-20D. FIG. 20A shows an example measurement schematic showing an example device based on a Pt/Co/GdOx film with perpendicular magnetic anisotropy, focused laser to acquire polar MOKE signal, in-plane magnetic field Hx to tilt the magnetization vector $\vec{M}$ away from the easy axis and out-of-plane field Hz to switch the perpendicular magnetization component Mz. FIG. 20B shows a Hz waveform used to switch Mz and the corresponding polar MOKE signal. A lock-in amplifier is used to extract the MOKE signal corresponding to Mz. FIG. 20C shows representative data set measured for an example device based on Ta(4 nm)/Pt(3 nm)/Co(0.9 nm)/Gd(0.9 nm)/GdOx(3 nm) films, showing the out-of-plane magnetization Mz plotted as a function of the in-plane field Hx. The solid red line is a fit with the Stoner-Wohlfarth model. FIG. 20D shows polar MOKE hysteresis loops measured on the same sample at increasing in-plane field Hx.

The example measurement setup is configured for samples with PMA, i.e. uniaxial magnetic anisotropy with an easy axis perpendicular to the film plane. A focused laser with a ~3 μm diameter probe spot is positioned on the area of interest and used to locally probe Mz, i.e. the out-of-plane magnetization component, via polar MOKE. The high-sensitivity of the polar MOKE signal is exploited to measure Mz versus a hard-axis field Hx, to determine the anisotropy field Hk.

To enhance the signal to noise ratio, a periodic waveform of positive and negative perpendicular field pulses Hz is applied with a small air coil (FIG. 20B). The polar MOKE signal is measured using a lock-in amplifier phase-locked to the Hz drive waveform. This signal is measured continuously while an in-plane field Hx is slowly swept. As long as Hx is below a sample-dependent threshold, magnetic hysteresis loops have unity Mr/Ms, (FIG. 20D), so that the Hz waveform periodically switches the canted magnetization vector between states with positive Mz and negative Mz. The resulting polar MOKE signal waveform, shown schematically in FIG. 20B, therefore takes the form of a square wave with an amplitude proportional to the following expression:

$$M_z = M_s \cos(\arc \sin(H_x/H_k))$$ (Eq. S1)

This expression corresponds to the easy-axis magnetization component in the presence of a hard-axis field Hx, obtained using the Stoner Wohlfarth single-domain model that considers the Zeeman energy and uniaxial anisotropy energy. Eq. S1 can be used to fit the measurement data (normalized lock-in signal versus Hx) to extract the anisotropy field Hk.

A representative dataset for an example device based on a Ta(4 nm)/Pt(3 nm)/Co(0.9 nm)/Gd(0.9 nm)/GdOx(3 nm) film is shown in FIG. 20C. For measurements up to Hx=2000 Oe, the measurement data are well fit by the Stoner Wohlfarth model, beyond which the polar hysteresis loops under Hx are no longer square. Above Hx=2000 Oe the measurement data drop much faster than expected from the Stoner Wohlfarth model. This deviation is attributed to the formation of a multi domain state in the Co film above |Hx|=2000 Oe, such that the Stoner Wohlfarth model may no longer apply. The formation of a multi-domain state is evident in FIG. 20D, which shows out-of-plane demagnetization at zero Hz above Hx=2000 Oe.

The fit within the region |Hx|<2000 Oe in FIG. 20c allows determination of Hk with high fidelity. The fit shown here yields Hk=4000 Oe which agrees well with Hk=3500 Oe extracted from hard axis hysteresis loops measured by VSM, for the same sample.

The non-monotonic anisotropy transition and polarity dependence of voltage response observed for an example device is described. As described herein, and in connection with FIG. 9A-9H, the magnetic anisotropy is correlated with the position of the oxidation front in an example device based on Co/Gd/GdOx films. Example devices based on Ta(4 nm)/Pt(3 nm)/Co(0.9 nm)/Gd(d)/GdOx(30 nm) films with differing thicknesses of Gd spacer (i.e., thicknesses d=0.0, 0.3, 0.7, 1.0 and 3.0 nm) are deposited to control the distance between Co and the Gd/GdOx interface. The measurement data provide hysteresis loops and values of remanence to saturation magnetization ratio Mr/Ms that are used to assess magnetic anisotropy. Both vibrating sample magnetometry (VSM) and the MOKE technique, described in FIG. 20A-20D, are used to directly access the anisotropy field Hk and its variation with applied voltage. The voltage response dependence on the initial position of the oxidation front in the Co/Gd/GdOx stack is investigated.

FIGS. 21A-21B show an example anisotropy transition in an example device based on Pt/Co/Gd/GdOx films. FIG. 21A shows an example plot of the anisotropy field Hk as a function of position of the oxidation front in the Pt/Co/Gd/GdOx stack. Where possible, Hk is extracted from both MOKE and VSM measurements. The solid and dashed blue lines are a guide to the eye and the black arrows highlight the response to positive and negative voltage Vg at different positions along the anisotropy transition, based on the measurements described in the text. FIG. 21B shows a schematic of the example device based on a Pt/Co/Gd/GdOx structure with Ta/Au electrodes. The dimension "d" in FIG. 21B refers to the thickness of the Gd spacer layer and more generally to the distance between the oxidation front and the Co layer. FIG. 21A shows Hk versus d for these samples, extracted from VSM hard-axis hysteresis loop measurements and from the novel MOKE technique. The data for both techniques show the same trend and are in good agreement with each other. The small differences between VSM and MOKE measurement are attributed to the local nature of the MOKE technique and the difference in probed area. For the example device with d=0.3 nm, no value of Hk is determined using MOKE since, for this example device, Mr/Ms<1 (see FIG. 9B) even at Hx=0.

Measurements from an example without a Gd spacer (i.e., d=0) yielded where Hk≈10 k Oe. For examples with a Gd spacer, Hk decreases rapidly with increasing Gd spacer thickness (i.e., d>0) and goes through a minimum where Hk≈1 k Oe, then increases again with further increase of d before it saturates above d≈1 nm at Hk~5 k Oe. This non-monotonic dependence of Hk on d agrees well with what is inferred from the trend of Mr/Ms in the hysteresis loops in FIG. 9A-9H.

As described in connection with FIGS. 7A-7G and 8A-8K), it is shown that if the Co layer itself is oxidized, perpendicular magnetic anisotropy (PMA) decreases rapidly and eventually disappears completely with increasing oxidation. Taking d to be more generally the distance between the Co layer and the metal/metal-oxide interface, this corresponds to d<0. This indicates schematically the dependence of magnetic anisotropy on the position of the oxidation front in an example device based on the layer structure Co/Gd/GdOx, as illustrated by dashed and solid blue lines in FIG. 21A.

Based on the full dependence of PMA on the position of the oxidation front in the example device based on the layer structure of Co/Gd/GdOx, the voltage response at different starting points for d is analyzed, which correspond to different points along the anisotropy transition in FIG. 21A. It is observed that a negative gate voltage Vg drives the oxidation front closer to the Co layer whereas positive Vg drives it further away, corresponding to decreasing and increasing d, respectively. According to the example systems, methods, and apparatus herein, the sign of the magnetoelectric response depends on the starting state. That is, it can be either positive or negative depending on the local slope of Hk versus d, and even change sign during voltage application if Vg is sufficient to drive the system through the maximum or minimum of Hk versus d in FIG. 21A.

Figure 22:
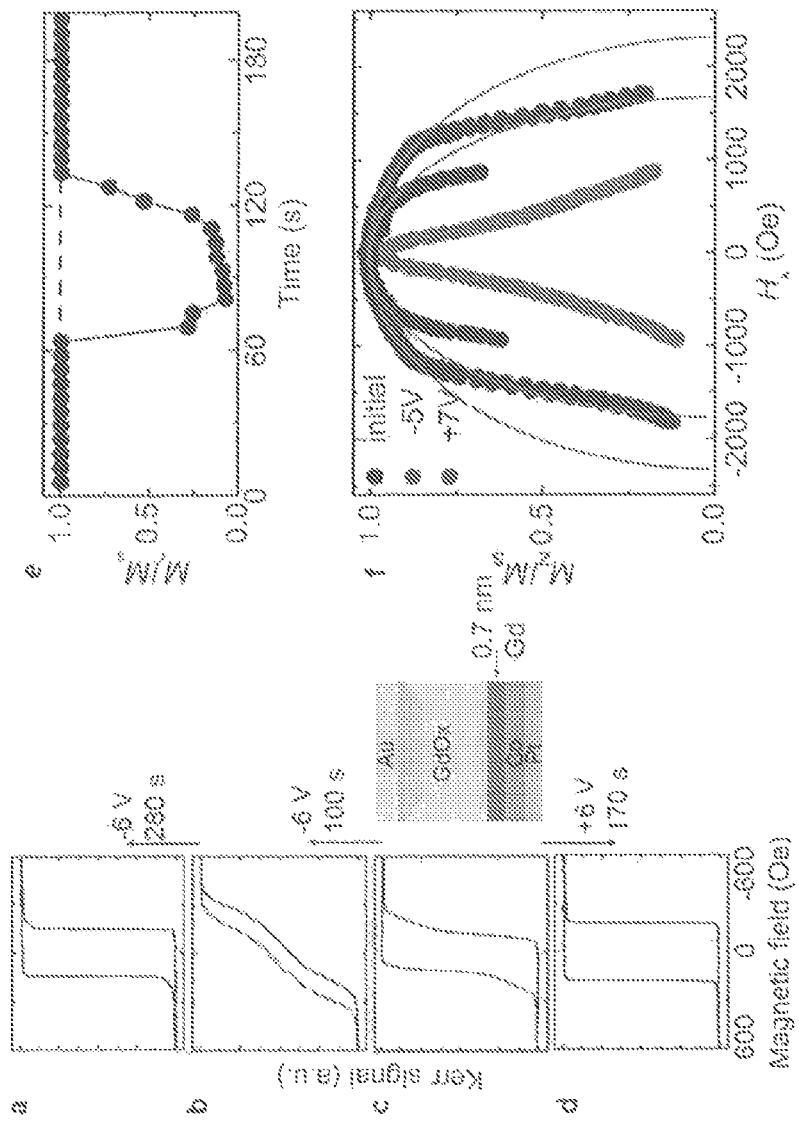
FIGS. 22A-22D shows example hysteresis loops, according to principles of the present disclosure.
FIG. 22E shows an example evolution of Mr/Ms, according to principles of the present disclosure.
FIG. 22F shows example MOKE anisotropy measurements performed at room temperature, according to principles of the present disclosure.

For the example device based on the layer structure of Ta(4 nm)/Pt(3 nm)/Co(0.9 nm)/Gd(0.7 nm)/GdOx(30 nm) sample, described in connection with FIG. 9A-9H, where the relevant hysteresis loops are reproduced in FIGS. 22A-22D (which demonstrate the non-monotonic voltage response of magnetic anisotropy). FIGS. 22A-22D show hysteresis loops measured at room temperature for an example device based on a layer structure of Ta(4 nm)/Pt(3 nm)/Co(0.9 nm)/Gd(0.7)/GdOx(30 nm) described in connection with FIGS. 8A-8K and shown schematically next to FIG. 22C. The initial state (FIG. 22C) has full remanence but is slightly sheared, indicating weakened PMA. Under positive bias (FIG. 22D) the loop becomes square after applying Vg=+6 V for 170 s at 100° C. The loop evolution under negative bias is shown in (FIG. 22B) and (FIG. 22A) corresponding to Vg=−6V at 100° C. for 100 s and 280 s, respectively. In this case, the loop shows first a reduction in Mr/Ms, and then recovery of strong PMA. The full evolution of Mr/Ms during application of Vg=−6 V at 100° C. is shown in panel (FIG. 22E). FIG. 22F shows MOKE anisotropy measurements performed at room temperature, in virgin state and after application of Vg=−5 V for 120 seconds and Vg=7 V for 240 seconds at 70° C. The anisotropy measurements confirm the voltage-induced anisotropy modifications inferred from the hysteresis loops in (FIG. 22B) and (FIG. 22D).

The PMA of the as-deposited sample (FIG. 22C) is near the minimum of Hk versus d in FIGS. 21A-21B. Evolution of the hysteresis loop characteristics is observed during positive and negative Vg application at T=100° C. It is observed that a positive gate voltage Vg=+6 V, which should draw $O^{2-}$ away from the Co layer and thus increase d, causes the out-of-plane loop squareness to increase (FIG. 22D), consistent with increased PMA strength. Under negative bias of Vg=−6 V, Mr/Ms initially drops (FIG. 22B), indicating a reduction in PMA, but with sustained voltage application, the hysteresis loop again becomes square, indicating a subsequent increase in PMA (FIG. 22A). FIG. 22E shows a time sequence of Mr/Ms for this sample under negative bias Vg=−6 V, where the non-monotonic evolution of Mr/Ms with time is clearly apparent.

FIG. 22F shows the results of local MOKE anisotropy measurements performed at room temperature, before and after a bias voltage is applied at T=70° C. Application of positive bias of about 7 V for 4 minutes results in an increase of Hk from 1700 Oe to 2300 Oe, whereas application of a negative bias of −5 V for 2 minutes clearly reduces Hk. These Hk measurements directly confirm the presumed variation in anisotropy energy inferred from the modification of Mr/Ms under positive and negative bias.

Together, these data demonstrate that voltage application follows the Hk versus d trend near the anisotropy minimum in FIGS. 21A-21B, indicated schematically by the black arrows shown on FIG. 21A in the vicinity of d=0.7 nm. Notably, the sign of the magnetoelectric coefficient changes with time in a way that can be computed based on the functional form of Hk versus d.

Figure 23:
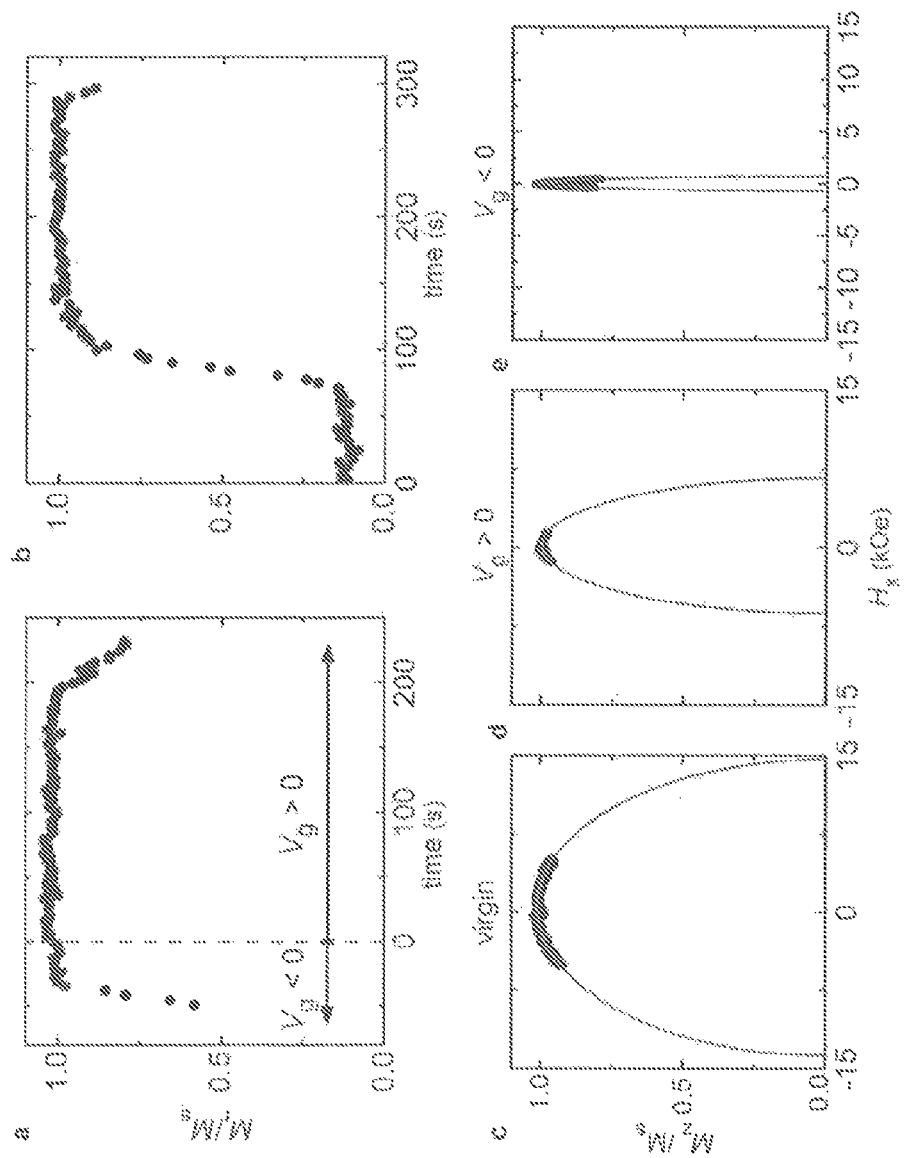
FIGS. 23A-23E show examples of the voltage response at the center and edge of the electrodes on an example device, according to principles of the present disclosure.

FIGS. 23A-23E show the voltage response at the center and edge of thin Au electrodes on an example device based on Ta(4 nm)/Pt(3 nm)/Co(0.9 nm)/GdOx(3 nm) films with thin Ta/(1.5 nm)/Au(5 nm) electrodes, described in connection with FIGS. 10A-10I and FIGS. 19A-19G. FIG. 23A shows the evolution of remanence to saturation magnetization ratio Mr/Ms under positive and negative gate voltage Vg. Here, Mr/Ms is probed at the center of the electrode. The red dashed line indicates the virgin state of the electrode center. FIG. 23B shows the evolution of Mr/Ms under positive Vg, where Mr/Ms is probed at the electrode edge. FIG. 23C shows the perpendicular magnetization component Mz is plotted as a function of in-plane field Hx in the virgin state (FIG. 23C), after positive Vg (d) and after negative Vg application (FIG. 23E) at the electrode center. The solid red lines are fits with the Stoner Wohlfarth model. All voltages are applied and all measurements are performed at room temperature.

FIGS. 23A-23E show that the voltage response is non-monotonic also in the low-d regime in the vicinity of the anisotropy maximum in FIG. 21A. On these example devices, near the electrode perimeter the Co is partially oxidized in the virgin state (after exposure to ambient atmosphere), while near the center of the electrode the magnetic properties indicate minimal oxidation of Co in the virgin state. Therefore, it is possible to examine initial states corresponding to d≈0 and d<0 (i.e., partially oxidized Co) using the same device, simply by probing the voltage response either at the electrode center or the electrode edge, respectively. The electrode center initially exhibits PMA with square out-of-plane hysteresis loops, similar to the ones shown in FIG. 19G. FIG. 23C shows results of a local anisotropy measurement at the electrode center using the novel MOKE technique described herein. The fit to these data using Eq. S1 yields Hk=14 k Oe. In the virgin state, the electrode center region is therefore near the peak in Hk versus d in FIG. 21A, where d≈0. Thus both positive and negative Vg should cause a reduction of PMA and Hk if applied for a sufficiently long time that the system is driven to one side or the other of the anisotropy maximum. FIG. 23A shows the evolution of Mr/Ms under positive and negative bias, where Vg is applied and hysteresis loops are measured continuously at room temperature. The positive and negative bias measurements are performed on separate devices so as to start from the virgin state for both bias polarities. Likewise, when Vg is ramped from 0 V to −2 V within ~1 minute, Mr/Ms also declined abruptly, indicating a reduction in PMA consistent with FIG. 8A-8K under negative bias. For the positive bias case, Vg is ramped from 0 V to +2.5 V in ~4 minutes, during which Mr/Ms is relatively constant until after ~200 s it dropped precipitously, indicating a significant reduction of PMA. Therefore, under either bias polarity, Mr/Ms is eventually reduced, indicating a reduction in PMA.

The variation of PMA inferred from variations in Mr/Ms in FIG. 23A-23E are directly confirmed using local MOKE anisotropy measurements, shown in FIGS. 23D and 23E. In these measurements, starting from the virgin state, bias voltage is applied and then removed prior to the drop in Mr/Ms so that the novel MOKE technique could be applied. In this case, even though the loops remain square, Hk has been significantly reduced under gate voltage application of either polarity, dropping to Hk=6500 Oe in the positive bias case (FIG. 23D) and to Hk=700 Oe in the negative bias case (FIG. 23E). Therefore, under both bias polarities, which should either drive $O^{2-}$ into the Co layer or drive the oxide boundary away from the Co layer, the PMA eventually declines. This behavior is indicated schematically in FIG. 21A by the black arrow near d=0.

In FIG. 23B, measurements are performed similarly to those in FIG. 23A, but examining the room temperature response of Mr/Ms near the electrode edge. Here, the initial state corresponds to an oxidized Co layer with d<0, as described herein. The hysteresis loop in the initial state is similar to that in FIG. 19F. A ramp up in Vg from 0 V to 3 V, which should draw $O^{2-}$ away from the Co layer, and increase d, gives rise to an increase in loop squareness and Mr/Ms, indicating an increase in PMA. This behavior is indicated schematically by the black arrow on FIG. 21A. With increasing dwell time, Mr/Ms then begins to drop to below 1, consistent with crossing the maximum of Hk in the anisotropy transition at d=0.

The voltage-response of the three samples is shown schematically in FIG. 21A, with black arrows showing the trends of the perpendicular anisotropy energy under positive and negative bias, depending on the starting position of d. It can be seen that, depending on the position of the oxidation front, both positive and negative Vg can result in an increase or decrease of PMA, i.e., the magnitude and sign of the magnetoelectric coefficient depends on the local slope of Hk versus d. For all of these samples, the voltage response of the anisotropy can be described in terms of the Hk versus d characteristic determined from as-deposited samples, indicating that the gate voltage indeed changes d dynamically by moving the position of the oxidation front. In this magneto-ionic system, the polarity of the magnetoelectric coefficient is therefore not coupled to the polarity of the gate voltage but solely determined by the position of the oxidation front with respect to the Co layer.

The laser-definition of domain wall nucleation sites is described. FIGS. 24A-24D show polar magneto-optical Kerr effect maps, showing domain expansion inside electrode area with increasing time t after applications of a reversed magnetic field step of 90 Oe. The dashed black line in (FIG. 24A) outlines the area exposed for 100 s to the 10 mW laser spot at a gate voltage −3 V. All maps are acquired at room temperature and under zero bias. The example of laser-assisted magnetic anisotropy patterning is performed on an example device based on layers of Ta(4 nm)/Pt(3 nm)/Co (0.9 nm)/GdOx(3 nm) films with 200 μm wide GdOx(30 nm)/Ta(2 nm)/Au(12 nm) gate electrodes. A gate voltage $V_g$=−3 V is applied to create a potential well at the perimeter of a gate electrode which isolates the electrode area from DW motion in the rest of the Co film. In order to create a DW nucleation site inside the electrode area, magnetic anisotropy in the center of the electrode is reduced by exposing it for 100 s to a 3 μm diameter laser spot with an incident power P=10 mW while a bias of $V_g$=−3 V is applied at room temperature (see FIG. 9B).

Following the laser-definition of the DW nucleation site, FIGS. 24A-24D show space- and time-resolved images of domain expansion in the electrode area at increasing times after a reversed magnetic field-step is applied. At each pixel, the magnetization is first saturated, and then a reverse field of 90 Oe is applied while acquiring a time-resolved MOKE signal transient. Five reversal cycles are averaged at each position, from which the average trajectory of the expanding domain is reconstructed. As can be seen in FIGS. 24A-22D, magnetic DWs indeed nucleate at the laser-defined position (FIG. 24A) and then expand radially across the Co film under the reversed magnetic driving field (see FIGS. 24B-22D).

Figure 25:
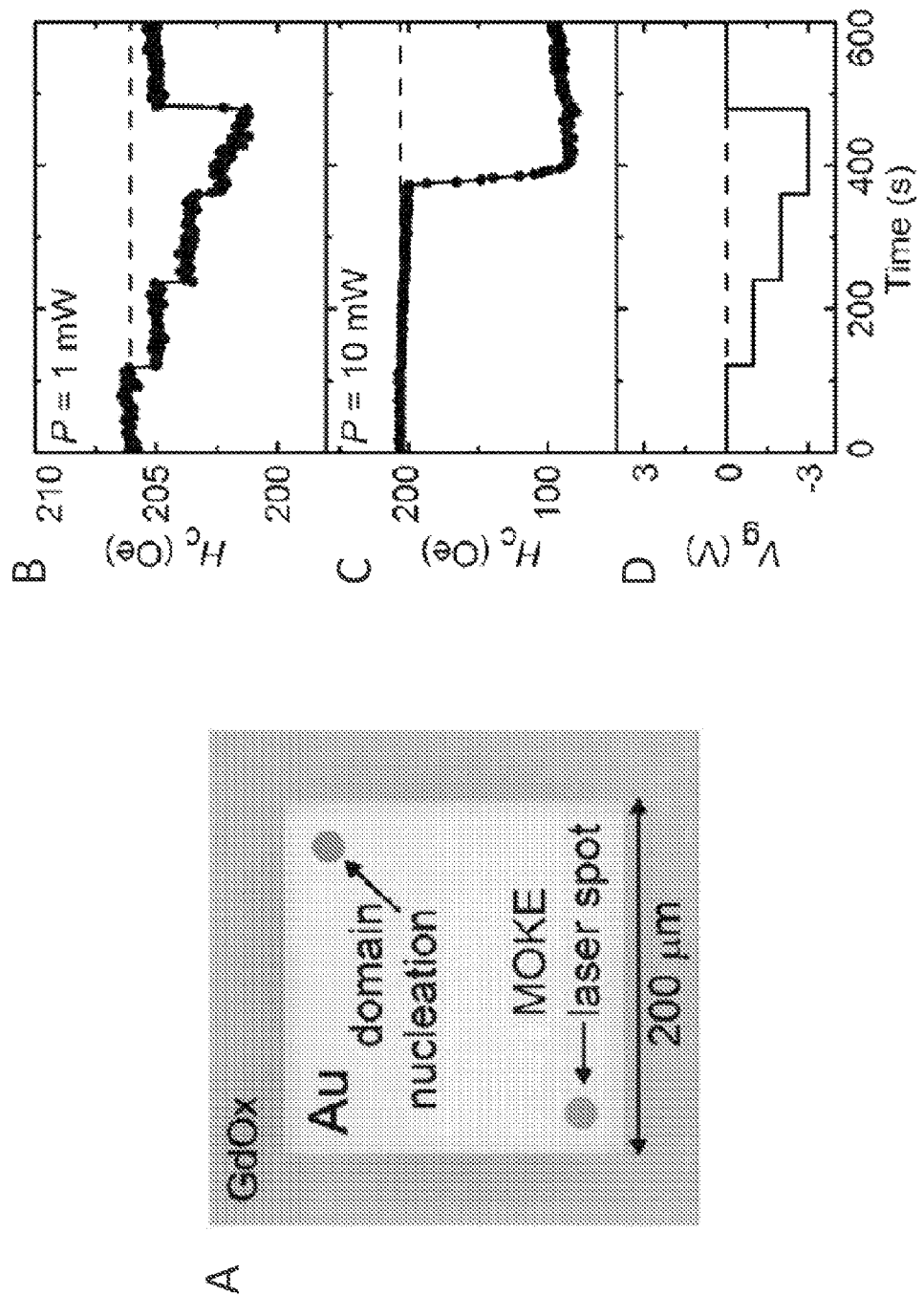
FIGS. 25A-25D show an example measurement setup and example measurement results of combined gate voltage and laser illumination, according to principles of the present disclosure

FIGS. 25A-25D demonstrate the effects of combined gate voltage and laser illumination on generating the desired metastable states. FIG. 25A shows an example schematic of an Au electrode on top of an example device based on Pt/Co/GdOx films, showing the position of the MOKE laser probe spot and the laser-generated domain nucleation site inside the electrode area. FIGS. 25B-25D shows examples of the voltage dependence of coercivity $H_c$ as a function of $V_g$ (FIG. 25D) at an incident laser power P of 1 mW (FIG. 25B) and 10 mW (FIG. 25C). To elucidate the individual roles of $V_g$ and P, a laser-induced DW nucleation site is created in one corner of an electrode. The laser spot is then in the diagonally opposite corner (see FIG. 25A). $H_c$ is then determined by the field necessary to propagate DWs from one corner of the electrode to the other. FIGS. 25B-25D show $H_c$ as a function of $V_g$ at P=1 mW and P=10 mW. At P=1 mW (FIG. 25B), $H_c$ follows the applied voltage with modifications of ~1 Oe/V and returns close to its initial value at zero bias. This volatile and weak voltage response is consistent with the influence of electric-field-induced charge accumulation on the DW propagation field, and shows that the small ΔT at P=1 mW is not sufficient to facilitate voltage-driven $O^{2-}$ migration and the associated nonvolatile PMA changes.

The behavior at P=10 mW is very similar up to $V_g$=−2 V (FIG. 19C). At −3 V, $H_c$ suddenly drops from ~200 Oe to ~80 Oe. This indicates that instead of propagating across the electrode, domains now nucleate directly underneath the laser spot due to a strong PMA reduction there. Therefore, at room temperature, neither $V_g$ nor laser illumination alone change PMA in a nonvolatile way. However, when applied together, there exists a threshold above which their combined effect is sufficient to produce non-volatile anisotropy changes.

Other non-limiting example applications of systems, devices, methods, and apparatus described herein include in security, military, and industrial applications. The example systems, devices, methods, and apparatus described herein can be implemented in spectroscopic applications as well.

In another non-limiting example, systems, devices, methods, and apparatus described herein can be made low-cost and/or disposable.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

"Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus for tuning a functional property of a device, the apparatus comprising:
  a device comprising:
    a dielectric material layer disposed in an x-y plane, the dielectric material layer comprising at least one ionic species having a high ion mobility, the dielectric material being configured such that exposure to electromagnetic radiation and/or temperature changes cause changes in the mobility of the at least one ionic species; and
    a target layer disposed over and forming an interface with the dielectric material layer, the target layer comprising a metal material configured to reversibly uptake an amount of the at least one ionic species; and
  at least one regulating element coupled to a spatial region of the device, the at least one regulating element comprising:
    a voltage applying element to apply a potential difference in a direction across the interface; and
    at least one of:
      a temperature regulating element to regulate a temperature of the spatial region of the device; and
      a source of electromagnetic radiation to irradiate at least a portion of the spatial region of the device;
    wherein the at least one regulating element is configured to irradiate and/or regulate the temperature of the spatial region of the device, and to regulate the applied potential difference for a duration of time sufficient to modify a proportionate amount of the at least one ionic species in a portion of the target layer proximate to the interface, thereby causing a change of the functional property of the device; and
    wherein the device is configured to retain the change of the functional property after discontinuance of applying the potential difference, the irradiating, and/or the temperature regulation, of the first portion of the device.

2. The apparatus of claim 1, wherein the target layer comprises a ferromagnetic material layer, and wherein the modification of the proportionate amount of the at least one ionic species in the portion of the target layer causes a change in magnetic anisotropy of the device proximate to the spatial region.

3. The apparatus of claim 1, wherein the at least one ionic species comprises at least one of an anion of oxygen, an anion of hydrogen, an oxide, an oxynitride, or a silicate.

4. The apparatus of claim 1, wherein the dielectric material layer comprises an oxide of at least one of gadolinium, hafnium, terbium, zirconium, yttrium, tantalum, titanium, aluminum, silicon, germanium, gallium, indium, tin, antimony, tellurium, barium, bismuth, titanium, vanadium, chromium, manganese, cobalt, nickel, copper, zinc, niobium, molybdenum, palladium, cadmium, strontium, tantalum, niobium, cerium, praesydium, or tungsten, or any combination thereof.

5. The apparatus of claim 1, wherein the target layer comprises at least one electrically conductive nanostrip.

6. The apparatus of claim 1, wherein the target layer comprises aluminum, a transition metal, a rare earth metal, or an alloy comprising at least one of a transition metal and a rare earth metal.

7. The apparatus of claim 1, wherein the target layer comprises a ferromagnetic material.

8. The apparatus of claim 7, wherein the ferromagnetic material is selected from a group consisting of iron, nickel, cobalt, samarium, dysprosium, yttrium, chromium, or an alloy of at least one of iron, nickel, cobalt, and samarium alloyed with at least one of boron, carbon, copper, hafnium, palladium, platinum, rhenium, rhodium, and ruthenium.

9. The apparatus of claim 7, wherein the modification of the proportionate amount of the at least one ionic species in the portion of the target layer causes a change in magnetic anisotropy of the device proximate to the spatial region.

10. The apparatus of claim 9, wherein the change of proportionate amount of the at least one ionic species in a portion of the target layer causes a change between two or more selected from a group consisting of a perpendicular magnetic anisotropy, an in-plane magnetic anisotropy, and approximately zero magnetic anisotropy.

11. An apparatus comprising:
  an active element comprising:
    a ferromagnetic material layer disposed in an x-y plane, the ferromagnetic material being a metal material configured to reversibly uptake an amount of an ionic species;
    a gate oxide dielectric layer disposed over and forming an interface with the ferromagnetic material layer, wherein the gate oxide dielectric layer comprises the ionic species, wherein the ionic species have a high ion mobility, and wherein the dielectric material of the gate oxide dielectric layer is configured such that exposure to electromagnetic radiation and/or temperature changes cause changes in the mobility of the ionic species; and
    a gate electrode layer disposed over, and in electrical communication with, the gate oxide dielectric material layer; and at least one regulating element coupled to a spatial region of the active element, the at least one regulating element comprising:
- a voltage applying element to apply a potential difference in a direction across the ferromagnetic material layer and the gate electrode layer of the device; and
- at least one of:
  - a temperature regulating element to regulate a temperature of the spatial region of the active element; and
  - a source of electromagnetic radiation to irradiate at least a portion of the spatial region of the active element;
- wherein the regulating element is configured to irradiate and/or regulate the temperature of the spatial region of the active element, and to regulate the applied potential difference for a duration of time sufficient to modify a proportionate amount of the ionic species in a portion of the ferromagnetic material layer proximate to the interface, thereby causing a change of a functional property of the device; and
- wherein the device retains the change of the functional property after discontinuance of the irradiating, and/or the temperature regulation, of the active element.

12. The apparatus of claim 11, wherein the gate oxide dielectric layer has a lateral dimension in the x-y plane that approximates the lateral dimension of the gate electrode layer in the x-y plane.

13. The apparatus of claim 12, further comprising a second oxide dielectric material layer disposed between the ferromagnetic material layer and the gate oxide dielectric layer, wherein the second oxide dielectric material layer has a lateral dimension in the x-y plane that is greater than the lateral dimension of the gate oxide layer, and wherein the gate oxide dielectric layer has a greater thickness in a z-direction than the second oxide dielectric material layer.

14. The apparatus of claim 13, wherein the second oxide dielectric material layer and the gate oxide dielectric layer are formed from different dielectric materials.

15. An apparatus comprising:
- a ferromagnetic material layer;
- a gate dielectric layer forming an interface with the ferromagnetic material layer, the gate dielectric layer comprising at least one ionic species; and
- a gate electrode layer disposed in electrical communication with the gate dielectric layer;
- wherein the at least one ionic species is selected from a group consisting of an oxygen ion, a hydrogen ion, a nitride ion, and a silicon ion.

16. The device of claim 15, wherein the gate dielectric layer is disposed in contact with the ferromagnetic layer along a first direction, and wherein the gate dielectric layer is wider than the gate electrode layer with respect to a direction perpendicular to the first direction.

17. The apparatus of claim 15, further comprising a resistive element thermally coupled to the gate dielectric layer.

18. The apparatus of claim 15, wherein the at least one ionic species is mobile when an electric field is applied in the gate dielectric layer.

19. The apparatus of claim 15, wherein the ferromagnetic material has a thickness that is less than 100 nm.

* * * * *